(12) United States Patent
Konishi et al.

(10) Patent No.: US 9,443,694 B2
(45) Date of Patent: Sep. 13, 2016

(54) CHARGED PARTICLE BEAM APPARATUS, SPECIMEN OBSERVATION SYSTEM AND OPERATION PROGRAM

(71) Applicant: HITACHI HIGH-TECHNOLOGIES CORPORATION, Tokyo (JP)

(72) Inventors: Yayoi Konishi, Tokyo (JP); Mitsugu Sato, Tokyo (JP); Masaki Takano, Tokyo (JP); Shotaro Tamayama, Tokyo (JP); Masako Nishimura, Tokyo (JP); Shunya Watanabe, Tokyo (JP); Mami Konomi, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/385,256

(22) PCT Filed: Mar. 15, 2013

(86) PCT No.: PCT/JP2013/057543
§ 371 (c)(1),
(2) Date: Sep. 15, 2014

(87) PCT Pub. No.: WO2013/137466
PCT Pub. Date: Sep. 19, 2013

(65) Prior Publication Data
US 2015/0076348 A1 Mar. 19, 2015

(30) Foreign Application Priority Data
Mar. 16, 2012 (JP) .................................. 2012-060530

(51) Int. Cl.
*H01J 37/28* (2006.01)
*H01J 37/26* (2006.01)
*H01J 37/22* (2006.01)

(52) U.S. Cl.
CPC ............ *H01J 37/222* (2013.01); *H01J 37/265* (2013.01); *H01J 37/28* (2013.01); *H01J 2237/2806* (2013.01)

(58) Field of Classification Search
CPC ...... H01J 37/28; H01J 37/222; H01J 37/265; H01J 2237/2806
See application file for complete search history.

(56) References Cited

U.S. PATENT DOCUMENTS 6,570,156 B1 * 5/2003 Tsuneta et al. ............... 250/311
2002/0054703 A1 * 5/2002 Hiroi et al. .................... 382/149

(Continued)

FOREIGN PATENT DOCUMENTS

JP 2003-303566 A 10/2003
JP 2003-303567 A 10/2003

(Continued)

*Primary Examiner* — Robert Kim
*Assistant Examiner* — Sean Luck
(74) *Attorney, Agent, or Firm* — Mattingly & Malur, PC

(57) ABSTRACT

For a novice user to easily recognize a difference between imaging results caused by a difference between observation conditions, a computer has an operation screen display observation target setting buttons for changing an observation condition for a specimen including a combination of parameter setting values of a charged particle beam apparatus. The processing unit has the operation screen display a radar chart including a characteristic, indicated by three or more incompatible items, of an observation condition for each of the observation target setting buttons. The radar chart indicates at least items of high resolution, emphasis on surface structure and emphasis on material difference.

25 Claims, 37 Drawing Sheets

(56) References Cited

U.S. PATENT DOCUMENTS

| | | | |
|---|---|---|---|
| 2002/0179851 A1* | 12/2002 | Sato et al. | 250/491.1 |
| 2002/0196238 A1* | 12/2002 | Tsukada et al. | 345/173 |
| 2003/0193025 A1 | 10/2003 | Takagi | |
| 2003/0193026 A1 | 10/2003 | Takagi | |
| 2004/0227079 A1* | 11/2004 | Nara et al. | 250/310 |
| 2005/0263702 A1* | 12/2005 | Agemura et al. | 250/310 |
| 2012/0091339 A1* | 4/2012 | Ominami et al. | 250/307 |
| 2012/0287258 A1* | 11/2012 | Tsuneta et al. | 348/80 |

FOREIGN PATENT DOCUMENTS

| | | |
|---|---|---|
| JP | 2004-220987 A | 8/2004 |
| JP | 4014916 B2 | 9/2007 |
| JP | 4014917 B2 | 9/2007 |

* cited by examiner

| No. | ACCELERATING VOLTAGE [kV] | DETECTION SIGNAL | SCAN METHOD | SMALL UNEVENNESS VISIBILITY | LARGE UNEVENNESS VISIBILITY | COMPOSITION INFORMATION VISIBILITY | CRYSTAL INFORMATION VISIBILITY | RESOLUTION | DIFFICULTY IN CHARGING (DURING OBSERVATION OF NON-CONDUCTOR) | REMARKS |
|---|---|---|---|---|---|---|---|---|---|---|
| 1 | 1 | SE | Slow | ◎ | ◎ | × | × | △ | △ | IN CASE OF SEMI-IN-LENS/SNORKEL LENS |
| 2 | 1 | SE | INTEGRATION | ◎ | ◎ | × | × | △ | ○ | IN CASE OF SEMI-IN-LENS/SNORKEL LENS |
| 3 | 1 | BSE | Slow | △ | ○ | △ | △ | △ | ◎ | IN CASE OF SEMI-IN-LENS/SNORKEL LENS |
| 4 | 2 | SE | Slow | ◎ | ◎ | × | × | △ | △ | |
| 5 | 2 | SE | INTEGRATION | ◎ | ◎ | × | × | △ | ○ | |
| 6 | 2 | BSE | Slow | △ | ○ | ○ | ○ | △ | ◎ | IN CASE OF SEMI-IN-LENS/SNORKEL LENS |
| 7 | 5 | SE | Slow | ○ | ◎ | △ | △ | ○ | × | |
| 8 | 5 | SE | INTEGRATION | ○ | ◎ | △ | △ | ○ | △ | |
| 9 | 5 | BSE | Slow | △ | ○ | ○ | ◎ | ○ | ○ | |
| 10 | 15 | SE | Slow | △ | ◎ | △ | △ | ◎ | × | |
| 11 | 15 | BSE | Slow | × | ○ | ◎ | ○ | ◎ | ○ | |

CHARGED PARTICLE BEAM APPARATUS, SPECIMEN OBSERVATION SYSTEM AND OPERATION PROGRAM

TECHNICAL FIELD

The present invention relates to techniques of a charged particle beam apparatus, a specimen observation system and an operation program.

BACKGROUND ART

Setting of a combination of parameter setting values (hereinafter referred to as an observation condition) which are setting values of parameters in operation of a scanning electron microscope (hereinafter referred to as the electron microscope) largely relies on experience. For this reason, when a novice user operating the electron microscope, the user has difficulty in knowing what kind of influence the electron microscope observation condition has on a captured image. As a result, there is a problem that the novice user has a hard time improving his/her skills.

To counter such a problem, in techniques described in Patent Documents 1 and 2, capturings are performed under two or more combinations of simple observation conditions prior to main capturing. Then, two or more simple observation images thus obtained are displayed in a list form on a display unit (e preview). Subsequently, a user selects a desired simple observation image from the displayed simple observation images. Then, a computer sets the observation condition for the selected simple observation image. Thereafter, the user makes necessary manual adjustment on the selected simple observation image, and then capturing is performed. An image obtained as a result of the capturing is displayed on the display unit.

PRIOR ART DOCUMENT

Patent Document

Patent Document 1: Japanese Patent No. 4014916
Patent Document 2: Japanese Patent No. 4014917

SUMMARY OF THE INVENTION

Problem to be Solved by the Invention

However, the techniques described in Patent Documents 1 and 2 have the following problems.
(1) The novice user cannot recognize which image among the two or more simple observation images is good.
(2) Since the simple observation images are raw captured images, it is difficult for the novice user to see how the two or more simple observation images are different from each other.
(3) It takes time to obtain the two or more simple observation images. In other words, efficiency to obtain a target image is poor.

The present invention was made in consideration of the background described above. It is an object of the present invention to enable even a novice user to easily recognize a difference between imaging results caused by a difference between observation conditions.

Means for Solving the Problem

In order to solve the above problem, the present invention includes a processing unit configured to have an image display unit in an image display device display observation target setting buttons for changing an observation condition for a specimen, the observation condition comprising a combination of parameter setting values of the charged particle beam apparatus. The processing unit has the image display unit display an observation condition characteristic indicator including characteristics, indicated by three or more incompatible items, of an observation condition for each of the observation target setting buttons. Alternatively, the processing unit has the image display unit display an observation condition characteristic indicator including at least items of high resolution, emphasis on surface structure and emphasis on material difference which are indicated as a characteristic of an observation condition for each of the observation target setting buttons.

Alternatively, the present invention includes a processing unit configured to have an image display unit in an image display device display observation target setting buttons for changing an observation condition for a specimen, the observation condition including a combination of parameter setting values of the charged particle beam apparatus. The processing unit has a highlighted image displayed on or near each of the observation target setting buttons, the highlighted image being highlighted on an image change due to a change of the observation condition.

The other means for solving the problems are described later.

Effects of the Invention

The present invention makes it possible to easily recognize a difference between imaging results caused by a difference between observation conditions.

BRIEF DESCRIPTION OF THE DRAWINGS

FIG. 15 is a diagram (Part 1) showing an example of the operation screen during image confirmation and adjustment and changing of observation conditions by the user.

FIG. 18 is a diagram showing an observation condition setting table according to the embodiment.

FIG. 32 is a diagram (Part 9) showing an example of the operation screen during image reconfirmation and readjustment and re-changing of observation conditions by the user.

FIG. 37 shows a modified example of an application assist screen according to the embodiment.

MODES FOR CARRYING OUT THE INVENTION

Figure 1:
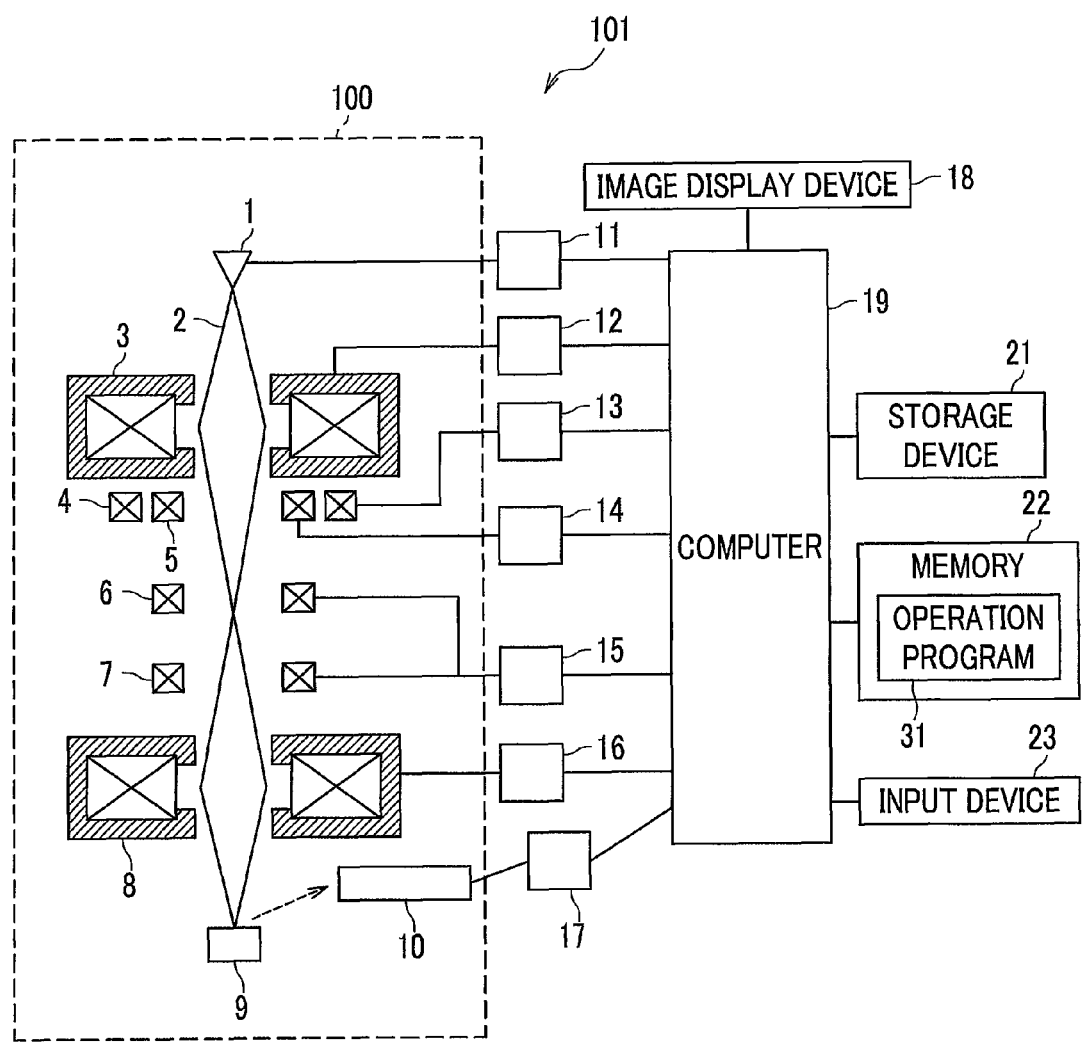
FIG. 1 is a schematic configuration diagram showing an example of an electron microscope according to the present invention.

Next, a mode for carrying out the present invention (hereinafter referred to as the "embodiment") is described in detail with reference to the appropriate drawings. Note that, in the drawings, the same constituent components are denoted by the same reference numerals, and description thereof is omitted.

Note that the embodiment discloses a charged particle beam apparatus including a processing unit configured to display, on an image display unit in an image display device, observation target setting buttons for changing an observation condition for a specimen which includes a combination of parameter setting values of the charged particle beam apparatus. The processing unit is configured for displaying a highlighted image, in which an image change due to a change of the observation condition is highlighted, on or near each of the observation target setting buttons.

The embodiment also discloses that respective one of the observation target setting buttons and corresponding one of observation conditions are associated with each other and stored in a storage unit, and that, when one of the observation target setting buttons is selected with an input unit, the processing unit sets parameter setting values of the charged particle beam apparatus under an observation condition for the selected one of the observation target setting buttons.

Also, the embodiment discloses the following. Specifically, the processing unit acquires an image of a specimen under a preset observation condition, and has the observation target setting buttons displayed on the image display unit based on image quality of the acquired image and a current observation condition. Then, when the observation condition are changed with the input unit, the processing unit repeats processing of reacquiring an image under a changed observation condition, and displaying the observation target setting buttons on the image display unit based on image quality of the reacquired image and the current observation condition until an instruction to terminate the processing is inputted with the input unit.

Moreover, the embodiment discloses that the processing unit is configured to display information about confirmation of presence or absence of coating on the specimen or about pretreatment of the specimen, prior to acquisition of a first image of the specimen.

Furthermore, the embodiment discloses that during processing standby time, the processing unit is configured to display a learning screen representing at least one of a structure of an electron microscope structure, an operation procedure of the electron microscope and explanation of an operation item on the operation screen.

The embodiment discloses that the processing unit is configured to display, on the image display unit, an operation screen displaying operation items of the charged particle beam apparatus, and to hide or deactivate a predetermined operation item displayed on the operation screen. The embodiment also discloses that the predetermined operation item includes at least one of focus adjustment, X focus adjustment and Y focus adjustment.

Moreover, the embodiment discloses that the processing unit limits functions of the charged particle beam apparatus according to the observation condition. Furthermore, the embodiment discloses that the processing unit limits the functions of the charged particle beam apparatus according to the observation condition by having image shift operable and stage movement inoperable when a magnification is not less than a predetermined value and by the stage movement operable and the image shift inoperable when the magnification is less than the predetermined value.

Also, the embodiment discloses that the processing unit is configured to hide a predetermined observation target setting button based on an operation history.

Moreover, the embodiment discloses that the processing unit is configured to display, on the image display unit, an operation screen representing an operation item of the charged particle beam apparatus and display information indicating a current operation step on the operation screen; and the information indicating the current operation step includes a main item indicating a main operation step and a sub-item indicating a sub operation step.

Furthermore, the embodiment discloses that the processing unit is configured to display, on the image display unit, an operation screen representing an operation item of the charged particle beam apparatus, display the acquired image on the operation screen, and display, near the image displayed on the image display unit, at least one of a magnification adjustment slider, a focus adjustment slider, a focus X adjustment slider and a focus Y adjustment slider.

The embodiment discloses a charged particle beam apparatus including a processing unit configured to display, on an image display unit in an image display device, observation target setting buttons for changing an observation condition for a specimen, which includes a combination of parameter setting values of the charged particle beam apparatus. The processing unit is configured to display, on the image display unit, observation condition characteristic indicator in which a characteristic of an observation condition for each of the observation target setting buttons are indicated by three or more incompatible items.

Also, the embodiment discloses that items in the observation condition characteristic indicator include high resolution, emphasis on surface structure and emphasis on material difference.

The embodiment discloses a charged particle beam apparatus including a processing unit configured to display, on an image display unit in an image display device, observation target setting buttons for changing an observation condition for a specimen which includes a combination of parameter setting values of the charged particle beam apparatus. The processing unit is configured to display, on the image display unit, observation condition characteristic indicator in which at least items of high resolution, emphasis on surface structure and emphasis on material difference are indicated as a characteristic of observation conditions for each of the observation target setting buttons.

Also, the embodiment discloses that the items in the observation condition characteristic indicator include items of charge-up suppression and/or beam damage suppression.

The embodiment discloses that the apparatus includes, as the plurality of observation target setting buttons, a first button configured to change an observation condition to an observation condition for observing with the highest resolution, a second button configured to change an observation condition to an observation condition having the most emphasis placed on a surface structure, and a third button configured to change an observation condition to an observation condition having the most emphasis placed on the material difference. Also, the embodiment discloses that the apparatus further includes, as the observation target setting buttons, a fourth button configured to change an observation condition to an observation condition having emphasis placed on the surface structure and a material difference and a fifth button configured to change an observation condition to an observation condition that is most suitable for elemental analysis.

Moreover, the embodiment discloses that the observation condition characteristic indicator includes a radar chart.

Furthermore, the embodiment discloses that the processing unit is configured to display, on the image display unit, a highlighted image highlighted on a characteristic of an image obtained under an observation condition for each of the observation target setting buttons. The embodiment also discloses that the highlighted image serves as an image which schematically represents three or more materials different in shape and/or material quality.

The embodiment discloses that, after acquiring an image of a new specimen under a standard observation condition, the processing unit changes the observation condition according to each of the observation target setting buttons. The embodiment also discloses that the standard observation condition serves as an observation condition for observing with the highest resolution.

The embodiment discloses a specimen observation system including a charged particle beam apparatus and a computer configured to control the charged particle beam apparatus, the computer including a processing unit configured to display, on an image display unit in an image display device, observation target setting buttons for changing a observation condition for a specimen which includes a combination of parameter setting values of the charged particle beam apparatus. The processing unit is configured to display a highlighted image, in which an image change due to a change of the observation condition is highlighted, on or near each of the observation target setting buttons.

Moreover, the embodiment discloses an operation program for operating a charged particle beam apparatus, wherein when the operation program is executed by a computer for displaying, on an image display unit in an image display device, observation target setting buttons for changing an observation condition which includes a combination of parameter setting values of the charged particle beam apparatus, the operation program is executed by a computer for displaying a highlighted image, in which an image change due to a change of the observation condition is highlighted, on or near an observation target setting button.

<Configuration of Electron Microscope>

FIG. 1 is a schematic configuration diagram showing an example of an electron microscope according to the present invention.

In an electron microscope (charged particle beam apparatus and specimen observation system) 101, a primary electron beam 2 emitted from an electron gun 1 is converged by a condenser lens 3 and an objective lens 8, and then irradiated onto a specimen 9 by an upper deflector 6 and a lower deflector 7. Signal electrons generated from the specimen 9 are detected by a detector 10 and processed by a computer (processing unit) 19 through circuits 11 to 17 to be described later. A signal recorded so as to correspond to a scanning position is displayed on an image display device 18. In order to focus the primary electron beam 2 as dots on the specimen 9, an X-direction stigmator 4 for focus X adjustment and a Y-direction stigmator 5 for focus Y adjustment are provided. By adjusting control conditions thereof, the focus X adjustment and focus Y adjustment (astigmatism correction) can be performed. Moreover, by adjusting excitation intensity of the condenser lens 3 or the objective lens 8, focus adjustment can be performed on the specimen 9.

The electron optical system described above is housed in an electron microscope column (charged particle beam apparatus) 100.

Moreover, a high-voltage control circuit 11, a condenser lens control circuit 12, an X-direction stigmator control circuit 13, a Y-direction stigmator control circuit 14, a deflector control circuit 15, an objective lens control circuit 16 and a detection signal control circuit 17 are controlled by the computer 19 such as a CPU (Central Processing Unit). The respective control circuits 11 to 17 may be provided separately or on one substrate, or may be included in the computer 19. The image display device 18, a storage device (storage unit) 21 and a memory 22 are connected to the computer 19. As described later, a user adjusts focus conditions of the objective lens 8 and astigmatism correction conditions of the X-direction stigmator 4 and the Y-direction stigmator 5 through an operation screen 200 (FIGS. 3 to 37) displayed on the image display device 18. The operation screen 200 in this embodiment is previously stored in the storage device 21 so as to correspond to operation steps and the like as described later. Alternatively, if the computer 19 is connected to an unillustrated network, the operation screen 200 may be stored in another storage device connected to the network.

An operation program 31 is developed in the memory 22, and the operation program 31 is executed by the computer 19. The operation program 31 is configured to display the operation screen 200 on the image display device 18, and to control each of the components 1 to 17 based on information inputted through an input device 23.

Note that, as described in detail later, the operation screen 200 is each of screens to be displayed corresponding to user operation steps.

<Operation Procedures>

Figure 2:
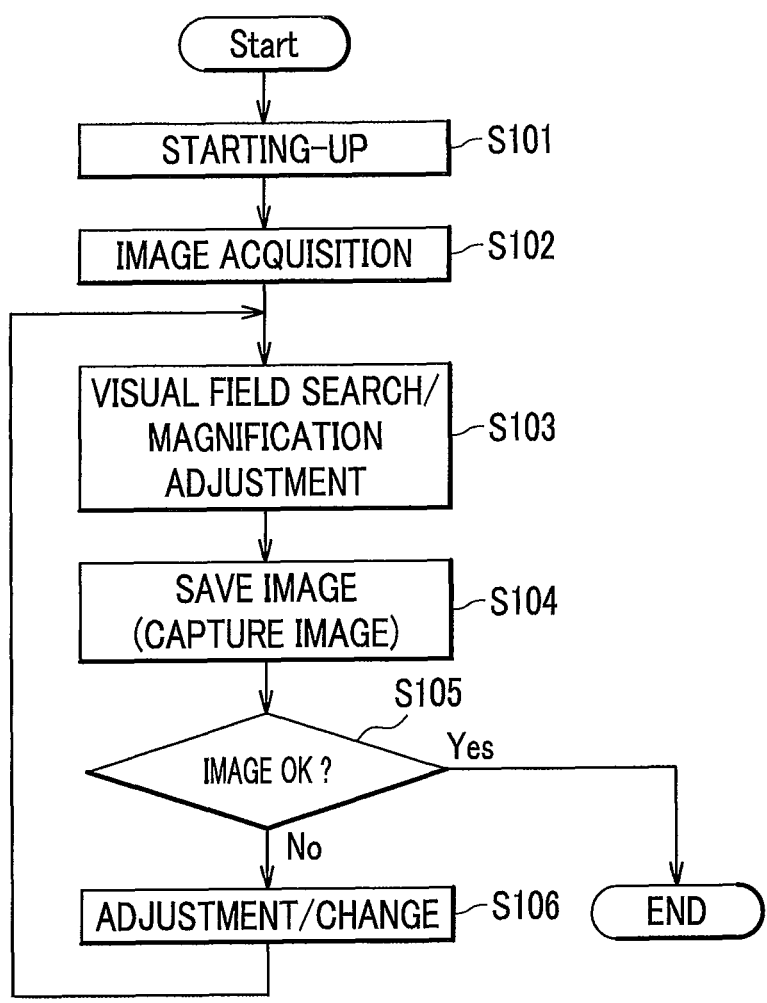
FIG. 2 is a flowchart showing operation procedures of the electron microscope according to an embodiment of the present invention.

FIG. 2 is a flowchart showing operation procedures of the electron microscope according to this embodiment. With appropriate reference to FIG. 1, description is given of the operation procedures according to this embodiment along FIG. 2.

First, the user activates the operation screen 200 (FIGS. 3 to 37) by running an unillustrated operation program (S101). Note that the specimen 9 may be set before or after the activation of the operation screen 200.

Then, the computer 19 is implemented to scan the specimen 9 under a default observation condition to acquire a scan image (hereinafter referred to as the image) (S102). The operation program 31 is executed to display the acquired image on the image display device 18. Here, the observation condition is the combination of parameter setting values of an electron microscope 101.

Subsequently, the user performs visual field search, magnification adjustment and the like on the acquired image (S103). Note that, when the visual field and the magnification are automatically set, the processing of Step S103 can be omitted.

The computer 19 is implemented to scan the specimen 9 as needed with the visual field and magnification set in Step S103 to acquire an image, and to display the image on the image display device 18.

Then, the user instructs the computer 19 to store the image displayed on the image display device 18 in the storage device 21 (S104). In this embodiment, the storage of the image in the storage device 21 is referred to as "capturing" as necessary.

Thereafter, the user determines whether or not the acquired image is OK (S105).

If the image is OK as a result of Step S105 (S105: Yes), the user terminates the processing.

If the image is not OK as a result of Step S105 (S105: No), i.e., NG, the user adjusts or changes the observation condition by reference to a message and the like displayed on an application assist screen 202 (FIG. 3) or the like on the operation screen 200 (S106).

The computer 19 is implemented to scan the specimen 9 as needed under the adjusted or changed observation condition to acquire an image, and to display the image on the image display device 18.

Then, the operation program 31 returns the processing to Step S103, and the user instructs the computer 19 to store (capture) the image, which is displayed on the image display device 18, again in the storage device 21.

Thereafter, the electron microscope 101 repeats the processing from Step S103 to Step S106.

<Configuration of Operation Screen>

Figure 3:
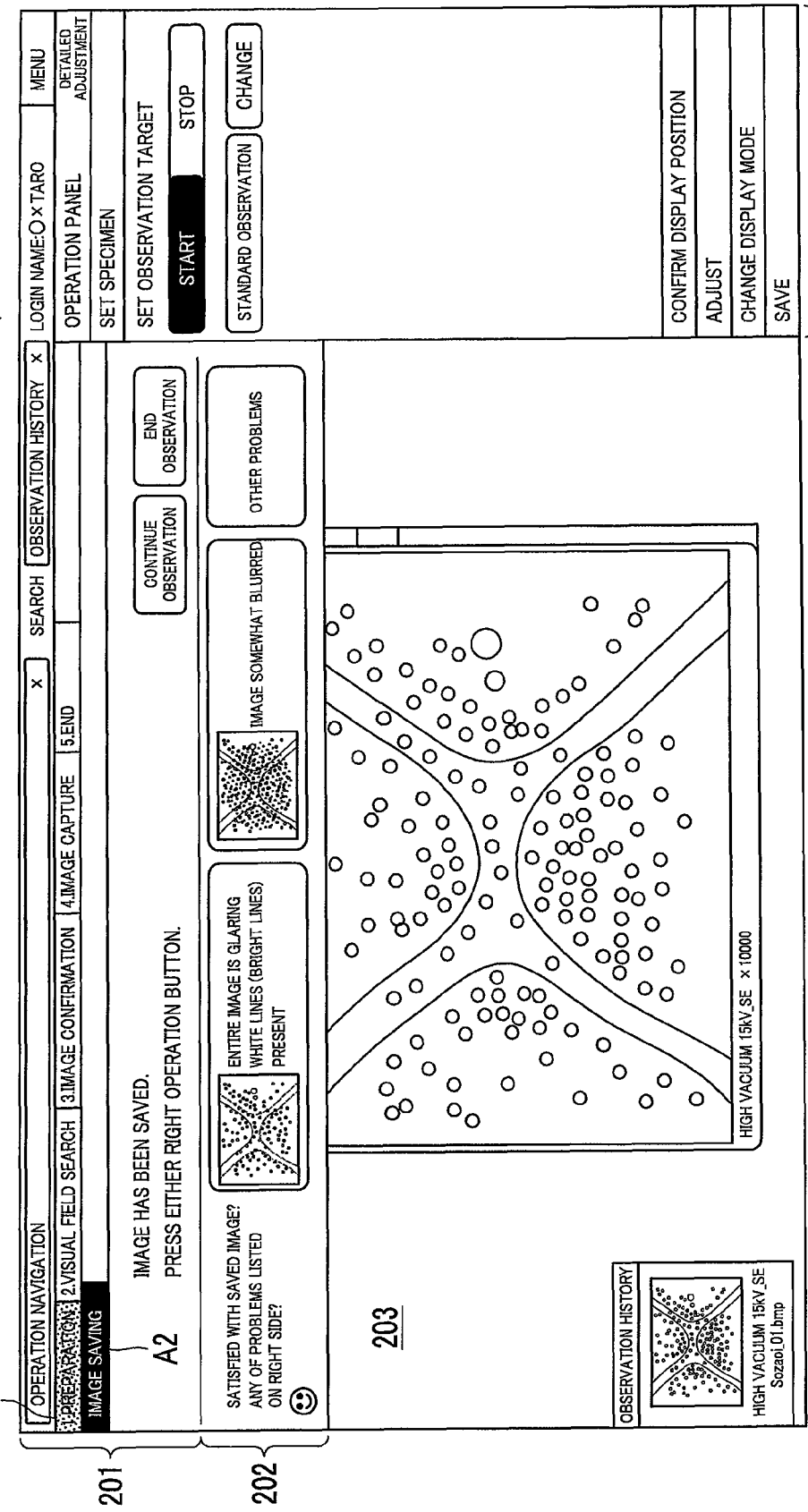
FIG. 3 is a diagram showing a screen example of an operation screen according to the embodiment.

FIG. 3 is a diagram showing a screen example of an operation screen according to this embodiment.

The operation screen 200 includes an operation navigation screen 201, the application assist screen 202, an image display screen (image display unit) 203 and an operation panel screen 204. The individual screens 201 to 204 are described later.

The operation navigation screen 201 is a screen showing operation steps. On the operation navigation screen 201, a main item (reference numeral A1) as the current operation step and a sub-item (reference numeral A2) of the main item are displayed. In this way, even a novice user can easily follow the operation steps.

The application assist screen 202 is a screen displaying advice on changing or adjustment of capturing conditions.

The image display screen 203 is a screen displaying an image (scan image) obtained by the electron microscope 101.

The operation panel screen 204 is a screen for changing or adjusting the capturing conditions.

Note that the contents displayed on the screens 201 to 204 change with the step of the operation performed by the user as described later.

The operation screen 200 according to this embodiment is based on the assumption that the user is a novice user.

<Operation Screen at Each Operation Step>

Next, with reference to FIGS. 4 to 37, description is given of the contents displayed on the operation screen 200 at each operation step. Note that, as to the elements included in the screens 201 to 204 in the following drawings, only the necessary elements in the screen to be described are denoted by reference numerals, and reference numerals of the others are omitted. Also, although the reference numerals are assigned in most of FIGS. 4 to 37, description of the operation screen 200 and the screens 201 to 204 is omitted in the drawings.

Moreover, FIG. 1 is referred to as needed, and the same step numbers as those in FIG. 2 are used.

(S101)

Figure 4:
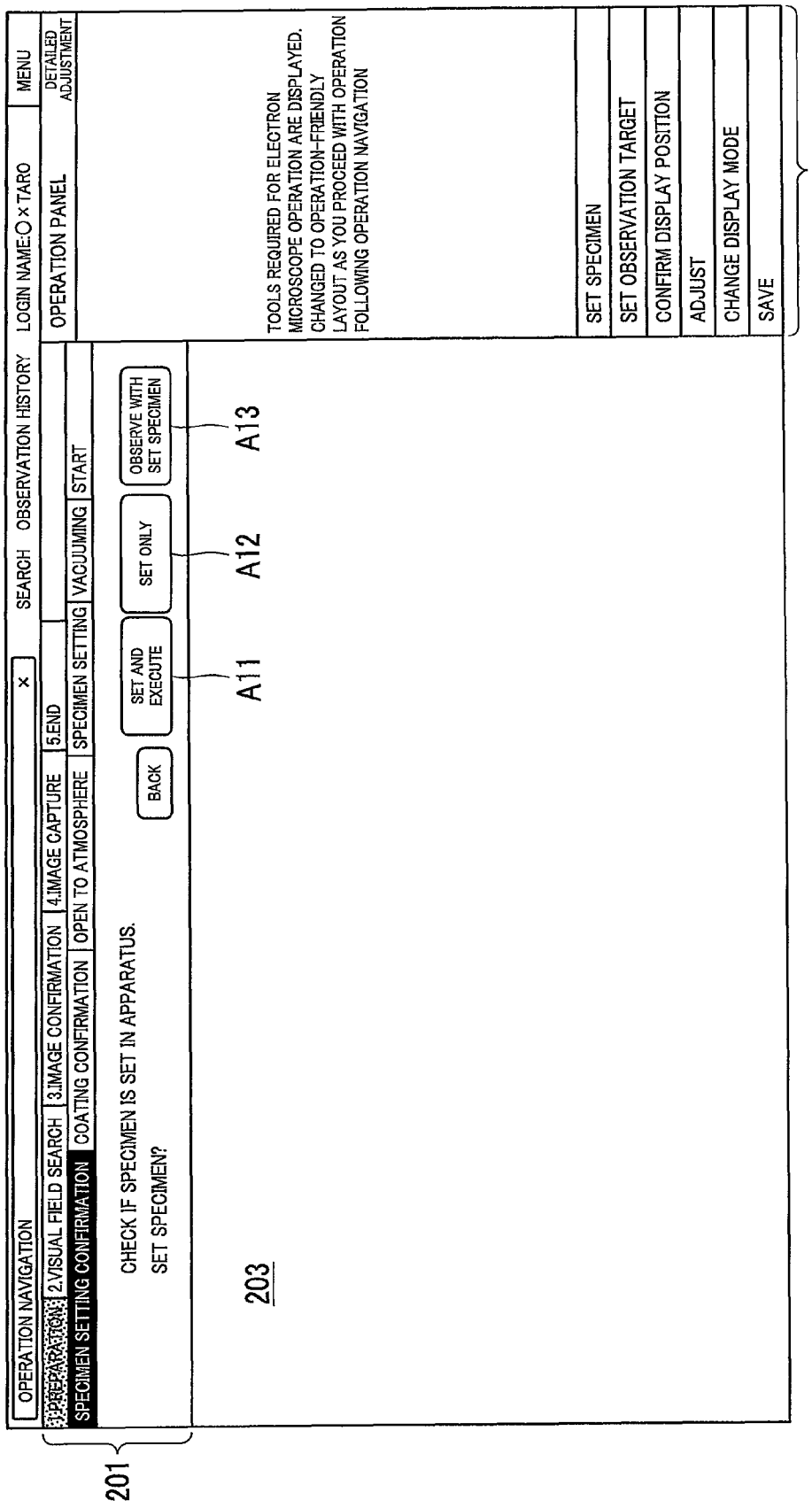
FIG. 4 is a diagram (Part 1) showing an example of the operation screen during start-up.
Figure 5:
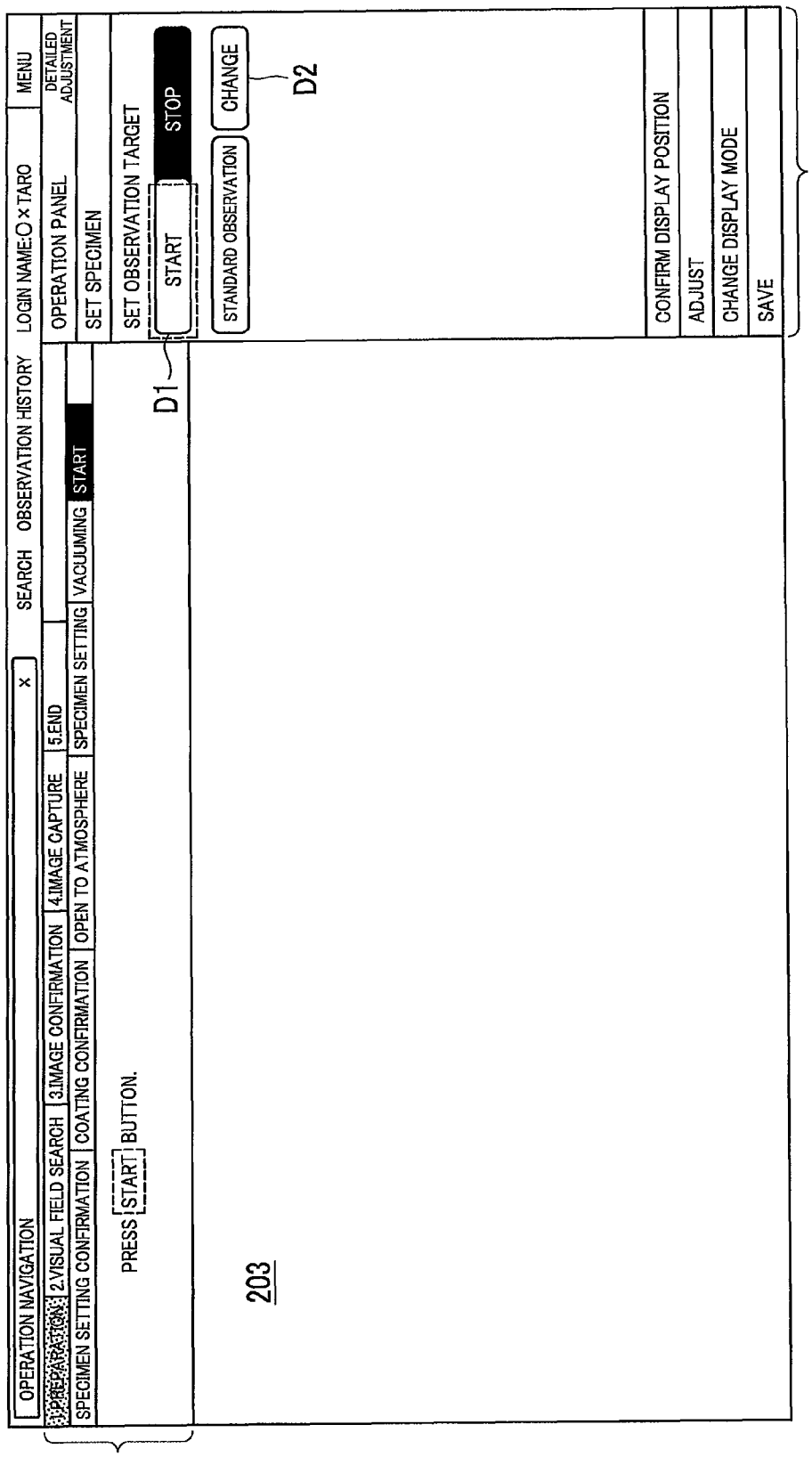
FIG. 5 is a diagram (Part 2) showing an example of the operation screen during start-up.

First, FIGS. 4 and 5 show examples of the operation screen during the start-up of scan screen (S101).

FIG. 4 is a diagram showing contents displayed when the operation screen is activated.

Since no capturing of the specimen 9 is performed when the operation screen 200 is activated, the application assist screen 202 (FIG. 3) is not displayed. Also, no information is displayed on the image display screen 203 and the operation panel screen 204.

The operation navigation screen 201 shows that the current operation step is "Confirm Whether to Set Specimen" of "1. Preparation", and displays buttons A11 to A13 to confirm whether to set the specimen 9.

Here, it is assumed that the specimen 9 is already set on the electron microscope 101 and the user presses the button A13 "Start Observation on Set Specimen".

FIG. 5 is a diagram showing an example of the operation screen during the start-up.

At the step shown in FIG. 5, the operation navigation screen 201 shows that the current operation step is "Start (irradiation start)" of "1. Preparation".

A start button D1 is highlighted on the operation panel screen 204. When the user presses the start button D1, the electron microscope 101 performs capturing by irradiating an electron beam onto the specimen 9 under a preset default observation condition. Such highlighting of buttons and the like to be operated next enables the user to learn the observation procedure.

Moreover, such highlighting of buttons to be pressed next enables even a novice user to easily proceed with the operation.

In this embodiment, "Observation Target=Standard Observation, Deposited Specimen (High Vacuum)" is set as the default observation condition.

In this embodiment, a first image is acquired under the default observation condition, and parameter adjustment is performed by processing to be described later based on the acquired image. Usually, the novice user does not know how to set parameters of the electron microscope. However, according to this embodiment, the user is not required to perform complicated parameter setting or selection of observation condition from the start. As a result, even the novice user can easily proceed with the observation.

As the default observation condition, an average observation condition may be set or an observation condition that clarifies characteristics to be highlighted may be set. Since it is known that the capturing is performed under the default observation condition, the processing up to image acquisition may be automatically performed after the specimen 9 is set by the user. However, by allowing the user to press the start button D1 and the like, the user can learn the procedure.

Note that, when a change button D2 displayed on the operation panel screen 204 is pressed, an observation condition change screen (e.g., an observation target change screen 304 to be described later with reference to FIG. 17) is displayed to enable change in observation target (see FIG. 17 for change in observation target). Although the user can set the magnification, visual field and the like at the operation step shown in FIG. 5, description thereof is omitted here. Note that the operation panel screen 204 is a screen that changes with the operation navigation screen 201.

Note that, at a predetermined step, the operation program 31 may be configured to display, on the application assist screen 202, information about confirmation of the presence or absence of coating on the specimen 9. Also, the operation program 31 may be configured to display, on the application assist screen 202, information about pretreatment on the specimen 9, such as information about deposition on the specimen 9 and information about a method of observing an uncoated specimen 9 (more specifically, an operation procedure to select a degree of vacuum for shifting to low-vacuum observation) and a degree of vacuum (target and method of high-vacuum observation and low-vacuum observation).

In this way, the user can confirm the presence or absence of coating and acquire knowledge about the pretreatment of the specimen.

Note that, in this embodiment, the information about the confirmation of the presence or absence of coating and the pretreatment is displayed before irradiation of the primary electron beam 2. However, the present invention is not limited thereto, but such information may be displayed at another operation step.

(S102)

Figure 6:
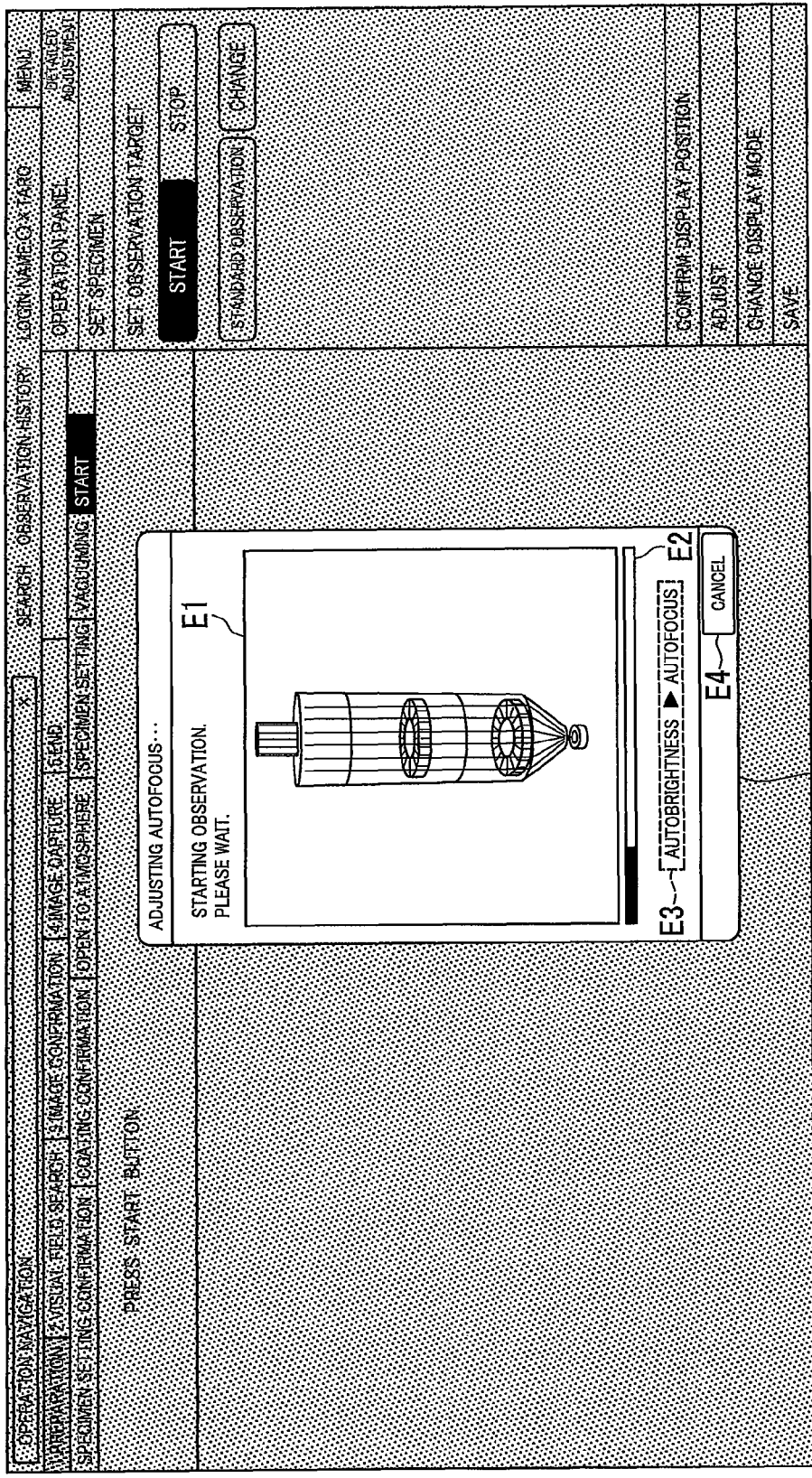
FIG. 6 is a diagram showing an example of the operation screen when irradiation of a primary electron beam onto a specimen is started.

Next, FIG. 6 is a diagram showing an example of the operation screen when irradiation of the primary electron beam onto the specimen is started (S102: image acquisition).

When the irradiation of the primary electron beam 2 onto the specimen 9 is started by the user pressing the start button D1 shown in FIG. 5, the operation screen 200 becomes inactive as shown in FIG. 6, and an irradiation status screen 301 is displayed.

The irradiation status screen 301 includes a schematic diagram screen E1 showing the current irradiation status in a schematic diagram, a progress screen E2 showing the current irradiation progress, an observation condition screen E3 showing the current observation condition, a cancel button E4 and the like.

Here, for the user's learning, a learning screen may be displayed instead of the irradiation status screen 301, the learning screen showing the principles of the electron microscope 101, explanation of the pretreatment of the specimen 9, the structure of the electron microscope 101, the operation procedure of the electron microscope 101, the principles of highlighted images in capturing, and the like.

Alternatively, a learning screen may be displayed instead of the irradiation status screen 301, the learning screen showing explanation of items in the screens 201 to 204 (FIG. 3) such as the application assist screen 202 (FIG. 3) in the operation screen 200, explanation of various adjustment parameters of the electron microscope 101, and the like.

Particularly, the application assist screen 202 is to be displayed frequently on the operation screen 200 in the subsequent process. Therefore, by displaying the learning screen on the application assist screen 202, the user can be expected to improve his/her knowledge on a subconscious level.

Note that such a learning screen may be displayed together with the irradiation status screen 301.

Even if the user does not pay close attention to such a learning screen, a learning effect on the user can be expected by repeatedly displaying the learning screen even for a short period of time during the irradiation of the primary electron beam 2. Alternatively, the operation program 31 may be configured to repeatedly display the learning screen on the image display device 18 not only during autofocus adjustment to be described later but also during user standby time (processing standby time). Here, the user standby time is the time generated while various adjustments are being automatically made by the electron microscope 101. Thus, further improvement in the learning effect on the user can be expected. Alternatively, the operation program 31 may be configured to display the learning screen on the image display device 18 in the user standby time during vacuuming of a specimen chamber. The vacuuming of the specimen chamber is the longest as the user standby time. Therefore, by displaying the learning screen during the vacuuming, improvement in the learning effect on the user can be expected.

The learning screen as described above is different from an ATM (Automated Teller Machine) or an advertisement displayed on an Internet website in that explanation of an operation method to be performed next or the concept of the electron microscope 101 can be visualized for intuitive understanding. This embodiment is different from the ATM or the advertisement displayed on the Internet website in that the user can acquire the knowledge about the principles of the electron microscope 101 and the operation method by visualizing the explanation of the operation method to be performed next or the concept of the electron microscope 101 for intuitive understanding as described above.

(S103)

Figure 7:
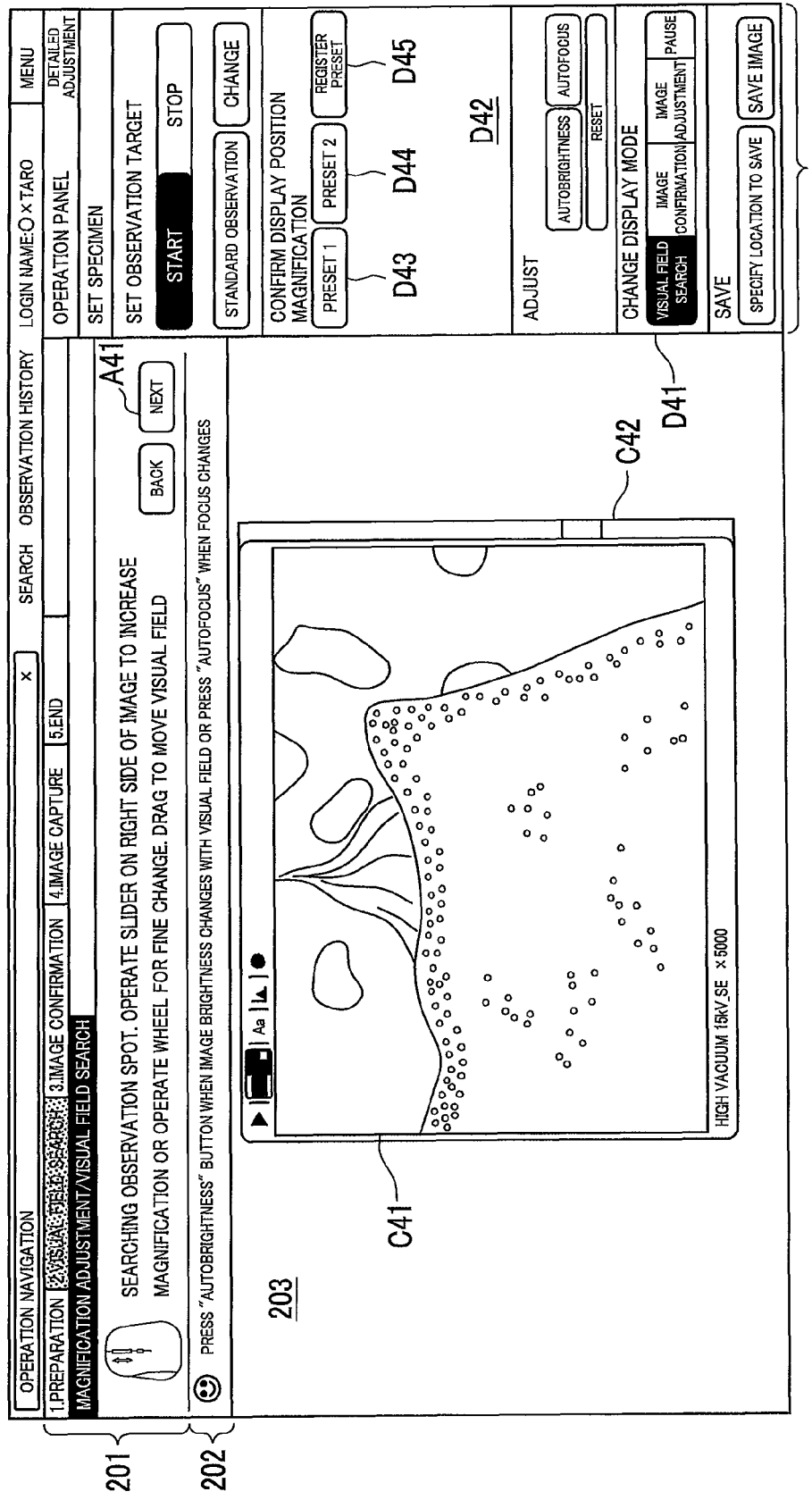
FIG. 7 is a diagram (Part 1) showing an example of the operation screen during visual field search and magnification adjustment by a user.
Figure 8:
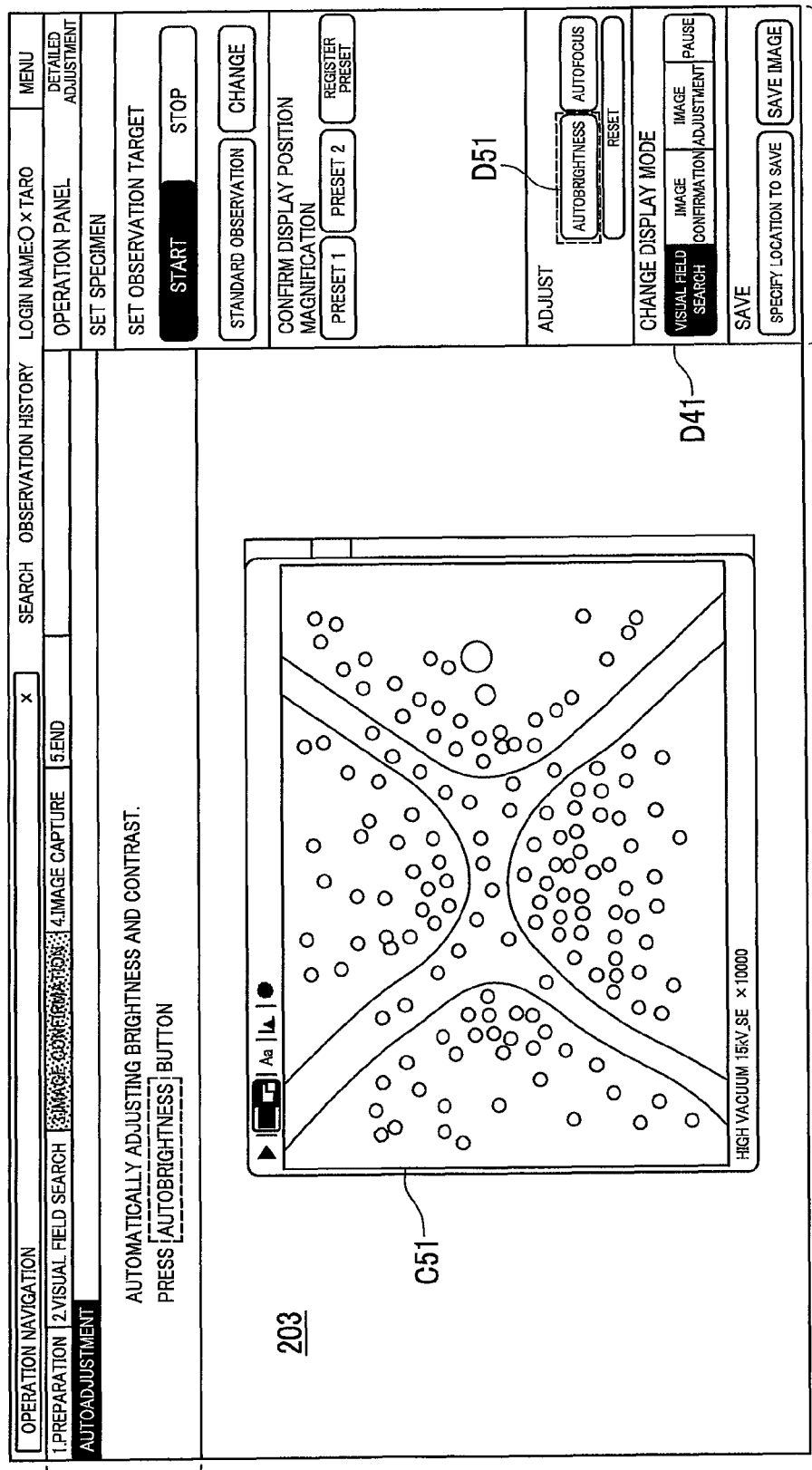
FIG. 8 is a diagram (Part 2) showing an example of the operation screen during visual field search and magnification adjustment by the user.

Next, FIGS. 7 and 8 are diagrams each showing an example of the operation screen during visual field search and magnification adjustment by the user (S103).

FIG. 7 is a diagram showing contents displayed immediately after the irradiation of the primary electron beam is completed.

Here, the user performs magnification adjustment and visual field search on an image acquired after the completion of the irradiation of the primary electron beam 2.

The operation navigation screen 201 shows that the current operation step is "Magnification Adjustment/Visual Field Search" of "2. Visual Field Search".

Also, an image C41 acquired as a result of the irradiation of the primary electron beam 2 is displayed on the image display screen 203.

Moreover, various buttons for adjustment of the electron microscope 101 are displayed on the operation panel screen 204.

For example, if the user wishes to increase the magnification, he/she can manually adjust the magnification by moving a slider C42 attached on the side of the image C41. For example, the user may move the slider C42 when he/she wishes to make a large change in magnification, and operate a wheel or trackball of a mouse when he/she makes a fine change in magnification. The computer 19 changes the magnification by causing the objective lens control circuit 16 to control the objective lens 8 according to a movement distance of the slider C42 inputted through the input device 23.

Meanwhile, when the user wishes to move the visual field of the image C41, he/she can manually move the visual field of the image C41 by dragging the image C41, for example. Based on information inputted through the input device 23, the computer 19 may move a stage or perform an image shift by causing the deflector control circuit 15 to control the upper deflector 6 and the lower deflector 7 to deflect the primary electron beam 2.

Here, as to the movement of the visual field, the image shift may be adopted as the means for moving the visual field if the magnification is not less than a predetermined magnification, while the stage movement may be adopted as the means for moving the visual field if the magnification is not more than the predetermined magnification. In other words, the computer 19 may enable the image shift and disable the stage movement if the magnification is not less than a predetermined value. On the other hand, if the magnification is less than the predetermined value, the computer 19 may limit the functions of the electron microscope 101 by enabling the stage movement and disabling the image shift. Accordingly, the user can be prevented from erroneously moving the visual field.

As described above, in this embodiment, the items of parameter adjustment, such as the magnification and focus to be described later, and the slider C42 are displayed near the image C41 (next to the image C41 in this embodiment). Thus, the movement of the visual field or mouse cursor can be minimized, and thus fine adjustment can be made while comparing with the image C41. In the conventional technique, a tab on an operation device mounted in the electron microscope 101 is operated. On the other hand, in this embodiment, the magnification and the like are adjusted using the slider C42 and the like displayed near the image C41. Thus, the adjustment can be easily made while watching the image C41. Also, when a plurality of images C41 are displayed, the slider C42 is displayed for each of the images C41. Thus, the user can easily make adjustments for each of the images C41.

Note that, in this event, the operation program 31 may be configured to limit the range of the magnification that can be adjusted. In other words, the operation program 31 may be configured to prevent the user from setting the magnification to more than a predetermined magnification. Accordingly, the user can be prevented from erroneously setting an unexpected magnification and causing a problem in an image to be acquired.

Note that a display mode for the image C41 displayed on the image display screen 203 is appropriately switched by the operation program 31 according to the operation step. For example, at the visual field search step shown in FIG. 7 or the image confirmation step shown in FIG. 8, the operation program 31 is executed to set a "visual field search mode" that is a display mode for increasing a scan speed of the electron beam in order to improve a response of the image. Meanwhile, since a high-definition image is required at an image storage step, the operation program 31 is executed to lower the scan speed and sets an "image confirmation mode" for displaying a high-definition image. A screen D41 in the operation panel screen 204 shows in which display mode the image C41 is currently displayed. In FIG. 7, the display mode is set to the "visual field search mode".

By the operation program 31 appropriately switching the display mode according to the operation step as described above, reduction in work efficiency or mistakes due to a failure to perform the operation can be prevented.

Moreover, by displaying a message regarding switching of the display mode on the operation navigation screen 201, the user can recognize what kind of processing is performed by the operation program 31.

Note that preset buttons D43 (Preset 1) and D44 (Preset 2) on a screen D42 in the operation panel screen 204 shown in FIG. 7 are buttons for setting the magnification to a preset magnification that is pre-registered. A preset registration button D45 is a button for registering a new preset magnification.

Note that the application assist screen 202 displays a message regarding criteria for pressing an autobrightness button and an autofocus button.

After making a series of adjustments, the user displays the operation screen 200 shown in FIG. 8 by pressing a "Next" button A41 displayed on the operation navigation screen 201.

FIG. 8 is a diagram showing contents displayed in autoadjustment shown in FIG. 7.

In FIG. 8, the operation navigation screen 201 shows that the current step is "Autoadjustment" of "3. Image Confirmation".

Note that the various buttons displayed on the operation panel screen 204 are not changed from those shown in FIG. 7. However, an image C51 on the image display screen 203 is subjected to magnification adjustment and is displayed at a magnification higher than that in FIG. 7.

Here, the user presses an "autobrightness" button D51 in the operation panel screen 204 to adjust the brightness and contrast.

Note that, in FIG. 8, the screen D41 in the operation panel screen 204 shows that the display mode is the "visual field search mode" at the previous operation step.

When the user presses the "autobrightness" button D51, autoadjustment of the brightness (adjustment to default brightness) is performed.

(S104)

Next, FIGS. 9 to 14 are diagrams each showing an example of the operation screen during image saving (capturing) (S104).

Figure 9:
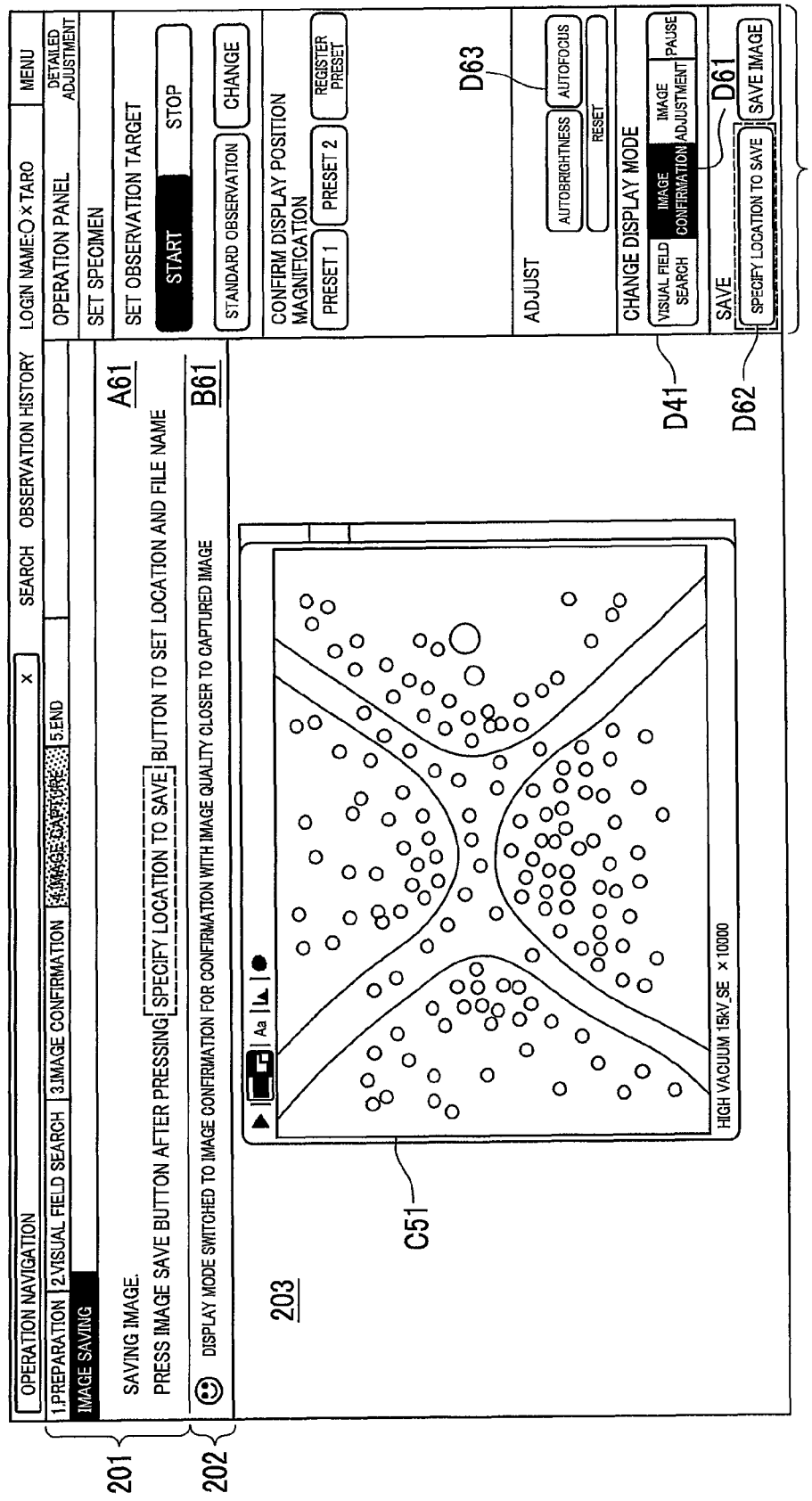
FIG. 9 is a diagram (Part 1) showing an example of the operation screen during image saving (capturing).

FIG. 9 is a diagram showing contents displayed immediately after the autoadjustment is completed.

The operation navigation screen 201 displays a message indicating that "3. Image Confirmation" is finished and the operation step has proceeded to "Image Saving" of the next "4. Image Capture". Also, a message prompting saving of the image is displayed on a screen A61. Moreover, the screen D41 is changed from "Visual Field Search" to "Image Confirmation". Other than the above, the various buttons displayed on the operation panel screen 204 are the same as those shown in FIGS. 7 and 8.

As described with reference to FIG. 7, the operation program 31 is executed to switch the display mode of the image C51 according to the operation step. However, in the "Image Saving" step shown in FIG. 9, the operation program 31 is executed to set the display mode to an "image confirmation" mode (reference numeral D61 on the screen D41 in the operation panel screen 204) for obtaining a high-definition image.

Also, a screen B61 on the application assist screen 202 displays a message indicating that the display mode is switched to the "image confirmation" mode.

In this event, the application assist screen 202 may display a message indicating what characteristics are to be highlighted for capturing under an observation condition in autoadjustment.

Figure 10:
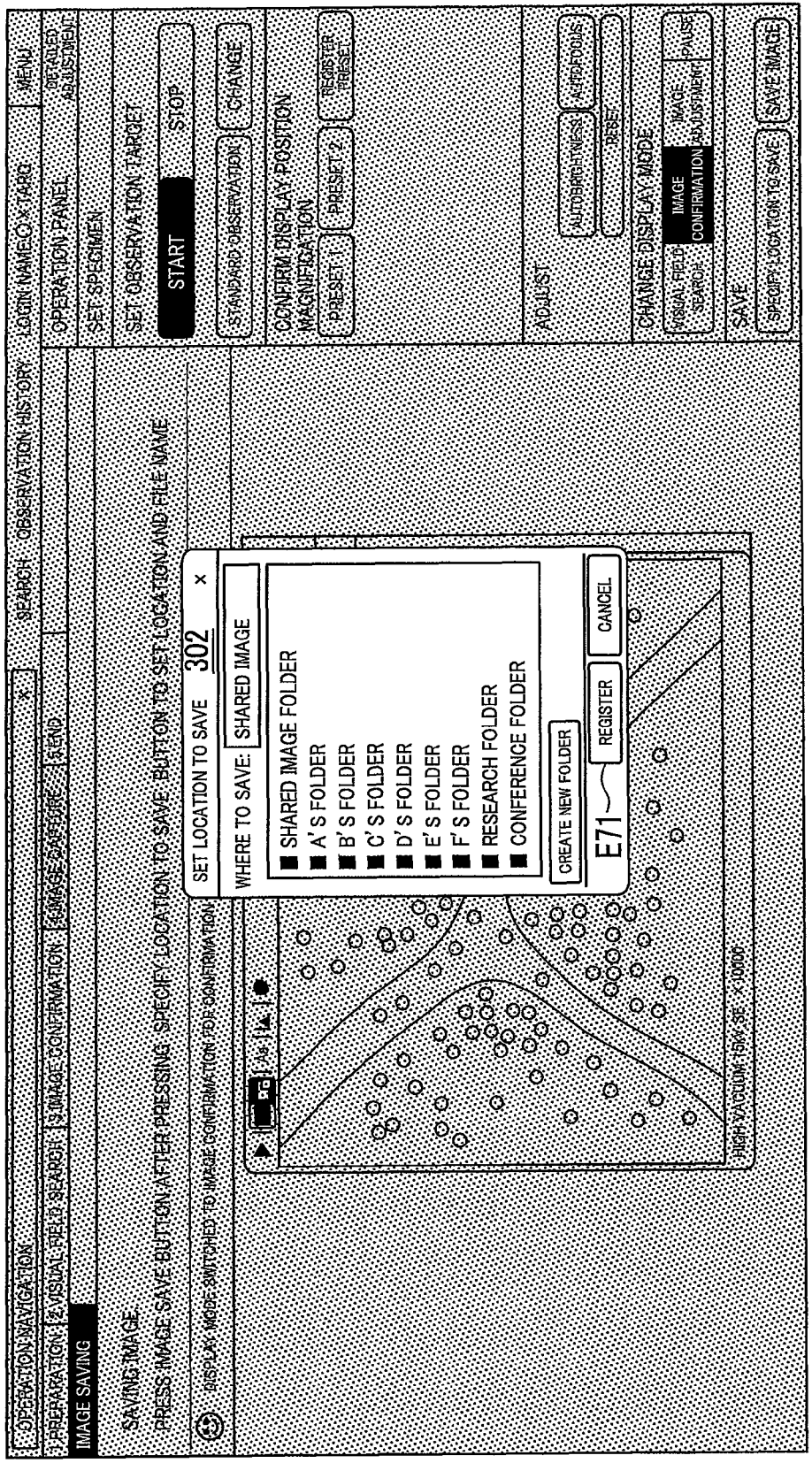
FIG. 10 is a diagram (Part 2) showing an example of the operation screen during image saving (capturing).

Here, when the user presses a "Specify Destination to Save" button D62 highlighted in the operation panel screen 204, display-contents shown in FIG. 10 are displayed.

Note that, here, the autoadjustment is finished just by the user performing the autobrightness adjustment. However, by pressing an "autofocus" button D63 at the operation step shown in FIG. 8 or FIG. 9, the user may perform autofocus for adjusting the focus to a focus value determined to be optimum by a person who has performed the parameter setting.

FIG. 10 is a diagram showing contents displayed at a step of setting the location to save.

When the user presses the "Specify Destination to Save" button D62 in the operation panel screen 204 shown in FIG. 9, the operation program 31 is executed to render the operation screen 200 inactive as shown in FIG. 10, and to display a location setting screen 302 in front of the operation screen 200.

Since the location setting screen 302 is the same as a general location setting screen, detailed description thereof is omitted. When the user sets the location to save on the location setting screen 302 and presses a registration button E71, the operation program 31 is executed to display display-contents shown in FIG. 11 on the image display device 18.

Figure 11:
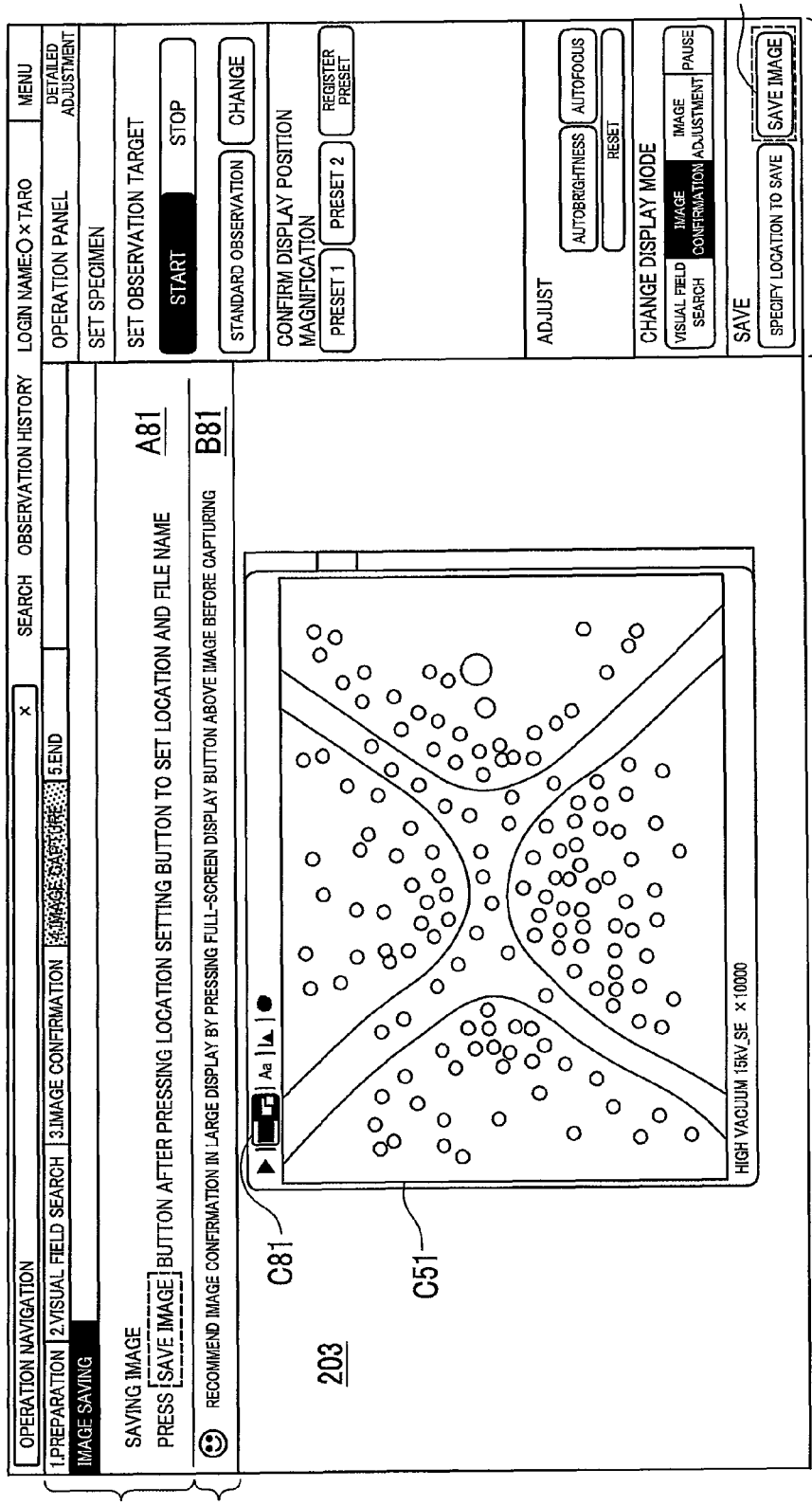
FIG. 11 is a diagram (Part 3) showing an example of the operation screen during image saving (capturing).
Figure 12:
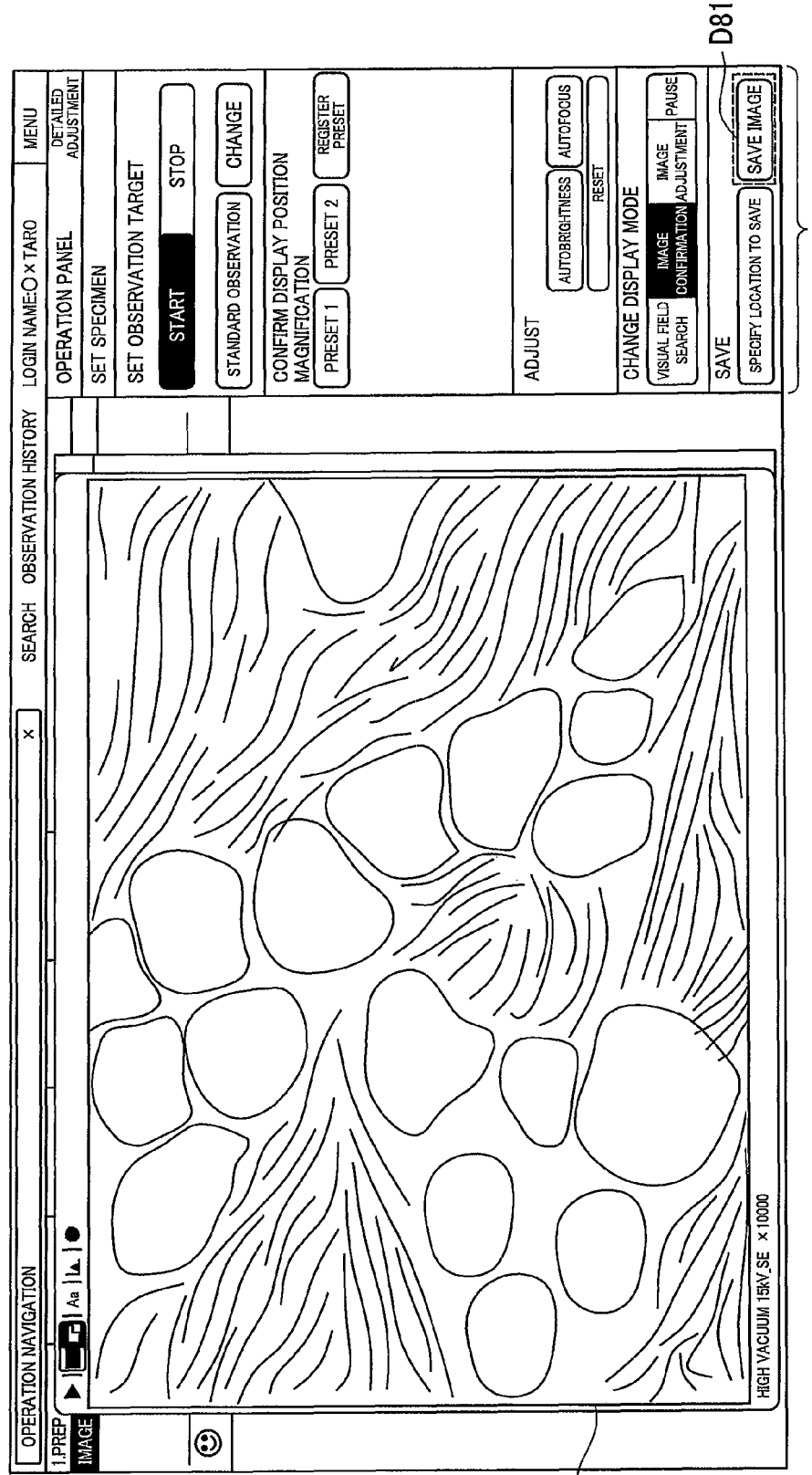
FIG. 12 is a diagram (Part 4) showing an example of the operation screen during image saving (capturing).

FIGS. 11 and 12 are diagrams showing contents displayed at the image saving step.

FIGS. 11 and 12 show the operation screen 200 for saving the displayed image C51 in the storage device 21.

A screen A81 in the operation navigation screen 201 displays a message prompting pressing of an image save button to save the image.

Also, a screen B81 in the application assist screen 202 displays a message prompting confirmation of the image on a large screen by pressing a full-screen display button before capturing. As described above, the operation program 31 can be executed to display advice corresponding to the operation step on the application assist screen 202. Such display can be provided if screen information for each of the operation steps is stored in the storage device 21 and the operation program 31 is executed to display the screen for each of the operation steps.

In FIG. 11, the image C51 displayed on the image display screen 203 and the various buttons in the operation panel screen 204 are the same as those shown in FIG. 9, except that a "Save Image" button D81 is highlighted in the operation panel screen 204.

Here, when the user presses a full-screen button C81, an image C91 with increased magnification and the like is displayed as shown in FIG. 12. Since other screens 201 (FIG. 11), 202 (FIG. 11) and 204 in the operation screen 200 shown in FIG. 12 are the same as those shown in FIG. 11, description thereof is omitted.

Accordingly, the user can confirm the image in an enlarged state. Note that the user may confirm and save the image with the size of the image displayed in FIG. 11 and the like. After the confirmation of the image, the user presses the "Save Image" button D81 in the operation panel screen 204.

Note that, in this event, the application assist screen 202 may display points of the image confirmation.

Figure 13:
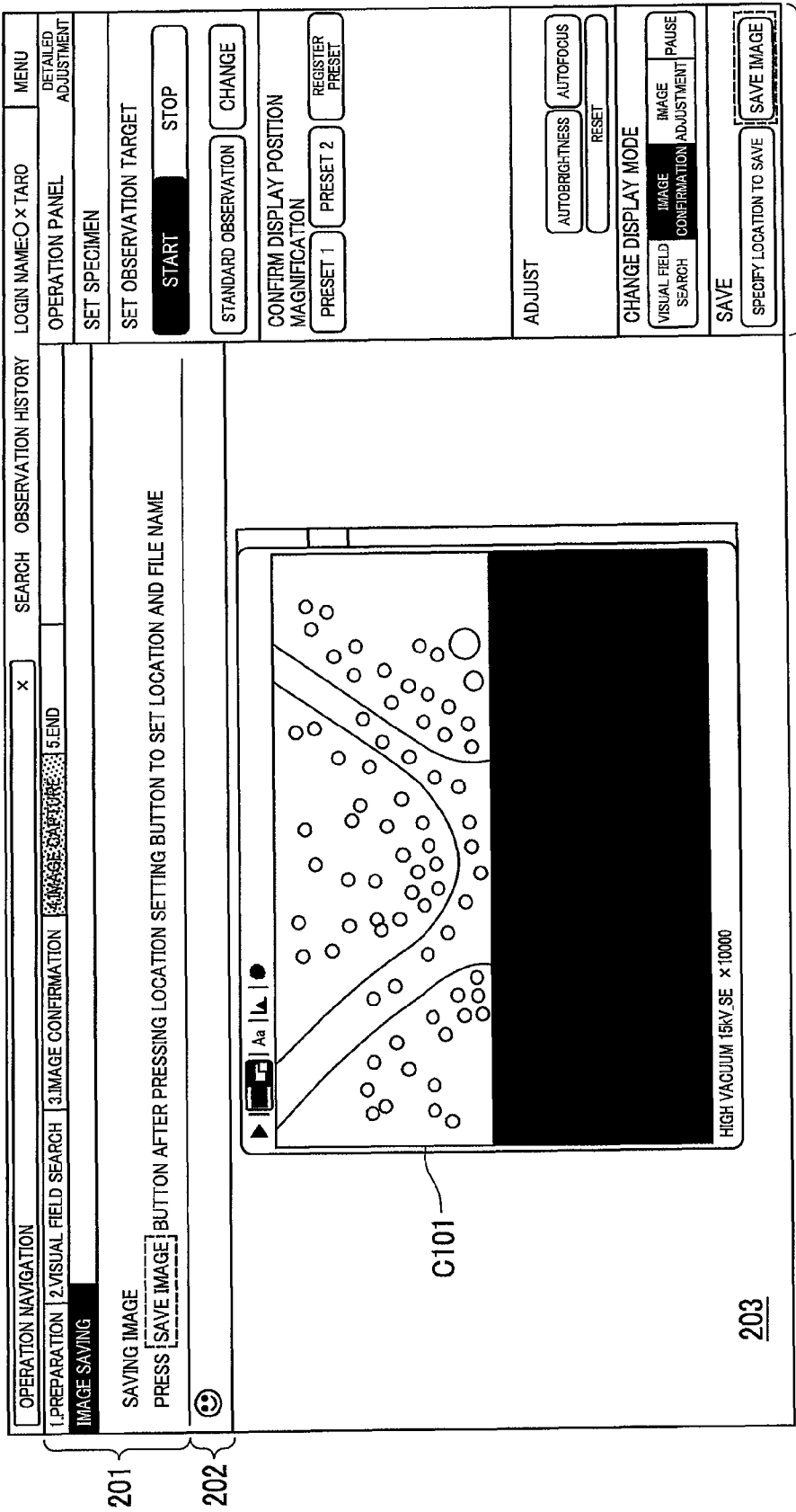
FIG. 13 is a diagram (Part 5) showing an example of the operation screen during image saving (capturing).
Figure 14:
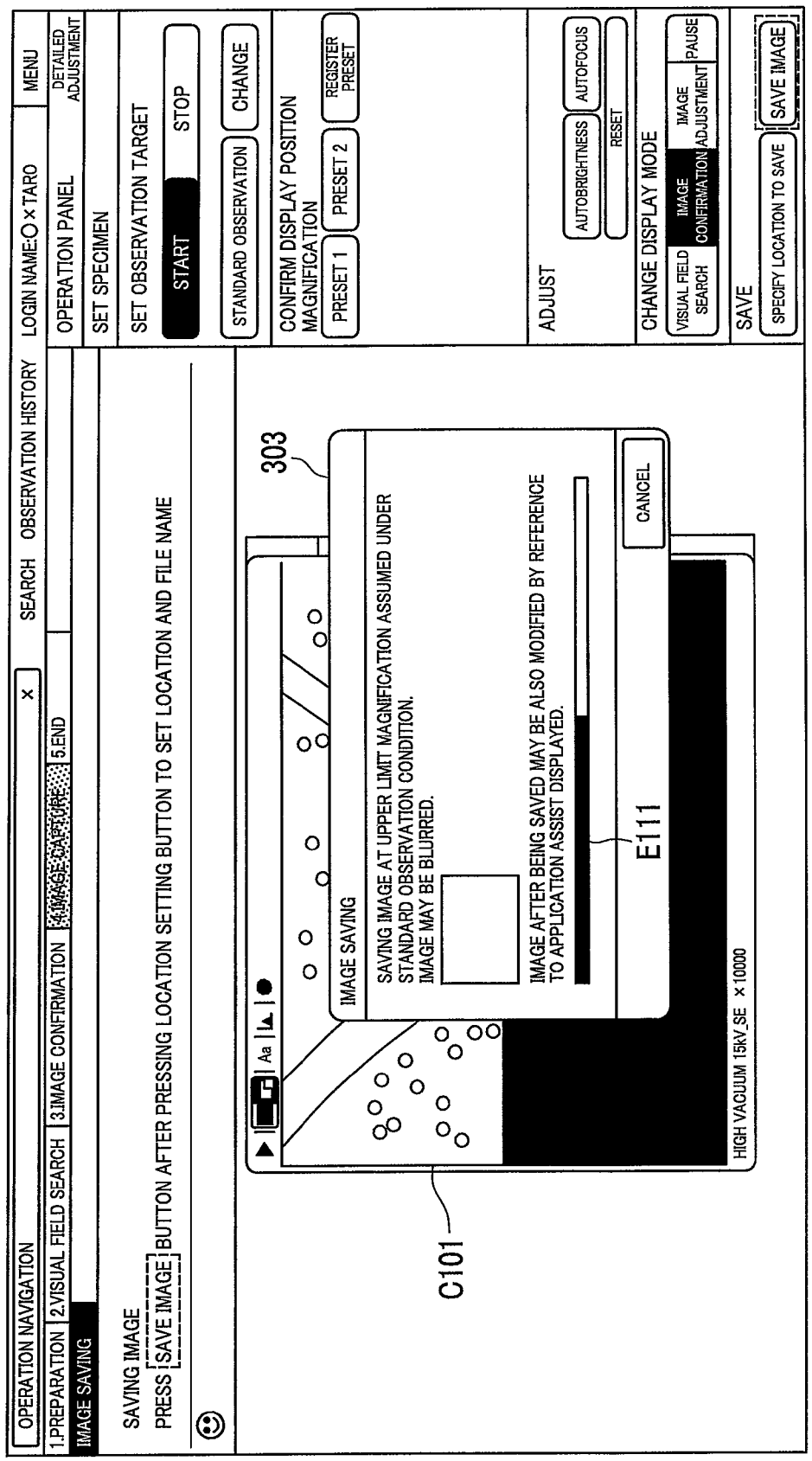
FIG. 14 is a diagram (Part 6) showing an example of the operation screen during image saving (capturing).

FIGS. 13 and 14 are diagrams showing the operation screen 200 during the image saving.

Although the contents displayed on the operation navigation screen 201 and the operation panel screen 204 are the same as those shown in FIGS. 11 and 12, nothing is displayed on the application assist screen 202.

Also, an image C101 displayed in the image display screen 203 appears gradually from the top according to saved pixels.

Moreover, as shown in FIG. 14, an image saving information screen 303 is displayed in front of the operation screen 200. The image saving information screen 303 displays image saving conditions and influences of the conditions. Furthermore, a progress level of image saving processing is displayed by a progress bar E111.

Note that, during a waiting time for the image saving processing, the operation program 31 may be executed to display information on anticipated defects and problems on the application assist screen 202 (FIG. 13). As such information, for example, possible defects or problems in the image under the current capturing conditions (here, the parameters for standard observation and magnification during image saving) may be displayed.

Alternatively, a learning screen may be displayed together with the image saving information screen 303, the learning screen showing the principles of the electron microscope 101, explanation of pretreatment of the specimen 9, the structure of the electron microscope 101, the operation procedure of the electron microscope 101, the principles of highlighted images in capturing, and the like. Furthermore, a learning screen may be displayed together with the image saving information screen 303, the learning screen showing explanation of items in the screens 201 to 204 such as the application assist screen 202 in the operation screen 200, explanation of various adjustment parameters of the electron microscope 101, and the like. Thus, improvement in the learning effect on the user can be expected.

(S105 and S106)

Next, FIGS. 15 to 19 are diagrams showing examples of the operation screen during confirmation of whether or not the current image is OK by the user (S105) and during adjustment and change of the observation condition by the user (S106).

Figure 15:
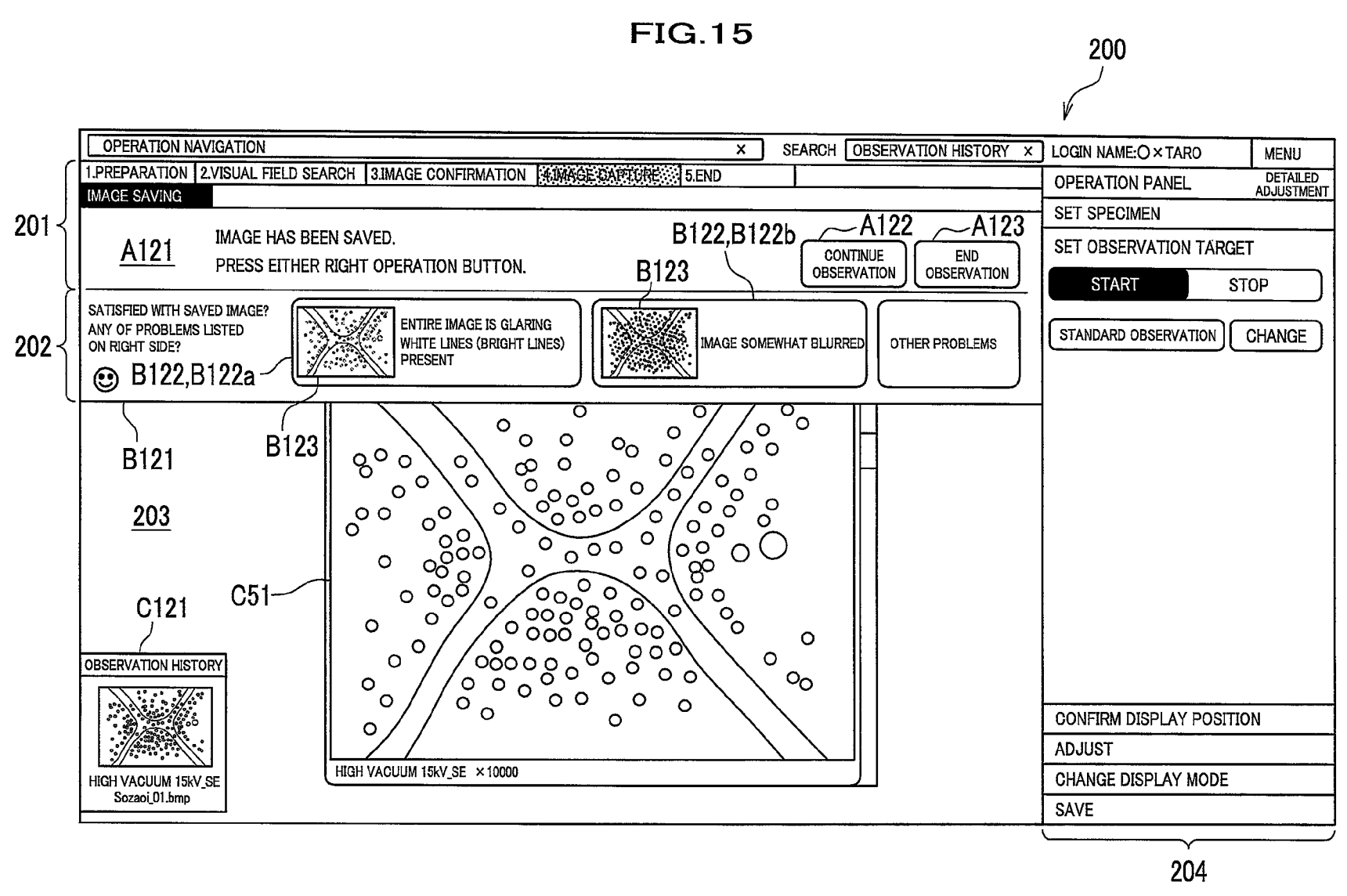

FIG. 15 is a diagram showing contents displayed after the image is saved.

First, the operation navigation screen 201 shows that the current operation step is "Image Saving" of "4. Image Capture".

A screen A121 in the operation navigation screen 201 displays a continue button A122 and an end button A123. When the user is not satisfied with the current image, the continue button A122 to continue the observation is pressed, and the operation program 31 continues the processing (S105: No).

When the user is satisfied with the current image, the end button A123 to end the observation is pressed, and the operation program 31 is executed to terminate the processing (S105: Yes).

The image display screen 203 displays an observation history C121 together with the image C51 under the current observation condition. The images saved thus far (the observation history C121) are displayed together with information (file names and observation condition) which the user wishes to set or check. For example, in FIG. 15, the image previously saved is displayed as the observation history C121. When the user presses the observation history C121, the image is enlarged.

Alternatively, when the user touches the image displayed in the observation history C121 with a mouse, detailed observation condition and the like for the image may be displayed.

Although buttons and the like corresponding to the current operation step are displayed in the operation panel screen 204, description thereof is omitted here.

An assist screen B121 is displayed in the application assist screen 202. The assist screen B121 is a screen displayed with capturing as a trigger. The assist screen B121 displays assist buttons B122 (B122a and B122b) describing advice to the user and the state of the image C51. Note that the assist screen B121 is a screen displayed in principle every time the image is saved.

Here, the assist buttons B122 (B122a and B122b) may be displayed only when the user determines that there is something in the image C51 he/she is concerned about, rather than being always displayed in the application assist screen 202.

Alternatively, an unillustrated display button on the application assist screen 202 may be displayed in a predetermined spot in the operation screen 200, and display and non-display of the application assist screen 202 may be switched by the user pressing the display button.

Here, the operation program 31 may be executed to display information about the current observation condition on the image display device 18.

The observation condition is a combination of various parameter settings of the electron microscope 101 during the irradiation of the primary electron beam 2 as described above. To be more specific, the observation condition includes accelerating voltage, current, working distance, magnification and the like. Such an observation condition includes values that can be acquired before capturing of the specimen 9. Note that the working distance means a distance between a lower surface of the objective lens and the specimen.

The image quality of the image means values of luminance distribution, sharpness and the like. The image quality of the image includes values that can be acquired from the captured image after the capturing.

The information about the operation steps includes the contents displayed on the operation panel screen 204, operation time in each operation step, operation histories and the like. The information about the operation steps is information used when performing processing of hiding the assist buttons B122 for the operation once performed.

Specifically, the information about the assist buttons B122 is stored in the storage device 21 so as to correspond to the image quality of the image and to the observation condition which is the combination of the parameter setting values of the electron microscope 101.

As described above, by the operation program 31 selecting and displaying the assist buttons B122 based on the information about the observation condition, the image quality of the image and the operation steps, the user can easily see what kind of problem is currently occurring.

The computer 19 analyzes the image quality of the image C51. Then, based on the image quality of the image as a result of the analysis and the current observation condition, the operation program 31 is executed to acquire, from the storage device 21, information about the assist buttons B122 corresponding to the result of the analysis. Furthermore, the operation program 31 is executed to display the acquired information about the assist buttons B122 in a predetermined spot (here, the application assist screen 202) on the operation screen 200 as the assist buttons B122.

Here, the computer 19 may be implemented to display the assist buttons B122 that may realize improvement in image quality examined by a manufacturer, based on the current observation condition, without analyzing the image quality of the image C51. In other words, the computer 19 may set the assist buttons B122 to be previously displayed by the manufacturer.

The contents displayed in the assist buttons B122 include the following, besides the contents shown in FIG. 15.

(a) The unevenness or three-dimensional appearance of the image is impaired compared with during the visual field search (scan speed: high). As a reason for such a problem, charge-up or the like is conceivable.

(b) The image is deformed compared with during the visual field search (scan speed: high). As a reason for such a problem, charge-up, damage to the specimen or the like is conceivable.

The novice user is often satisfied with an image that is actually not an optimum image, since he/she does not know an image obtained under the optimum observation condition. By displaying the assist buttons B122 as in this embodiment, frequently arising problems with the image are presented, and the user can notice such problems.

In the example shown in FIG. 15, as a result of the analysis on the image C51 by the operation program 31, the distribution is biased toward the high luminance side in the luminance distribution. Therefore, the operation program 31 is executed to display the assist button B122 indicated by reference numeral B122a. Moreover, as a result of the analysis on the image C51 by the operation program 31, the sharpness value is low. Therefore, the operation program 31 is executed to display the assist button B122 indicated by reference numeral B122b. Note that the operation program 31 stores, in the storage device 21, the assist buttons B122 corresponding to the combinations of the observation conditions, the image quality of the image and the operation steps. The operation program 31 is executed to display the assist buttons B122 on the application assist screen 202 by selecting the assist buttons B122 according to the information on the observation conditions, the image quality of the image and the operation steps.

Note that, as shown in FIG. 15, the operation program 31 may be configured to display a highlighted image B123, in which the problem described in each assist button B122 is highlighted, by highlighting the observation condition. For example, the operation program 31 is executed to display, on the assist button B122a, the highlighted image B123 having the luminance distribution extremely biased toward the high luminance side. Similarly, the operation program 31 is executed to display, on the assist button B122b, the highlighted image B123 having extremely lowered sharpness.

The highlighted image B123 may be an image obtained by simulation under an extreme observation condition. Alternatively, an image may be prepared by performing such simulation beforehand. Here, the simulation is performed under extreme conditions such that problems displayed on the assist buttons B122 occur.

Figure 16:
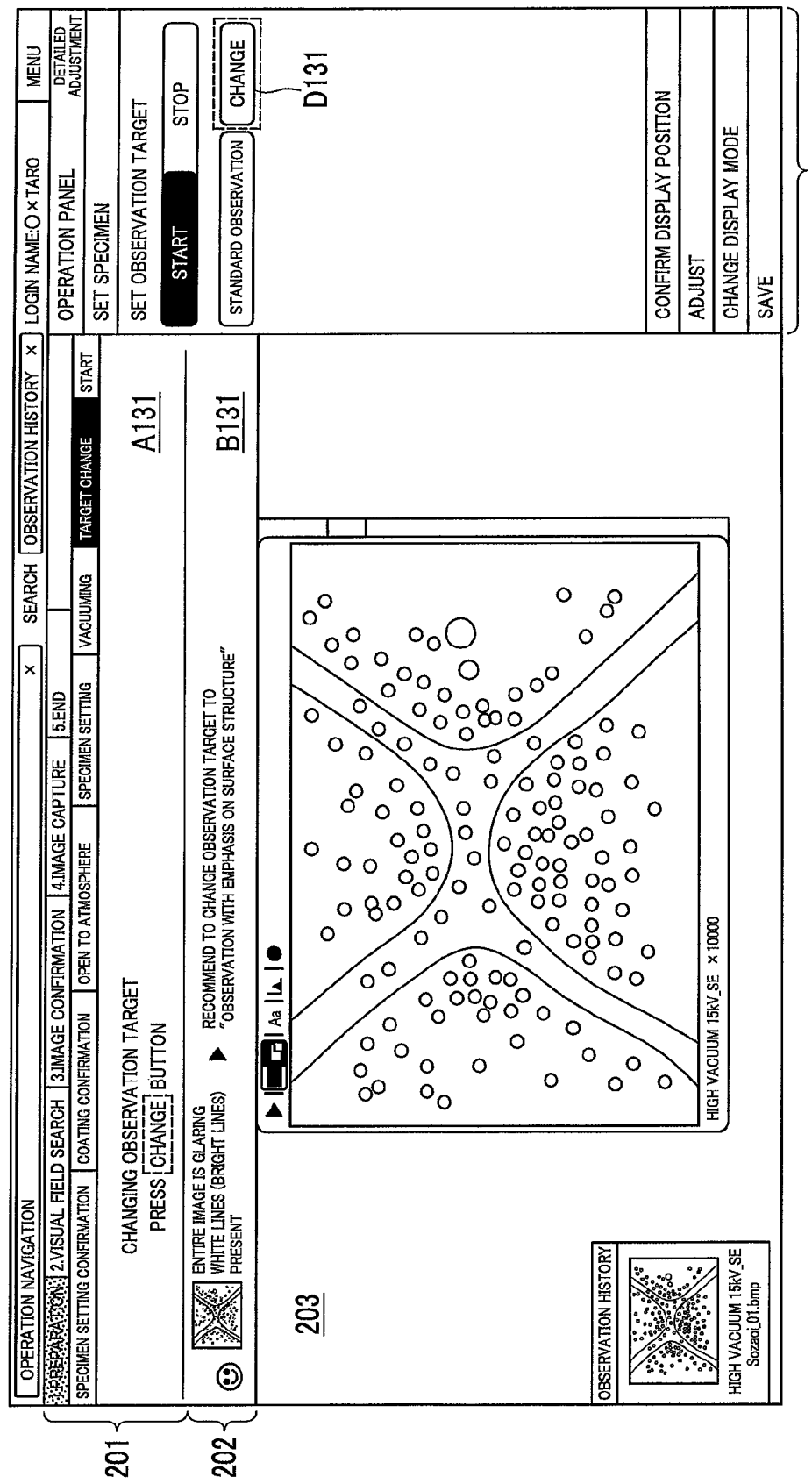
FIG. 16 is a diagram (Part 2) showing an example of the operation screen during image confirmation and adjustment and changing of observation conditions by the user.

Here, when the user presses the assist button B122a, the operation program 31 is executed to display display-contents shown in FIG. 16.

FIG. 16 is a diagram showing contents displayed during target change.

The user determines that the entire image is glaring and has white lines (bright lines) by looking at the image C51 shown in FIG. 15, and presses the assist button B122a. Then, in order to solve the problem described in the assist button B122a, the operation program 31 is executed to display, on the application assist screen 202, a solution screen B131 prompting to change the observation target to "observation with emphasis on surface structure". Similarly, in order to change the observation target, the operation program 31 is executed to display a message prompting to press a "change" button D131 on a screen A131 in the operation navigation screen 201. Here, the user is prompted to press the "change" button D131 rather than automatically shifting to the next screen by the operation program 31. Accordingly, the user can recognize the position of the "change" button D131, and thus the learning effect on the user can be improved.

Moreover, screen information associated with the assist buttons B122 shown in FIG. 15 is pre-stored in the storage device 21. When the screen information corresponding to the pressed assist button B122 is selected, the operation program 31 is executed to display the screens A131 and B131 shown in FIG. 16.

Note that the operation navigation screen 201 shown in FIG. 16 shows that the current step is "Target Change" of "1. Preparation".

The operation program 31 is executed to display the operation panel screen 204 according to the operation navigation screen 201. On the operation panel screen 204, the "change" button D131 is highlighted to prompt the user to change the observation target.

Figure 17:
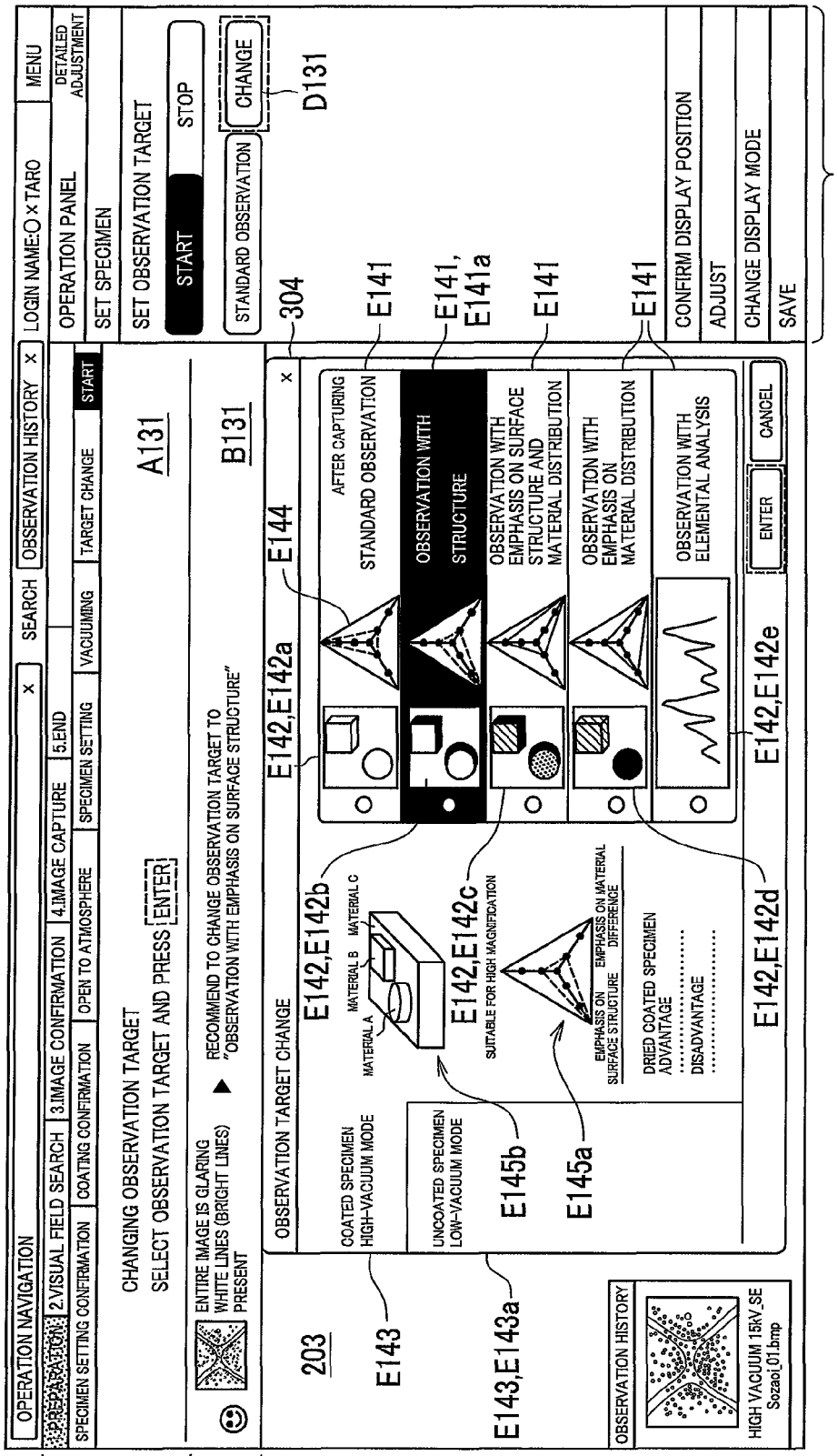
FIG. 17 is a diagram (Part 3) showing an example of the operation screen during image confirmation and adjustment and changing of observation conditions by the user.

When the user presses the "change" button D131 according to the contents described in the screen A131, the operation program 31 is executed to display the display-contents shown in FIG. 17 on the image display device 18.

Here, the solution screen B131 prompting to change the observation target to "observation with emphasis on surface structure" or the message prompting to press the "change" button D131 may be displayed in another window. For example, this another window displays some possible solutions to the problem described in the assist button B122. For each of items of such solutions, an unillustrated "search" button may be disposed. When the "search" button is pressed by the user, necessary information about the solutions may be displayed. Through such an operation, the user can acquire knowledge about the operation of the electron microscope 101. Moreover, a "solve" button is disposed for each of the items of the solutions, and pressing the button starts navigation to implement the solutions. In this process, a message prompting to press the "change" button D131 may be displayed on the screen A131 in the operation navigation screen 201.

The parameter setting values set by the user when operating the electron microscope 101 include accelerating voltage, working distance, excitation of condenser lens, pore size of objective movable diaphragm, degree of vacuum, detection signal and the like. However, it is difficult for the user to know what kind of image is obtained by setting what values as the parameter setting values. Moreover, the user has various observation targets, such as wishing to observe while maximizing the resolution, wishing to observe the surface and wishing to observe the material distribution. However, most novice users use the parameter setting values without knowing there are optimum parameter setting values according to the observation target. Moreover, most novice users conduct observation using the currently set parameter setting values without changing the parameter setting values even when the observation target is changed. However, such usage cannot fully derive the performance of the apparatus.

Therefore, in this embodiment, rather than the user setting the parameter setting values, optimum parameter setting values are automatically set according to the observation target (observation target change) selected by the user. Note that options of the observation target are the observation conditions often used by the user or wished to be used by the user. It is preferable that the number of conditions that can be recognized and selected by even a novice user is about five, including analysis. In this embodiment, "standard observation", "observation with emphasis on surface structure", "observation with emphasis on surface structure and material distribution", "observation with emphasis on material distribution" and "observation with elemental analysis" are set as the observation targets.

When there are six or more options, it is difficult for the novice user to recognize a difference between acquired images and to select an appropriate observation target. Note that the parameter setting values to be used differ between high-vacuum observation and low-vacuum observation. Thus, the five observation targets resulting in a clear difference in image are provided for both of the high-vacuum observation and low-vacuum observation.

Note that the number of the observation targets to be set may vary with the number of detectors 10 (FIG. 1), such as a secondary electron detector, a BSE (Back Scattered Electron) detector and an EDX (Energy Dispersive X-ray) device, or the kind of the detector 10 included.

FIG. 17 is a diagram showing contents displayed when the observation target is changed.

When the "change" button D131 shown in FIG. 16 is pressed, the observation target change screen 304 is displayed in front of the operation screen 200 as shown in FIG. 17. Here, since the configuration of the operation screen 200 is the same as that shown in FIG. 16, description thereof is omitted.

An observation target setting button E141 is displayed in the observation target change screen 304. In the observation target setting button E141, candidates of observation target change are described.

Moreover, on the left side of the observation target change screen 304, a legend E145a of a radar chart and a schematic diagram E145b of a simulated specimen for the highlighted image E142 are displayed. The legend E145a of the radar chart indicates legends of a radar chart (observation condition characteristic indicator) E144 displayed in each observation target setting button E141.

As shown in the legend E145a of the radar chart, the characteristics of the image are defined to have three axes, "suitable for high magnification", "emphasis on surface structure" and "emphasis on material difference". Each of the axes is represented using a three-point scale. The more toward the outside of the radar chart E144, the more significant the characteristics on each axis. When each of the axes is represented using a scale of four points or more, a more precise radar chart is realized.

"Suitable for high magnification" in the legend E145a of the radar chart indicates a degree of a high-resolution observation condition. For example, when the user conducts an observation at a magnification of several tens of thousands or more, the sharper the image, the more outward the item of "suitable for high magnification" in the radar chart E144 is marked. The parameter setting values for the electron microscope 101 include accelerating voltage, working distance, excitation of condenser lens, pore size of objective movable diaphragm, degree of vacuum, detection signal and the like. In addition to those parameter setting values, conditions for observation at high magnification include increasing the accelerating voltage, increasing the excitation of the condenser lens, reducing the pore size of the objective movable diaphragm, reducing the working distance, increasing the degree of vacuum, and using secondary electrons as the detection signal.

"Emphasis on surface structure" in the legend E145a of the radar chart indicates a degree of conditions for enabling observation in three dimensions by emphasizing an uneven structure on the specimen surface. The observation condition for emphasizing the uneven structure on the specimen surface mainly includes lowering the accelerating voltage and using secondary electrons as the detection signal.

"Emphasis on material difference" in the legend E145a of the radar chart indicates a degree of conditions for emphasizing material difference in a specimen having different materials mixed therein. The observation condition for emphasizing the material difference mainly includes using backscattered electrons as the detection signal. As to the backscattered electrons, an element having the larger atomic number has higher reflectivity. Thus, generation of many signals leads to a brighter image. The material difference can be represented by a difference in contrast.

As described above, "suitable for high magnification", "emphasis on surface structure" and "emphasis on material difference" are incompatible parameter setting values. Therefore, for a certain observation target, it is generally not the case that all the parameter setting values in the radar chart E144 have the highest scores. More specifically, if a certain parameter setting value is good, the other parameter setting values become relatively poor. Therefore, by showing the characteristics of the observation target with the radar chart as in this embodiment, the characteristics (advantages and disadvantages) of the observation target can be visually easily recognized.

Note that four, five or more axes may be provided in the radar chart by adding items such as "charge-up reduction (suppression)" and "beam damage reduction (suppression)".

"Charge-up reduction (suppression)" indicates an observation condition under which charge-up can be reduced by narrowing the primary electron beam 2 (FIG. 1) and thus reducing irradiation current. The observation condition for reducing (suppressing) the charge-up mainly include lowering the accelerating voltage, increasing the excitation of the condenser lens, using the backscattered electrons as the detection signal, and lowering the degree of vacuum. As an image acquisition method in this case, more than one image is acquired by quick scan and integration is performed to form an image by overlapping the acquired images.

"Beam damage reduction (suppression)" indicates an observation condition under which beam damage to a heat-sensitive specimen can be reduced by narrowing the primary electron beam 2 and reducing the irradiation current. The observation condition for reducing (suppressing) the beam damage mainly includes lowering the accelerating voltage and increasing the excitation of the condenser lens.

Here, the observation condition characteristic indicator is not limited to the radar chart. For example, the items of "suitable for high magnification", "emphasis on surface structure" and "emphasis on material difference" may be expressed by using numbers such as percentages, using graphs such as bar graphs, using words such as "good", "moderate" and "bad", or using symbols such as ⊚, ○ and △.

The schematic diagram E145b of the simulated specimen is a schematic diagram of a simulated specimen obtained by combining materials different in shape and quality. The schematic diagram allows characteristics of an observation target image to be recognized at a glance in the highlighted image E142 to be described later. Although various factors are mixed in an observation image of an actual specimen, the display of the schematic diagram E145b of the simulated specimen facilitates understanding of the meaning of the highlighted image E142.

In the schematic diagram E145b of the simulated specimen, for easier differentiation between shapes, three materials different in shape are used, i.e., a columnar material A and a prismatic material B are placed on a material C that is a substrate. Here, the material A may have a hemispherical shape rather than the columnar shape. Also, the material B may have a square truncated pyramid shape rather than the prismatic shape. Moreover, a substrate surface of the material C may have unevenness, rather than being flat and smooth, so that an uneven structure can be observed in an observation with emphasis on the surface structure.

As to the material quality, when backscattered electrons are used as the detection signal, the three materials have different elements so as to clarify a difference in black and white contrast, and two of the elements are a light element and a heavy element. Specifically, in this embodiment, it is assumed that the material A is gold that is a heavy element, the material B is aluminum, and the material C is carbon or the like that is a light element. Thus, on the observation target setting button E141 in "observation with emphasis on material distribution", a highlighted image E142 can be displayed, in which the materials are displayed in "black", "intermediate color, i.e., gray" and "white", respectively. Note that, also as for display colors of materials in the schematic diagram E145b of the simulated specimen, materials A, B and C may be displayed in gold, gray and black, respectively, or the like, so that the elements can be easily recognized.

On the observation target change screen 304, five observation target setting buttons E141 are arranged from top to bottom, i.e., "standard observation", "observation with emphasis on surface structure", "observation with emphasis on surface structure and material distribution", "observation with emphasis on material distribution" and "observation with elemental analysis" are arranged in this order from top. Note that, although FIG. 17 shows the observation target of high-vacuum observation as an example, the same goes for the observation target of low-vacuum observation. Up to five observation targets are arranged from top to bottom.

The top observation target "standard observation" is a default observation target and has an observation condition under which an uneven structure on the specimen surface can be obtained with sharpness even at a high magnification, which is the basis of SEM (Scanning Electron Microscope) observation. In other words, the "standard observation" has conditions under which even a novice user who does not know what conditions are suitable for a conductive specimen can easily obtain satisfactory data without hesitation. Through an experience of easy capturing by using such an observation condition, the novice user becomes highly motivated to use the apparatus, leading to an expectation that more aspirations are cultivated in the user. The observation condition under which an uneven structure on the specimen surface can be obtained with sharpness even at a high magnification is a condition that allows high resolution. By using such an observation condition, the user can relatively easily acquire an image of high magnification, e.g., a hundred-thousand-fold image with no regard to the magnification. Specific parameter setting values are as follows, for example: the accelerating voltage is 15 kV, the working distance is 5 mm, excitation of the condenser lens is strong, the pore size of the objective movable diaphragm is small, the degree of vacuum is high and secondary electrons are used as the detection signal. Here, important parameter setting values are the accelerating voltage and the detection signal. Theoretically, the higher the accelerating voltage, the higher the resolution.

The secondary electrons have weak energy of several eV and can be generated only from about 10 nm from the specimen surface. Thus, by using the secondary electrons as the detection signal, an image on which the uneven structure on the surface is more reflected can be obtained. A scanning electron microscope can normally perform observation with an accelerating voltage of up to 30 kV. However, if the accelerating voltage is too high, the primary electron beam 2 enters too deep into an actual specimen. As a result, internal information is mixed in the secondary electrons emitted by the irradiation of the electron beam. Therefore, it becomes difficult to obtain an image on which the uneven structure on the specimen surface is reflected. For this reason, in the radar chart E144 of "standard observation" for detecting the secondary electrons at the accelerating voltage of 15 kV, "suitable for high magnification" by the observation at the accelerating voltage of 15 kV ranks in the highest level. Meanwhile, "emphasis on surface structure" ranks in the lowest level since the accelerating voltage is 15 kV, and "emphasis on material difference" ranks in the lowest level since the secondary electrons are used as the detection signal. Note that, when a four-point scale radar chart is used, for example, "suitable for high magnification" ranks in the highest level, "emphasis on surface structure" ranks in the second level from bottom, and "emphasis on material difference" ranks in the lowest level.

The second top observation target "observation with emphasis on surface structure" has an observation condition under which minute unevenness on the specimen surface, which is difficult to observe in "standard observation", can be displayed more in three dimensions. Specific parameter setting values are as follows, for example: the accelerating voltage is 5 kV, the working distance is 5 mm, excitation of the condenser lens is strong, the pore size of the objective movable diaphragm is small, the degree of vacuum is high and secondary electrons are used as the detection signal. "Observation with emphasis on surface structure" is different from "standard observation" in that the accelerating voltage is changed from 15 kV to 5 kV. When the accelerating voltage is changed from 15 kV to 5 kV, the resolution is reduced and the magnification to obtain a sharp image is set to about 50000 times. Therefore, "suitable for high magnification" in the radar chart E144 (legend E145a) is lowered compared with "standard observation" and comes in the lowest level.

Moreover, since the primary electron beam 2 enters less deeply into the specimen, an image with more emphasis on the uneven structure on the specimen surface is obtained. In this event, "emphasis on surface structure" comes in the highest level in the radar chart E144 in "observation with emphasis on surface structure". Meanwhile, "emphasis on material difference" stays in the lowest level since the detection signal is the same. Note that, when a four-point scale radar chart is used, for example, "suitable for high magnification" comes in the second level from bottom, "emphasis on surface structure" comes in the highest level, and "emphasis on material difference" comes in the lowest level. Moreover, only for this observation target, a method in which charge-up is less likely to occur is set. For example, integration or the like is used to form an image by overlapping images acquired by quick scan.

The observation target "observation with emphasis on surface structure and material distribution" in the third place from top has an observation condition under which, although the resolution is reduced compared with the image obtained in "observation with emphasis on material distribution", material difference can be displayed by contrast in brightness/darkness or the like. Moreover, "observation with emphasis on surface structure and material distribution" has an observation condition under which minute unevenness on the specimen surface can be displayed more in three dimensions. Specific parameter setting values are as follows, for example: the accelerating voltage is 5 kV, the working distance is 5 mm, excitation of the condenser lens is intermediate, the pore size of the objective movable diaphragm is small, the degree of vacuum is high and backscattered electrons are used as the detection signal. "Observation with emphasis on surface structure and material distribution" is different from "standard observation" in that the accelerating voltage is changed from 15 kV to 5 kV, the backscattered electrons are used as the detection signal, and the excitation of the condenser lens is slightly reduced. By changing the accelerating voltage from 15 kV to 5 kV, an image with more emphasis on the uneven structure on the specimen surface is obtained even though the resolution is reduced.

The observation using the backscattered electrons enables a material difference to be expressed by a difference in contrast. Thus, "suitable for high magnification" comes in the lowest level in the radar chart E144 for "observation with emphasis on surface structure and material distribution". Meanwhile, "emphasis on surface structure" comes in the second level from top, which is lower than the case using the second electrons but is relatively high, and "emphasis on material difference" comes in the highest level. Note that, when a four-point scale radar chart is used, for example, "suitable for high magnification" comes in the second level from bottom, "emphasis on surface structure" comes in the second level from top, and "emphasis on material difference" comes in the highest level.

The observation target "observation with emphasis on material distribution" in the fourth place from top has an observation condition under which material difference can be displayed by contrast in brightness/darkness or the like, in a specimen made of different materials, such as a composite material and a foreign material. Specific parameter setting values are as follows, for example: the accelerating voltage is 15 kV, the working distance is 5 mm, excitation of the condenser lens is intermediate, the pore size of the objective movable diaphragm is small, the degree of vacuum is high and backscattered electrons are used as the detection signal. "Observation with emphasis on material distribution" is different from "standard observation" in that the backscattered electrons are used as the detection signal, the excitation of the condenser lens is slightly reduced to increase the irradiation current. The backscattered electrons are characterized in that the material difference can be expressed by a difference in contrast. The heavier the material is, the higher the reflectivity is. Since more signals are generated, the images become brighter. Accordingly, the material difference can be displayed by the contrast in brightness/darkness or the like.

Since the backscattered electrons have approximately the same energy as that of incident electrons, backscattered electrons generated inside the specimen are also detected. For this reason, internal information is mixed compared with the secondary electrons, leading to poor resolution. Therefore, in the radar chart E144 for "observation with emphasis on material distribution", "suitable for high magnification" comes in the second highest level, which is lower than "standard observation". Meanwhile, "emphasis on surface structure" comes in the lowest level, and "emphasis on material difference" comes in the highest level. Note that, when a four-point scale radar chart is used, for example, "suitable for high magnification" comes in the second level from top, "emphasis on surface structure" comes in the lowest level, and "emphasis on material difference" comes in the highest level.

The observation target "observation with elemental analysis" at the bottom has an observation condition for conducting EDX analysis by increasing the size of the primary electron beam 2 and increasing the irradiation current. In "observation with elemental analysis", material difference can be displayed by the contrast in brightness/darkness or the like or the like. The elemental analysis can be conducted by performing operations on the EDX device side after searching for a spot for EDX analysis and adjusting focus and the like under the observation condition described above. Specific parameter setting values are as follows, for example: the accelerating voltage is 15 kV, the working distance is 10 mm, excitation of the condenser lens is weak, the pore size of the objective movable diaphragm is small, the degree of vacuum is high and backscattered electrons are used as the detection signal. "Observation with elemental analysis" is different from "standard observation" in that the excitation of the condenser lens is reduced to be very weak and the irradiation current is increased, in order to increase the count of X-rays to be generated from the specimen. Moreover, since the elemental analysis is performed by reflecting material difference, the backscattered electrons are used as the detection signal, and the working distance is changed to 10 mm to efficiently receive X-rays generated from the specimen. However, the secondary electrons may be used as the detection signal in such a case as where no backscattered electron detector is mounted. Although FIG. 17 shows only spectrum display, a radar chart E144 or a highlighted image E142 may be displayed as in the case of the other observation targets. In the case of displaying a radar chart, although a radar chart E144 is similar to that for "observation with emphasis on material distribution", "suitable for high magnification" is slightly lowered compared with "observation with emphasis on material distribution".

When a four-point scale radar chart is used, for example, "suitable for high magnification" comes in the second level from bottom, "emphasis on surface structure" comes in the lowest level, and "emphasis on material difference" comes in the highest level.

Note that buttons for displaying detailed observation conditions are provided for five observation target setting buttons E141, respectively. When any of these buttons is pressed, characteristics and specific parameter setting values of the corresponding observation target are displayed. The parameter setting values in this case include the accelerating voltage, working distance, condenser lens (spot intensity), objective movable diaphragm, detection signal, degree of vacuum, image retrieval method and the like. This can meet the needs of the user to know specific parameter setting values of the observation condition.

Such information of the observation target setting buttons E141 is pre-stored in the storage device 21 in association with the assist buttons B122 shown in FIG. 15. The operation program 31 is executed to select the observation target setting button E141 corresponding to the pressed assist button B122, and displays the selected button on the image display device 18.

Note that the operation program 31 may be configured to refer to an operation history and hide a predetermined observation target setting button E141 (e.g., the observation target setting button E141 once pressed) based on the operation history.

When the user presses one of the observation target setting buttons E141, the pressed observation target setting button E141 is displayed inverted (reference numeral E141a). Then, the operation program 31 is executed to set the observation condition according to the contents described in the pressed observation target setting button E141. In the example of reference numeral E141a, the observation condition of "emphasis on surface structure" are set. Note that the observation target setting button E141 to be displayed may vary with the state of the specimen 9, such as "coating" and "non-coating". The state of the specimen 9 is inputted by the user in the step shown in FIG. 4, for example.

The operation program 31 is executed to set the observation condition by referring to an observation condition setting table 41 (FIG. 18) stored in the storage device 21.

Note that, in the operation step shown in FIG. 17, the observation target change screen 304 may display information about the specimen 9, such as "coating" and "non-coating", and the like.

Moreover, as shown in FIG. 17, the operation program 31 may be executed to display explanation tabs E143 for "coated specimen/high vacuum mode" and "uncoated specimen/low vacuum mode" on the observation target change screen 304. For example, when the user selects the explanation tab E143a for "uncoated specimen/low vacuum mode", the operation program 31 is executed to display information on explanation of an uncoated specimen, explanation of a specimen that is preferably not coated, advantages and disadvantages of not performing coating, explanation of a method for setting a low-vacuum mode, and the like on the observation target change screen 304.

Furthermore, as shown in FIG. 17, parameter setting values under the observation condition corresponding to the observation target setting button E141 may be displayed in a radar chart E144 within the observation target setting button E141. In this way, the user can easily confirm the characteristics of the observation condition in each of the observation target setting buttons E141. Moreover, in this embodiment, a radar chart E144 for another observation target setting button E141 can also be viewed in the same screen, as shown in FIG. 17. In this way, each of the observation targets can be easily compared visually, and the characteristics (advantages and disadvantages) of each observation target can be easily grasped visually. As a result, even a novice user can easily select an appropriate observation target. Moreover, in this embodiment, by pressing the target select button E142, the legend E145a of the radar chart is also changed, as shown in FIG. 17. In FIG. 17, since the observation target setting button for "observation with emphasis on surface structure and material distribution" are set, the legend E145a of the radar chart also indicates the characteristics of "observation with emphasis on surface structure and material distribution". If another observation target setting button E141 is set, the display of the legend E145a of the radar chart is also switched. Thus, the user can visually and easily recognize a change in characteristics of the observation condition with a change in observation target.

FIG. 18 is a diagram showing the observation condition setting table according to this embodiment.

Each record in the observation condition setting table 41 shown in FIG. 18 corresponds to each of the observation target setting buttons E141, and is the combination of parameter setting values (accelerating voltage, detection signal and Scan method) for each observation target. As shown in FIG. 18, observation targets such as "unevenness/small/visibility", "unevenness/large/visibility" and "composition information/visibility" are evaluated using ⊚, ○, Δ, x and the like in the observation condition setting table 41. Note that the evaluation method is not limited to ⊚, ○, Δ, x as shown in FIG. 18, but scores and the like may be used for evaluation. The observation target setting buttons E141 (FIG. 17) are associated with the observation targets based on the evaluation. Here, as described above, the observation condition is the combination of parameter setting values, and the observation target is the influence of the observation condition on images, such as visibility of unevenness.

Here, while eleven observation targets are set in FIG. 18, there are five observation target setting buttons E141 in FIG. 17. A person who sets the observation target may set the observation target setting buttons E141 by selecting five observation targets suitable for a novice user among the observation targets set in FIG. 18.

When any of the observation target setting buttons E141 shown in FIG. 17 is pressed, the operation program 31 is executed to set observation condition using the parameter setting values in the record in the observation condition setting table 41 corresponding to the pressed observation target setting button E141. For example, the operation program 31 is executed to set observation condition using the parameter setting values in the record No. 1 with good visibility of small unevenness and large unevenness. The individual values in the observation condition setting table 41 shown in FIG. 18 are those previously adjusted so that a minimum-level image can be taken. Note that the parameter setting values in the observation condition setting table 41 include current, working distance, magnification and the like, besides accelerating voltage, detection signal and Scan method. Here, in FIG. 18, SE (Secondary Electron) represents secondary electrons and BSE represents backscattered electrons. Note that each record in the observation condition setting table 41 is associated with each of the observation target setting buttons E141 based on predetermined correspondence information (identification information and the like). The identification information includes No in FIG. 18 and the like, for example.

One of the records in the observation condition setting table 41 is set as a default observation condition. Thus, an observation condition corresponding to an adjustment image can be set without operation by the user. More specifically, the user can substantially perform capturing only by automatic operation, and can always easily obtain an image of a certain level. Thus, even a novice user can easily perform capturing. Through an experience of easy capturing, the novice user becomes highly motivated to use the apparatus, leading to cultivation of more aspirations in the user.

Moreover, a highlighted image E142 is displayed in the observation target setting button E141.

The highlighted image E142 is an image in which comparison with a standard image that can be observed under the default observation condition "standard observation" is highlighted, and is also an image on which parameters shown in the radar chart are reflected.

The highlighted image E142 associated with the observation target setting button E141 is pre-stored in the storage device 21. In selecting or displaying the observation target setting button E141, the operation program 31 is executed to acquire or display the highlighted image E142 associated with the observation target setting button E141, thereby displaying the highlighted image E142.

By displaying the highlighted image E142 as described above, the user can visually recognize what kind of effect can be achieved by selecting the corresponding observation target setting button E141. In Patent Documents 1 and 2, since the user compares raw images, it is difficult for a novice user to recognize a difference in image caused by a difference between observation conditions. Meanwhile, by displaying the highlighted image E142 as in this embodiment, even a novice user can easily recognize the effect of selecting the observation target setting button E141.

Here, as a highlighted image E142a, a standard image is displayed so as to show that the observation performed is standard observation. In a highlighted image E142b, shades are emphasized so as to highlight the surface structure. In a highlighted image E142c, shades are emphasized so as to show a difference between the surface structure and material distribution, and different colors and the like are assigned to respective materials. In a highlighted image E142d, different colors and the like are assigned to respective materials so as to show a difference in material distribution. A highlighted image E142e is a graphic image so as to represent elemental analysis.

Note that, as described above, a radar chart E144 and a highlighted image E142 may be displayed in "observation with elemental analysis" as in the case of the other observation targets. For example, a graphic display (spectrum display) that represents elemental analysis may be overlapped with a highlighted image of a simulated specimen, which is similar to those for the other observation targets.

In the highlighted image E142, the state of an image that is taken for the corresponding observation target (observation condition) is emphasized most. To be more specific, as the highlighted image E142, an image in which the state of the image is visually emphasized or deformed is used. As shown in FIG. 17, it is preferable and effective to use, as the highlighted image E142, a symbolic block, such as a cuboid and a column, or a simplified graph.

Note that the highlighted images E142 described above are an example, and any other highlighted image may be displayed. Moreover, the highlighted image E142 may be displayed near the observation target setting button E141 rather than on the observation target setting button E141 as shown in FIG. 17.

Moreover, the operation program 31 may be configured to display information such as "after capturing" on the observation target setting button E141, for which capturing has already been performed, by referring to the operation history. Thus, the user can easily select the observation target for which capturing is yet to be performed.

Figure 19:
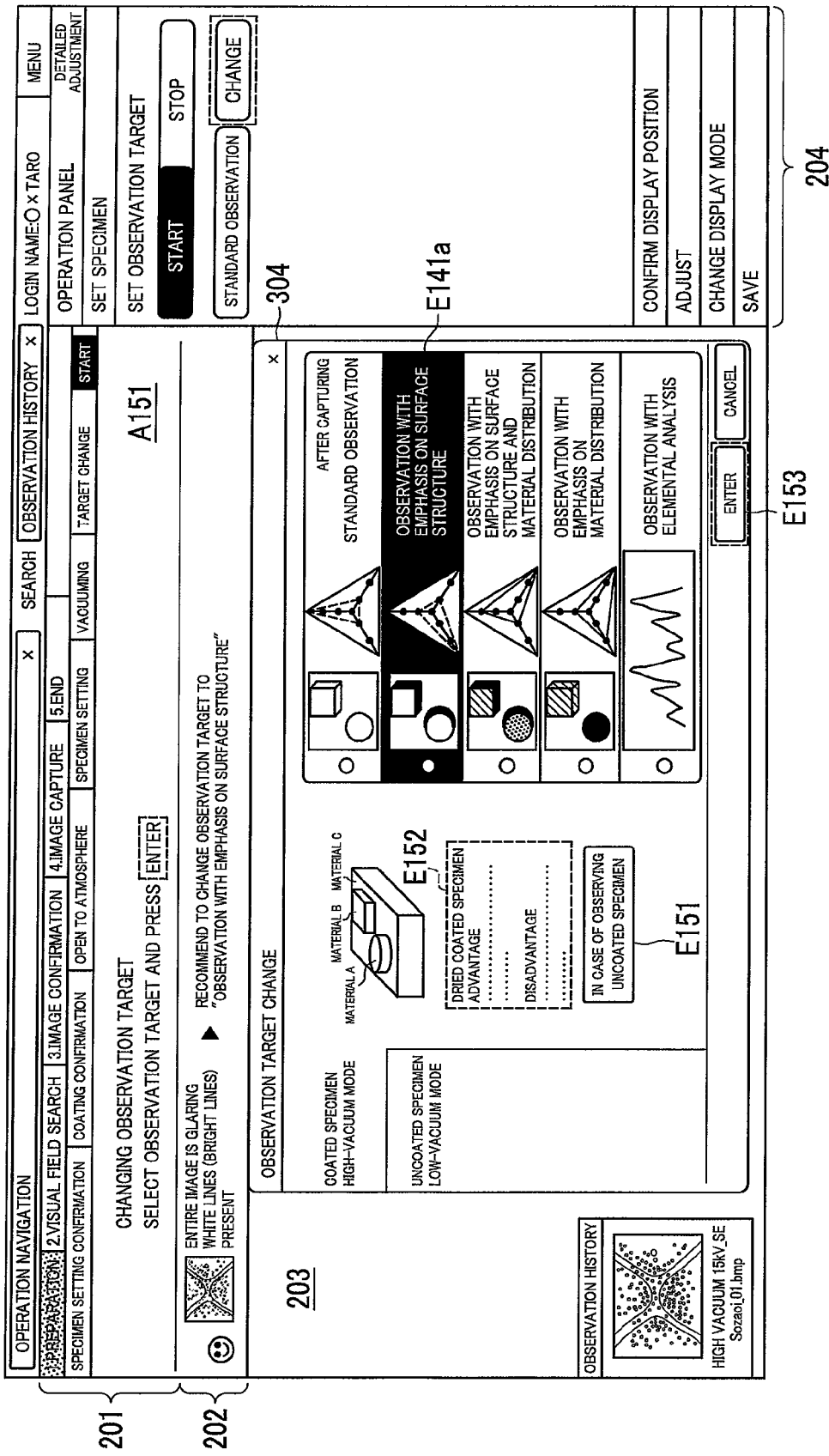
FIG. 19 is a diagram (Part 4) showing an example of the operation screen during image confirmation and adjustment and changing of observation conditions by the user.

FIG. 19 is a diagram showing contents displayed immediately after the observation target setting button E141*a* shown in FIG. 17 is pressed.

When the observation target setting button E141*a* is pressed, a message prompting to press an "enter" button E153 is displayed on a screen A151 in the operation navigation screen 201.

Then, a special setting button E151 may be displayed on the observation target change screen 304 displayed in front of the operation screen 200.

In the example shown in FIG. 19, the special setting button E151 is displayed. The special setting button E151 is a button for a setting that is not essential but special (special setting).

When the user presses the special setting button E151, the operation program 31 is executed to refer to the storage device 21. Then, the operation program 31 is executed to acquire special setting information associated with the special setting button E151. The operation program 31 is also executed to display the acquired special setting information in a special information display region E152 on the observation target change screen 304.

In the special information display region E152, information about the special setting is displayed. In the example shown in FIG. 19, contents regarding coating are displayed as the special setting. In the example shown in FIG. 19, there is a description on the special setting button E151 that setting for coating can be performed. When the user presses the special setting button E151, the operation program 31 is executed to display, in the special information display region E152, information about advantages and disadvantages in observation when coating is performed, about the specimen 9 suitable for coating, and the like. Furthermore, the operation program 31 may be executed to display, in the special information display region E152, a method for observing an uncoated specimen 9 (more specifically, an operation procedure to select the degree of vacuum for shift to the low-vacuum observation) and the like. Moreover, together with the information about coating, information about a coating method, such as ion plating and vacuum deposition, may be displayed.

As described above, by displaying the special setting button E151 and the special information display region E152, the user can notice observation in special setting.

The special setting button E151 may be displayed in every observation target change screen 304. Alternatively, when a specific observation target setting button E141 (FIG. 17) is pressed, the operation program 31 may be executed to display the special setting button E151 stored in the storage device 21 in association with the observation target setting button E141.

Then, when the user presses the "enter" button E153 on the observation target change screen 304 in accordance with the message displayed in the screen A151 on the operation navigation screen 201, the operation program 31 is executed to refer to the observation condition setting table 41. Subsequently, the operation program 31 is executed to set, in the circuits 11 to 17 (FIG. 1), parameter setting values of a record corresponding to the pressed observation target setting button E141 as an observation condition.

Note that the operation program 31 is executed to store the operation history thus far in the storage device 21 as needed.

In the following FIGS. 20 to 37, as to the same operation screen 200 as those shown in FIGS. 4 to 19, detailed description thereof is omitted as appropriate, and only differences from FIGS. 4 to 19 are described.

Figure 20:
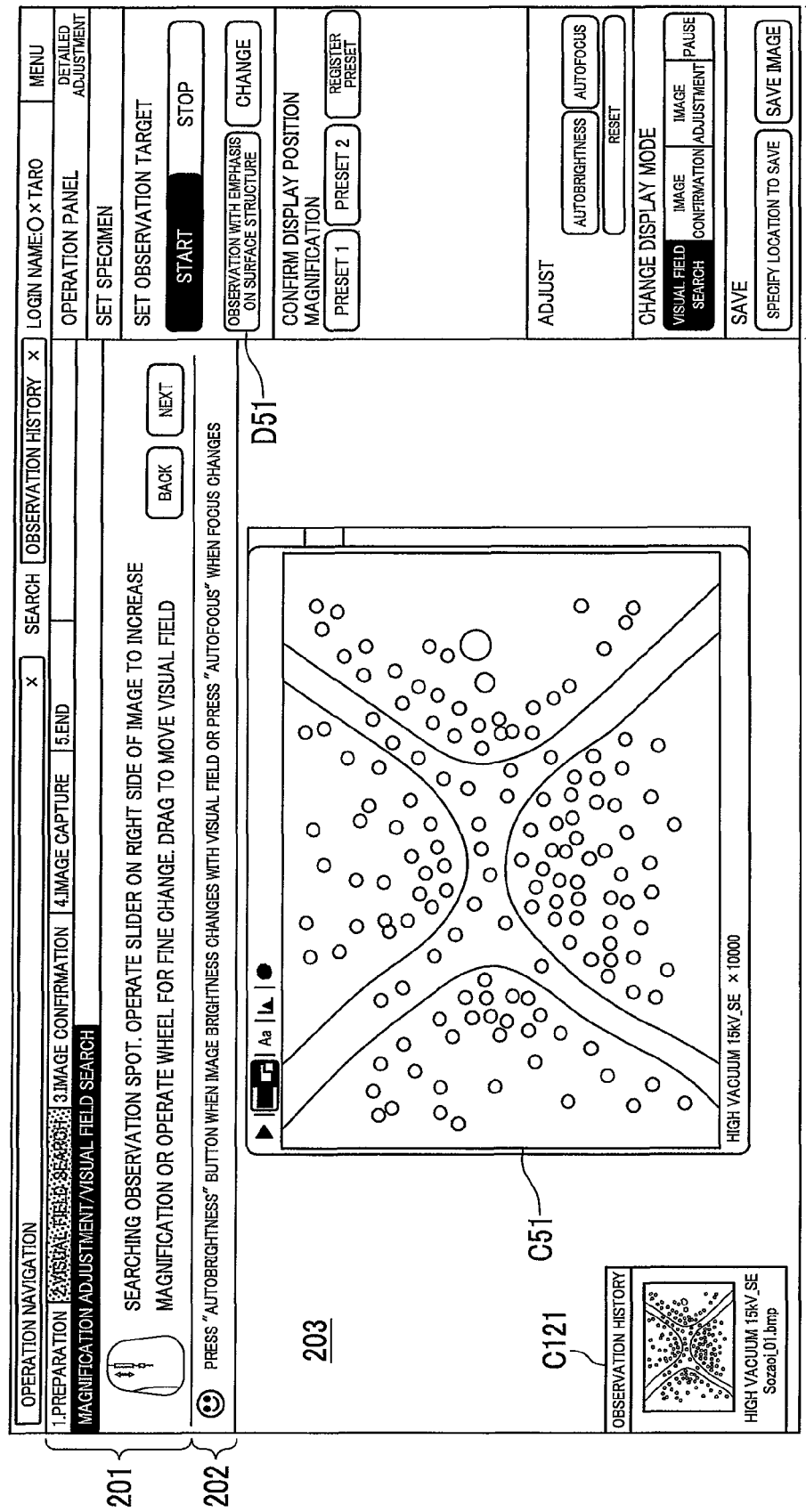
FIG. 20 is a diagram (Part 5) showing an example of the operation screen during image confirmation and adjustment and changing of observation conditions by the user.

FIG. 20 is a diagram showing contents displayed immediately after the "enter" button E153 is pressed in FIG. 19. Note that, when the user presses the "enter" button E153 in FIG. 19, the operation program 31 is executed to return the processing again back to the visual field search and magnification adjustment (S103 in FIG. 2), and the computer 19 acquires an image under the selected observation target (observation condition).

Since FIG. 20 has the same screen configuration as that shown in FIG. 7, description of each screen configuration is omitted. FIG. 20 is different from FIG. 7 in that the image C51 displayed in the image display screen 203 stays the same as that shown in FIG. 16 and in that the observation history C121 is displayed in the image display screen 203.

In FIG. 20, the user performs the magnification adjustment and visual field search in the same manner as FIG. 7.

Here, when the user sets a magnification that cannot be set (a magnification not less than or not more than a predetermined magnification), the operation program 31 may is executed to display a warning on the image display device 18.

Along with the changed observation target, the "current observation target" display button D51 is changed from "standard observation" thus far (FIG. 7) to "observation with emphasis on surface structure" in the operation panel screen 204.

Figure 21:
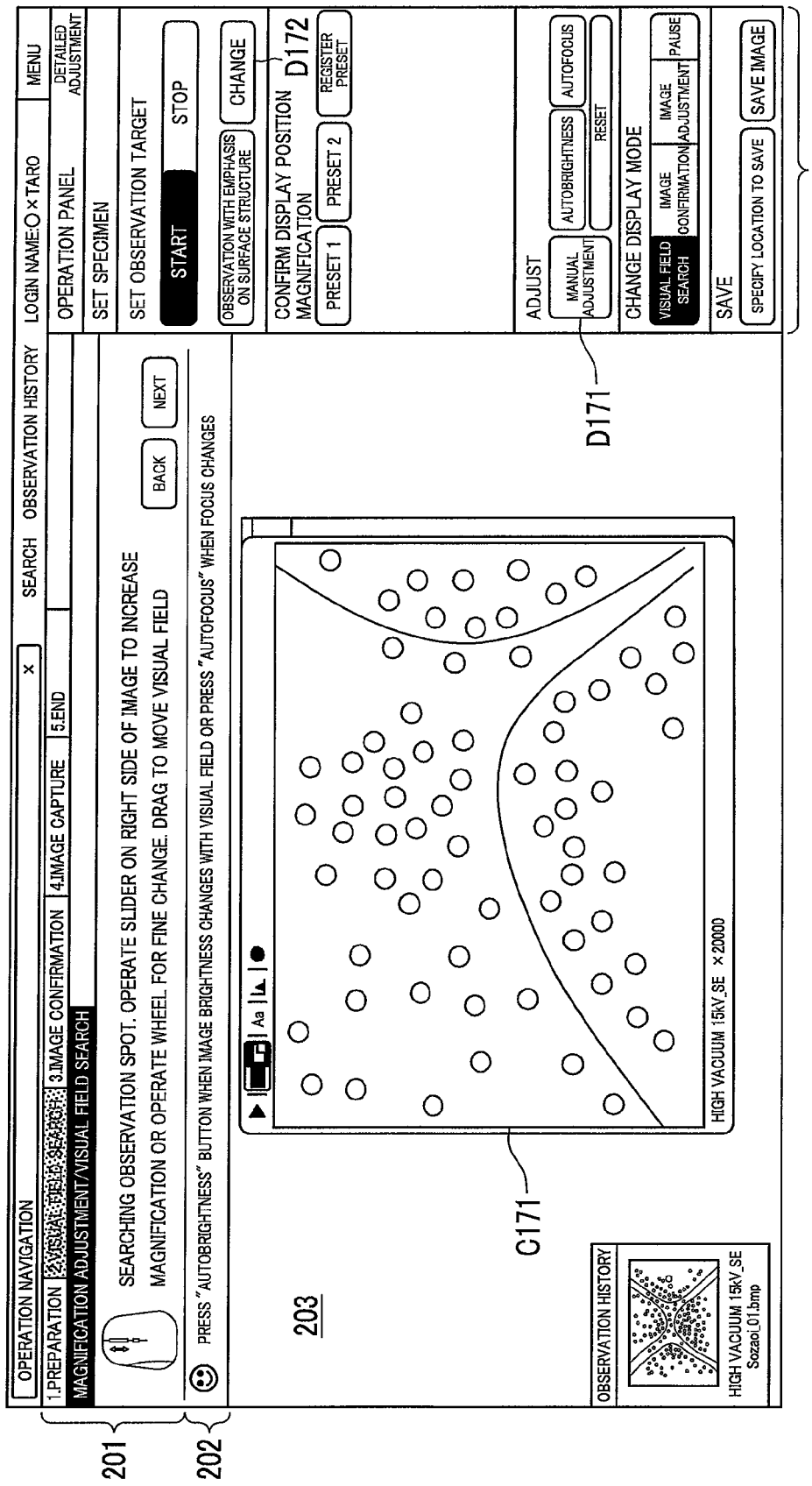
FIG. 21 is a diagram (Part 6) showing an example of the operation screen during image confirmation and adjustment and changing of observation conditions by the user.

FIG. 21 is a diagram showing contents displayed immediately after the magnification adjustment and visual field search are performed in FIG. 20.

FIG. 21 shows a state where the magnification is increased (e.g., by 20000 times) as a result of the magnification adjustment and visual field search in FIG. 20.

The operation screen 200 shown in FIG. 21 is the same as that shown in FIG. 20 except that an image C171 in the increased magnification state is displayed in the image display screen 203 and that a "manual adjustment" button D171 is displayed in the operation panel screen 204.

Here, the "manual adjustment" is to manually, rather than automatically, adjust brightness, contrast, focus and the like as described later.

When the "manual adjustment" button D171 is pressed, a manual brightness adjustment button, a manual contrast adjustment button, a focus button (e.g., reference numeral C223 in FIG. 27), a focus X button (e.g., reference numeral C251 in FIG. 29), a focus Y button (e.g., reference numeral C271 in FIG. 31) and the like are displayed. The "manual adjustment" button D171, the focus button, the focus X button and the focus Y button are buttons that can be displayed when the magnification becomes a predetermined magnification or more, and thus cannot be displayed when the magnification is not more than the predetermined magnification. Note that, when the "manual adjustment" button D171 is pressed, all of the manual brightness adjustment button, manual contrast adjustment button, focus button, focus X button, focus Y button may be displayed if the magnification is not less than the predetermined magnification. On the other hand, all of those buttons may be hidden if the magnification is less than the predetermined magnification.

Here, the "manual adjustment" button D171 is displayed when the magnification is not less than the predetermined magnification. Meanwhile, image shift may be adopted as means for moving the visual field if the magnification is not less than the predetermined magnification. On the other hand, stage movement is adopted as the means for moving the visual field if the magnification is not more than the predetermined magnification.

As described above, by setting specific operation items based on predetermined conditions, unnecessary operations can be prevented to reduce errors.

Note that a magnification adjustment range may be limited according to the observation target. In such a case, i.e., when a desired magnification cannot be obtained for the current observation target, the user may change the observation target by pressing the observation target change button D172 on the operation panel screen 204.

Figure 22:
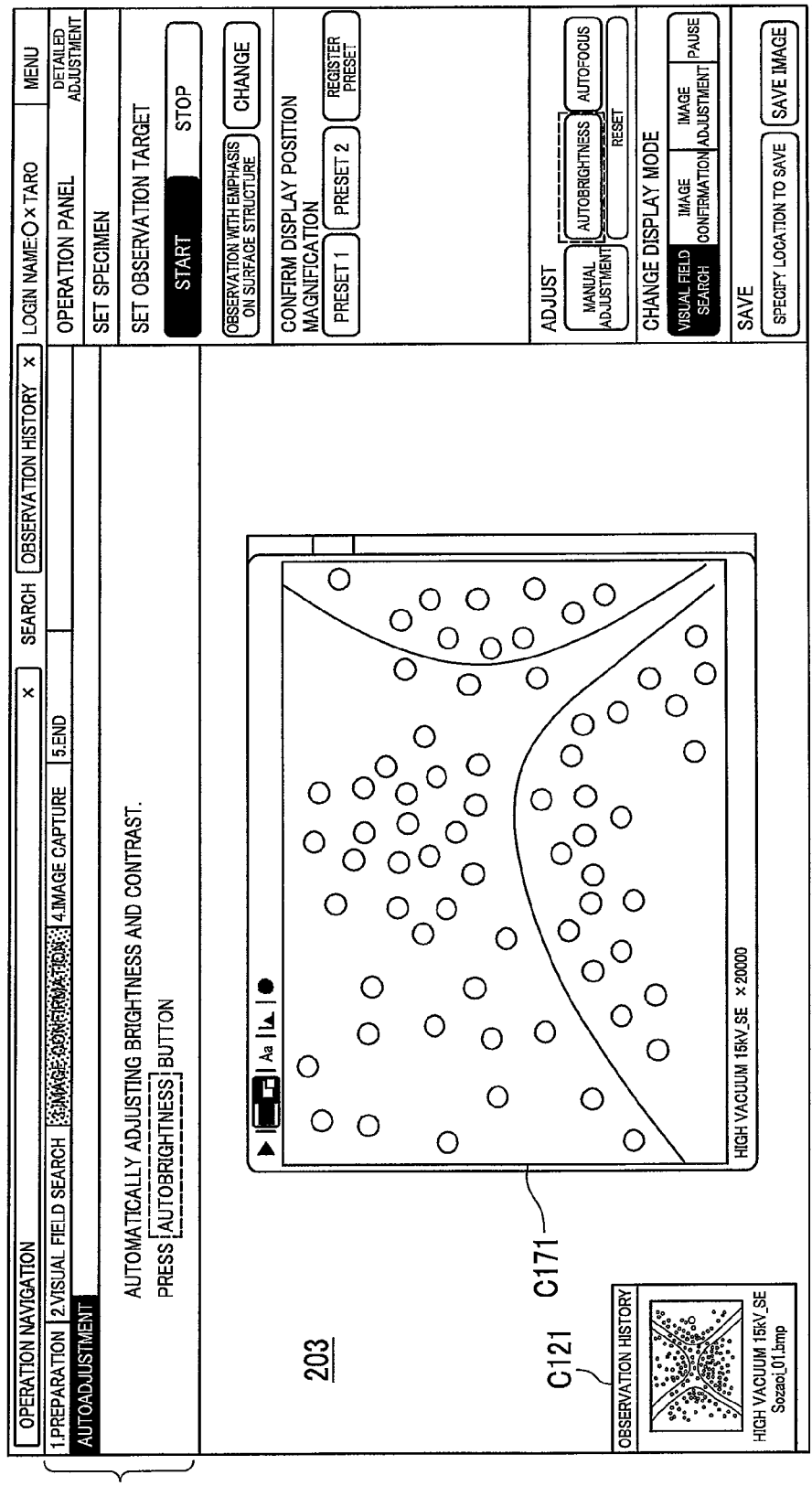
FIG. 22 is a diagram (Part 7) showing an example of the operation screen during image confirmation and adjustment and changing of observation conditions by the user.

FIG. 22 is a diagram showing contents displayed in autoadjustment.

FIG. 22 is basically the same as FIG. 8 except that the image C171 with increased magnification, the observation history C121 and the "manual adjustment" button D171 (FIG. 21) are displayed in the image display screen 203, and thus description thereof is omitted.

(S104)

Figure 23:
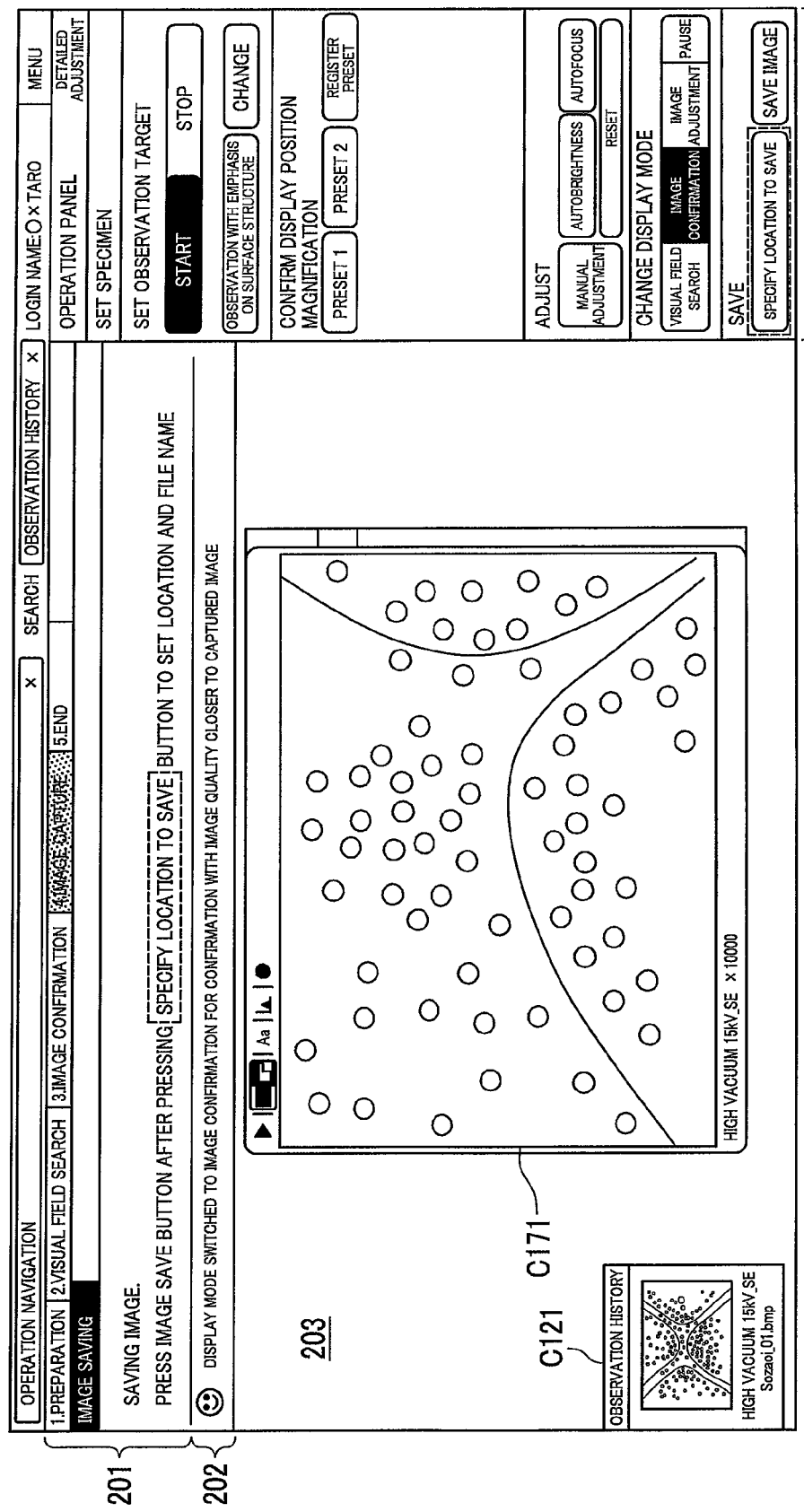
FIG. 23 is a diagram showing an operation screen during image re-saving (capturing) by the user.

FIG. 23 is a diagram showing the operation screen during image re-saving (capturing) (S104) by the user after the autoadjustment is completed.

FIG. 23 is basically the same as FIG. 9 except that the image C171 with increased magnification, the observation history C121 and the "manual adjustment" button D171 (FIG. 21) are displayed in the image display screen 203, and thus description thereof is omitted.

By performing the same processing as that shown in FIGS. 10 to 14, an image obtained under the current observation condition is stored in the storage device 21.

(S105 and S106)

Next, FIGS. 24 to 34 are diagrams showing examples of the operation screen during reconfirmation of whether or not the current image is OK by the user (S105) and during readjustment and re-change of the observation condition by the user (S106).

Figure 24:
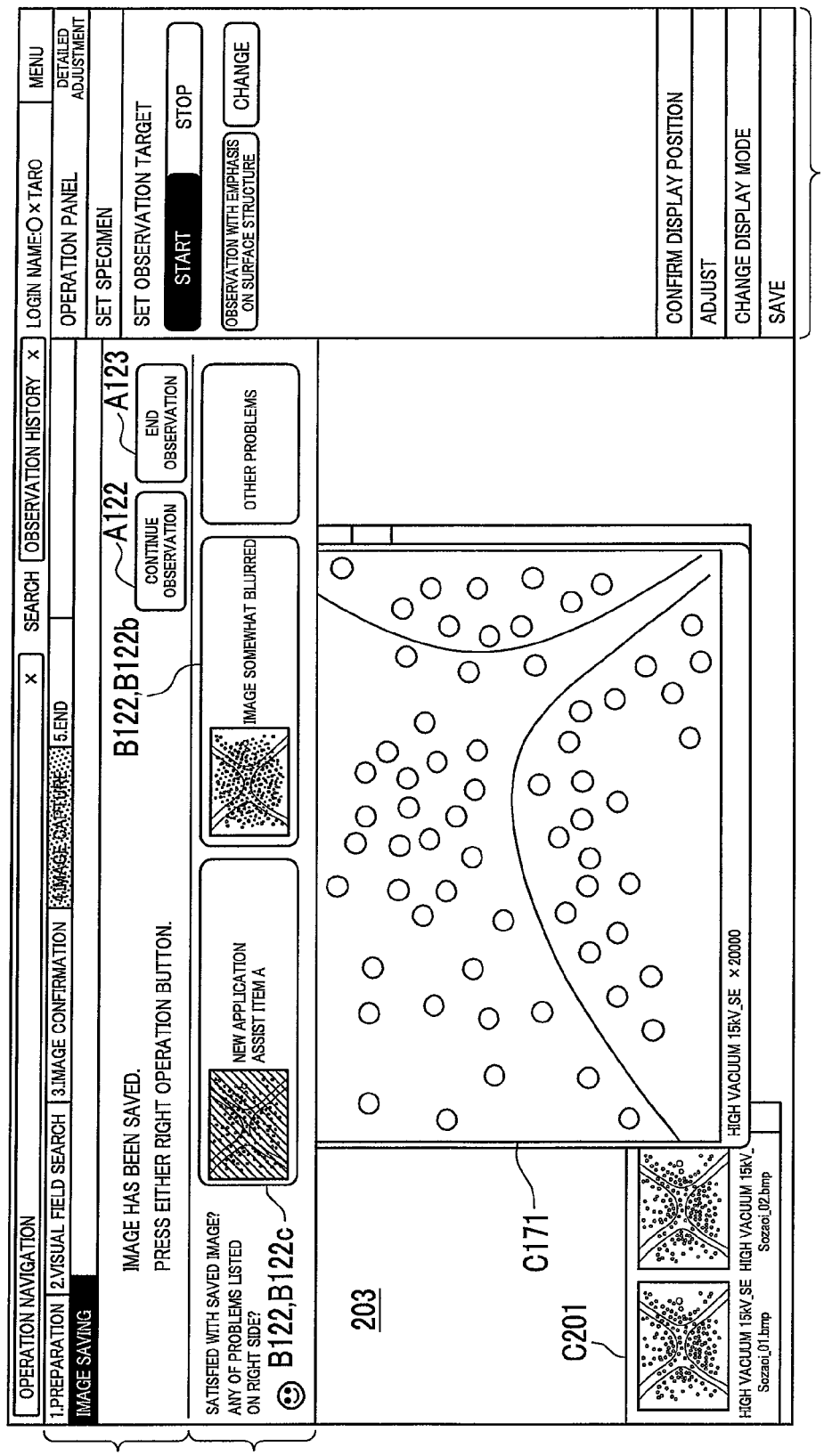
FIG. 24 is a diagram (Part 1) showing an example of the operation screen during image reconfirmation and readjustment and re-changing of observation conditions by the user.

FIG. 24 is a diagram showing contents displayed after the image is saved.

FIG. 24 shows the image C171 with increased magnification in the image display screen 203 and an observation history C201 with new addition of the image saved in FIG. 23. Note that, although the image C171 with increased magnification is displayed in FIG. 23, the image is then saved after restoring the magnification to the original magnification.

Moreover, the assist button B122a in the application assist screen 202 shown in FIG. 15 is not displayed, and a new assist button B122c (B122) is displayed instead.

Since FIG. 24 is basically the same as FIG. 15 except for those described above, description thereof is omitted.

Note that the processing performed by the operation program 31 in displaying the assist buttons B122b and B122c is the same as that described with reference to FIG. 15, and thus description thereof is omitted here.

At this point, when the user is satisfied with the image, the observation is terminated by the user pressing the end button A123 in the operation navigation screen 201.

As the contents displayed by the assist button B122c, the unevenness or three-dimensional appearance of the image is impaired compared with during the visual field search (scan speed: high) or the image is deformed compared with during the visual field search (operation speed: high) as described above.

Note that, although the above problems do not occur in a low-magnification situation, such problems may be caused by increased density of the irradiation beam (primary electron beam 2) or the like in a high-magnification situation.

The reason why the assist button B122a (FIG. 15) is not displayed and the new assist button B122c is displayed instead in the application assist screen 202 is that the operation program 31 is executed to hide the processing item (here, the assist button B122a) once performed by referring to the operation history stored in the storage device 21 as needed.

Moreover, the operation program 31 is executed to display the new assist button B122c by analyzing the current image C171. Note that this processing is the same as that shown in FIG. 15.

Here, the user presses the continue button A122 and further presses the assist button B122b.

Figure 25:
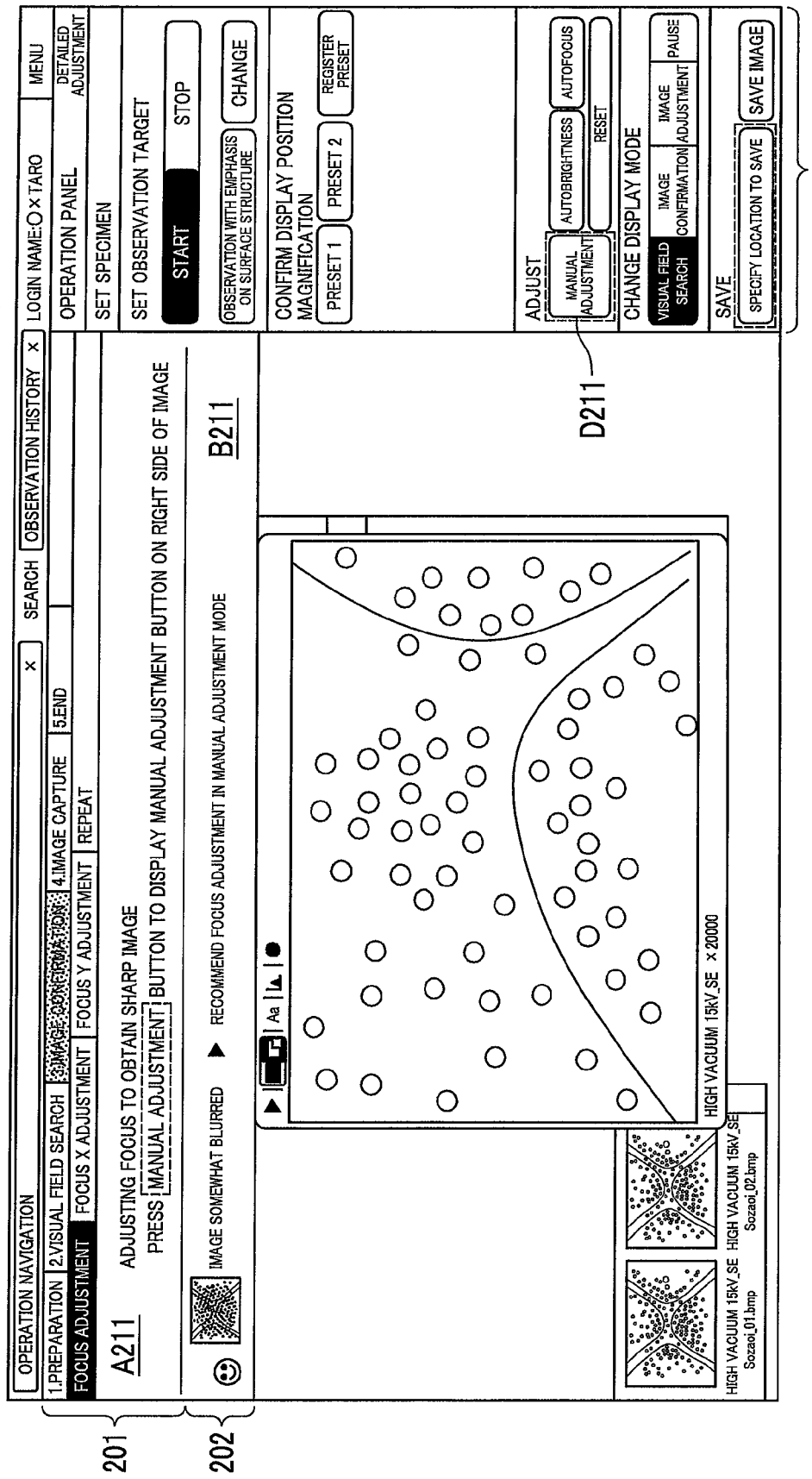
FIG. 25 is a diagram (Part 2) showing an example of the operation screen during image reconfirmation and readjustment and re-changing of observation conditions by the user.

FIG. 25 is a diagram showing contents displayed in target change.

The user determines that the image is somewhat blurred by looking at the image C171 shown in FIG. 24, and presses the assist button B122b. Then, the operation program 31 is executed to display a screen B211 in the application assist screen 202 as shown in FIG. 25, in order to solve the problem described in the assist button B122b. The screen B211 displays a message prompting focus adjustment in a manual adjustment mode. Moreover, a screen A211 in the operation navigation screen 201 also similarly displays a message prompting manual focus adjustment by pressing a "manual adjustment" button D211.

Since the processing performed by the operation program 31 to display such screens A211 and B211 is the same as that described with reference to FIG. 16, description thereof is omitted.

Figure 26:
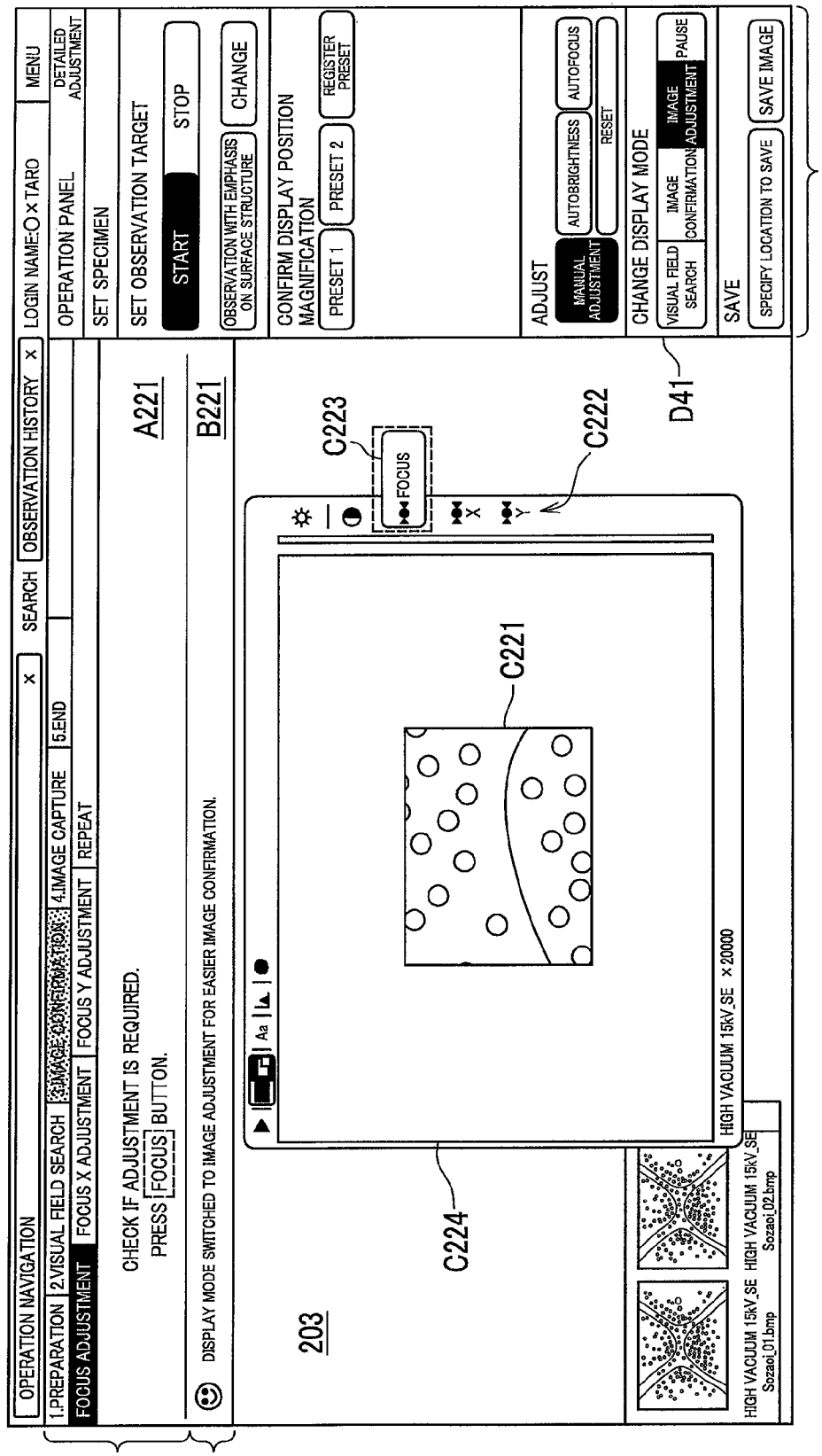
FIG. 26 is a diagram (Part 3) showing an example of the operation screen during image reconfirmation and readjustment and re-changing of observation conditions by the user.

When the user presses the "manual adjustment" button D211 highlighted in the operation panel screen 204, the operation program 31 is executed to display the display-contents shown in FIG. 26 on the image display device 18.

Note that, in FIGS. 25 to 33, sub-items of the main item "image confirmation" on the operation navigation screen 201 are different from those shown in FIG. 8 and the like, and sub-items for manual adjustment are displayed.

Figure 27:
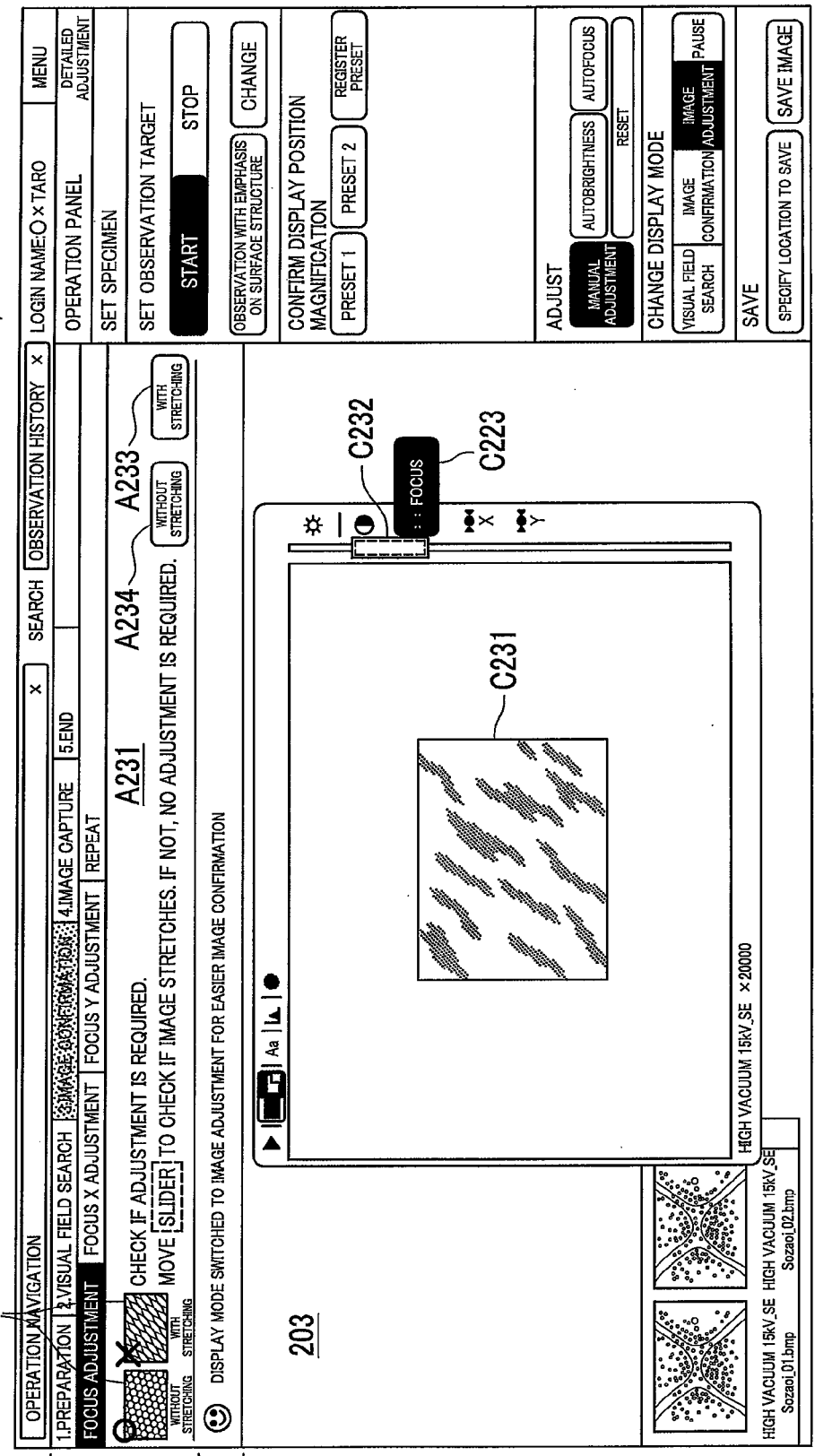
FIG. 27 is a diagram (Part 4) showing an example of the operation screen during image reconfirmation and readjustment and re-changing of observation conditions by the user.
Figure 28:
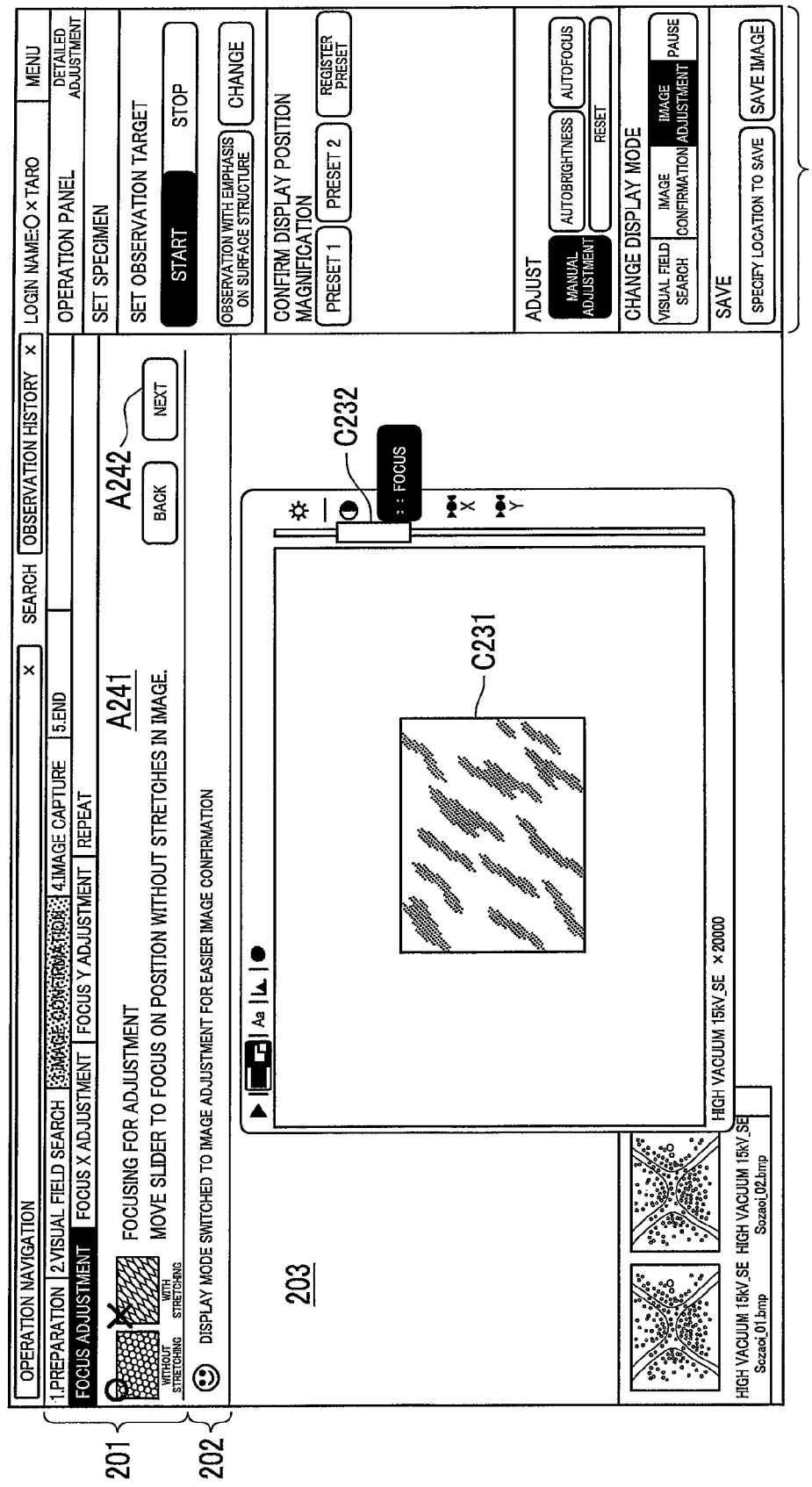
FIG. 28 is a diagram (Part 5) showing an example of the operation screen during image reconfirmation and readjustment and re-changing of observation conditions by the user.

FIGS. 26 to 28 are diagrams showing contents displayed for focus adjustment in the manual adjustment screen.

In FIG. 26, a manual adjustment button group C222 is displayed near an image C221 in the image display screen 203 (next to an image display region C224 in the example shown in FIG. 26). Here, the image C221 corresponds to the center portion of the image C171 shown in FIG. 24 and the like. The reason why only the center portion (a part) of the image C171 is displayed in the image C221 is because of the following reason. In order to ensure the image quality and following capability required for adjustment of the focus and the like, the operation program 31 is executed to reduce the image C171 to an observation portion such as the image C221, thereby reducing time required when scanning is repeated while improving the image quality at a low scan speed (hereinafter, the same goes for FIGS. 27 to 33).

Note that, in FIGS. 26 to 33, images C221 and C231 are reduced and displayed. However, the present invention is not limited thereto, but the images may be displayed to fit the window.

Then, the operation navigation screen 201 displays information indicating that the current operation step is "Focus Adjustment" of "3. Image Confirmation". Moreover, the screen A221 in the operation navigation screen 201 displays a message prompting to press the focus button C223.

Furthermore, the screen B221 in the application assist screen 202 displays a message indicating that the display mode is switched to an "image adjustment" mode. Note that the screen D41 in the operation panel screen 204 also displays that the current display mode is the "image adjustment" mode. Since the processing performed by the operation program 31 to switch the display mode is described with reference to FIG. 7, description thereof is omitted here.

When the user points the mouse cursor to the focus button C223 according to the instructions of the screen A221 or the screen B221, the focus button C223 is highlighted as shown in FIG. 26, and the image C221 (FIG. 26) is changed to the image C231 (FIG. 27).

Then, when the user presses the focus button C223, the focus button C223 is displayed inverted as shown in FIG. 27, and a focus slider C232 for focus adjustment is displayed.

The user determines whether or not stigma adjustment is required by moving the focus slider C232.

Thereafter, as the user moves the focus slider C232, the computer 19 causes the X-direction stigmator control circuit 13 and the Y-direction stigmator control circuit 14 to control the X-direction stigmator 4 and the Y-direction stigmator 5 according to a movement distance of the focus slider C232 inputted through the input device 23.

The image C231 shows a state where the focus of the image C221 (FIG. 26) is shifted by the user moving the focus slider C232.

Here, a screen A231 in the operation navigation screen 201 shown in FIG. 27 displays a measure of focus adjustment. Moreover, in a reference image A232 in the screen A231, an estimated change in image when the focus slider C232 is moved is deformed and displayed.

Then, when the user confirms that the image is enlarged (stretched) only in a predetermined direction by moving the focus slider C232, the user presses a "stretch" button A233 in the screen S231. Note that, if the image is not stretched even when the focus slider S232 is moved, the user presses a "no stretch" button A234 in the screen A231. When the "no stretch" button A234 is pressed, the operation program 31 is executed to display display-contents shown in FIG. 34 on the image display device 18 without performing focus X adjustment and focus Y adjustment shown in FIGS. 28 to 33.

Note that the focus X adjustment in FIG. 27 is stigma adjustment in an X direction, and the focus Y adjustment is stigma adjustment in a Y direction.

Then, the operation program 31 is executed to display display-contents shown in FIG. 28 on the image display device 18.

Note that the screen A231 may be displayed in the application assist screen 202. Also, the reference image A232 may be a still image or a moving image.

The operation screen 200 shown in FIG. 28 is the same as that shown in FIG. 27 except that a screen A241 is displayed in the operation navigation screen 201.

The screen A241 displays a message prompting the user to perform focus adjustment by moving the focus slider C232.

The user points the focus slider C232 to a position where the image C231 is not stretched by moving the focus slider C232, and then presses a "next" button A242 in the operation navigation screen 201.

Then, the operation program 31 is executed to finish the focus adjustment processing and to display display-contents for focus X adjustment on the image display device 18.

Figure 29:
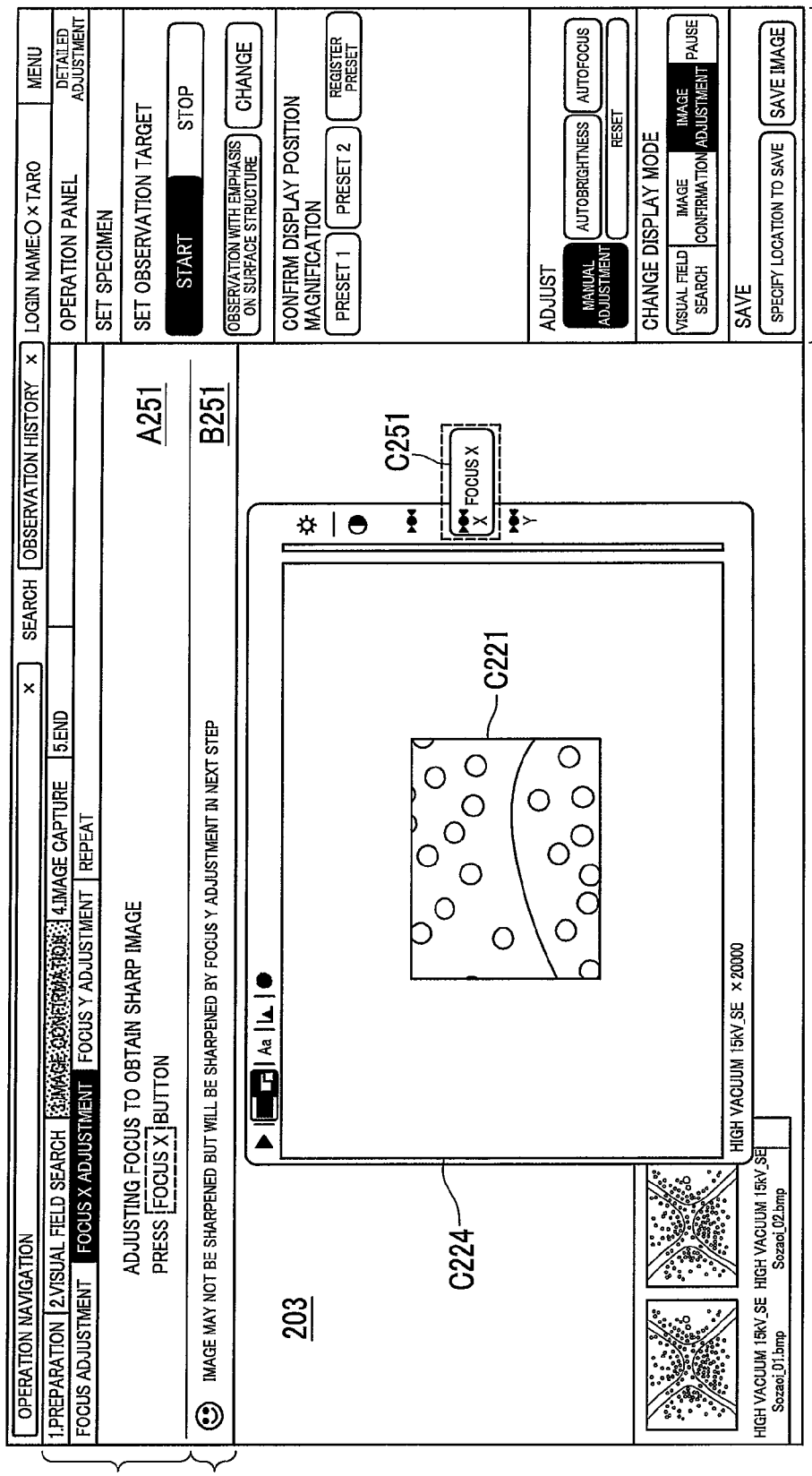
FIG. 29 is a diagram (Part 6) showing an example of the operation screen during image reconfirmation and readjustment and re-changing of observation conditions by the user.
Figure 30:
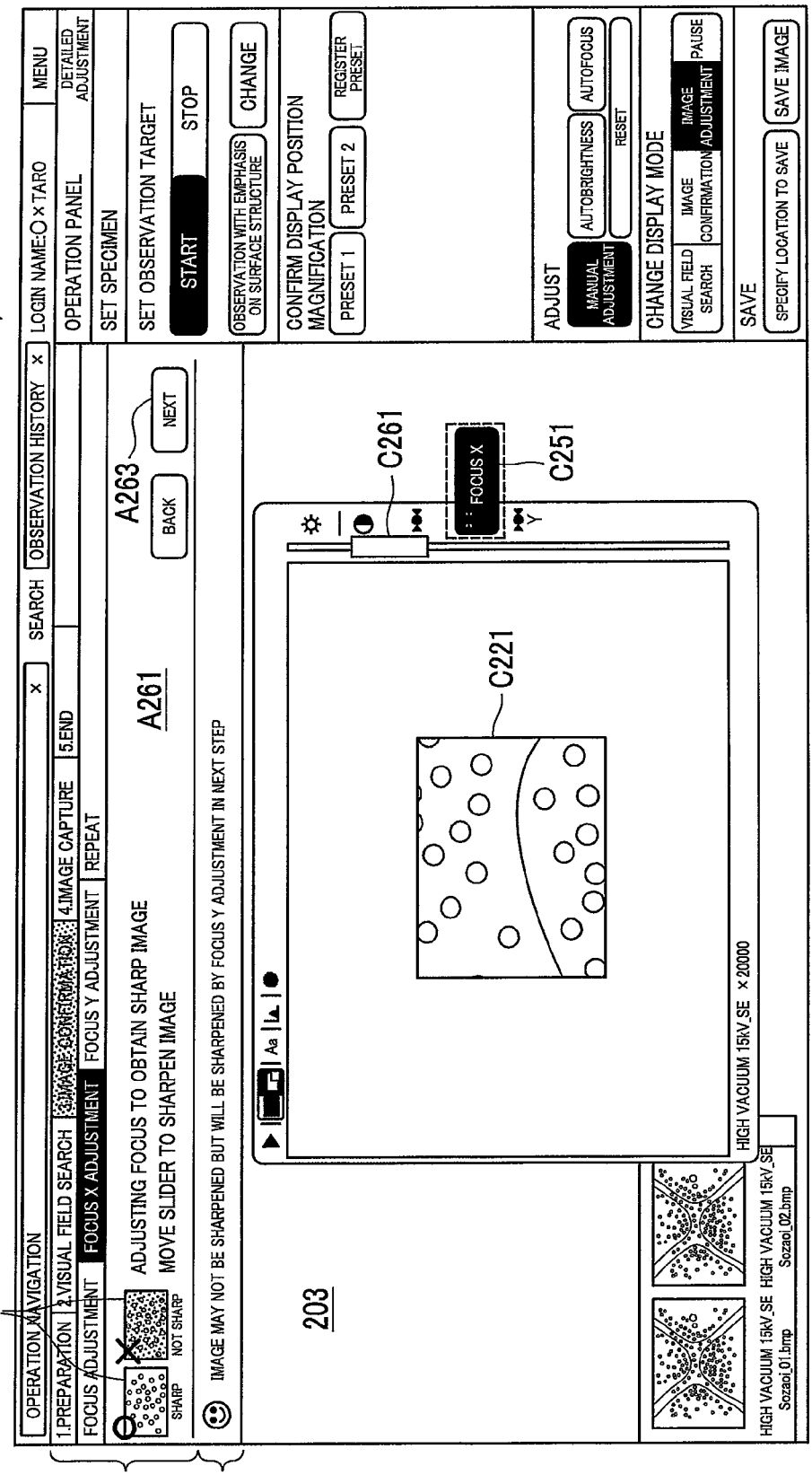
FIG. 30 is a diagram (Part 7) showing an example of the operation screen during image reconfirmation and readjustment and re-changing of observation conditions by the user.

FIGS. 29 and 30 are diagrams showing the display-contents for the focus X adjustment in the manual adjustment screen.

In the focus X adjustment, first, a screen A251 for the operation navigation screen 201 displays a message prompting to press the focus X button C251 as shown in FIG. 29.

Also, a screen B251 in the application assist screen 202 displays a message to the effect that the image may not be sharpened only by focus X adjustment. Such display allows the user to proceed with the operation patiently even if he/she cannot obtain a sharp image after the focus X adjustment.

When the user points the mouse cursor to the focus X button C251 displayed near the image C221 (next to the image display region C224 in the example shown in FIG. 29) according to the message displayed in the screen A251, the focus X button C251 is highlighted as shown in FIG. 29.

Then, when the user presses the highlighted focus X button C251, the focus X button C251 is displayed inverted as shown in FIG. 30, and a focus X slider C261 is displayed.

Moreover, as shown in FIG. 30, a screen A261 in the operation navigation screen 201 displays a message prompting to sharpen the image by moving the focus X slider C261.

Note that the screen A261 displays an image A262 in which an effect of moving the focus X slider C261 is highlighted.

The user moves the focus X slider C261 according to the message displayed in the screen A261. Then, the computer 19 causes the X-direction stigmator control circuit 13 to control the X-direction stigmator 4 according to a movement distance of the focus X slider C261 inputted through the input device 23.

Thereafter, the user presses a "next" button A263 when he/she thinks that the image is roughly sharpened. Then, the operation program 31 is executed to finish the focus X adjustment and moves on to the next focus Y adjustment.

Figure 31:
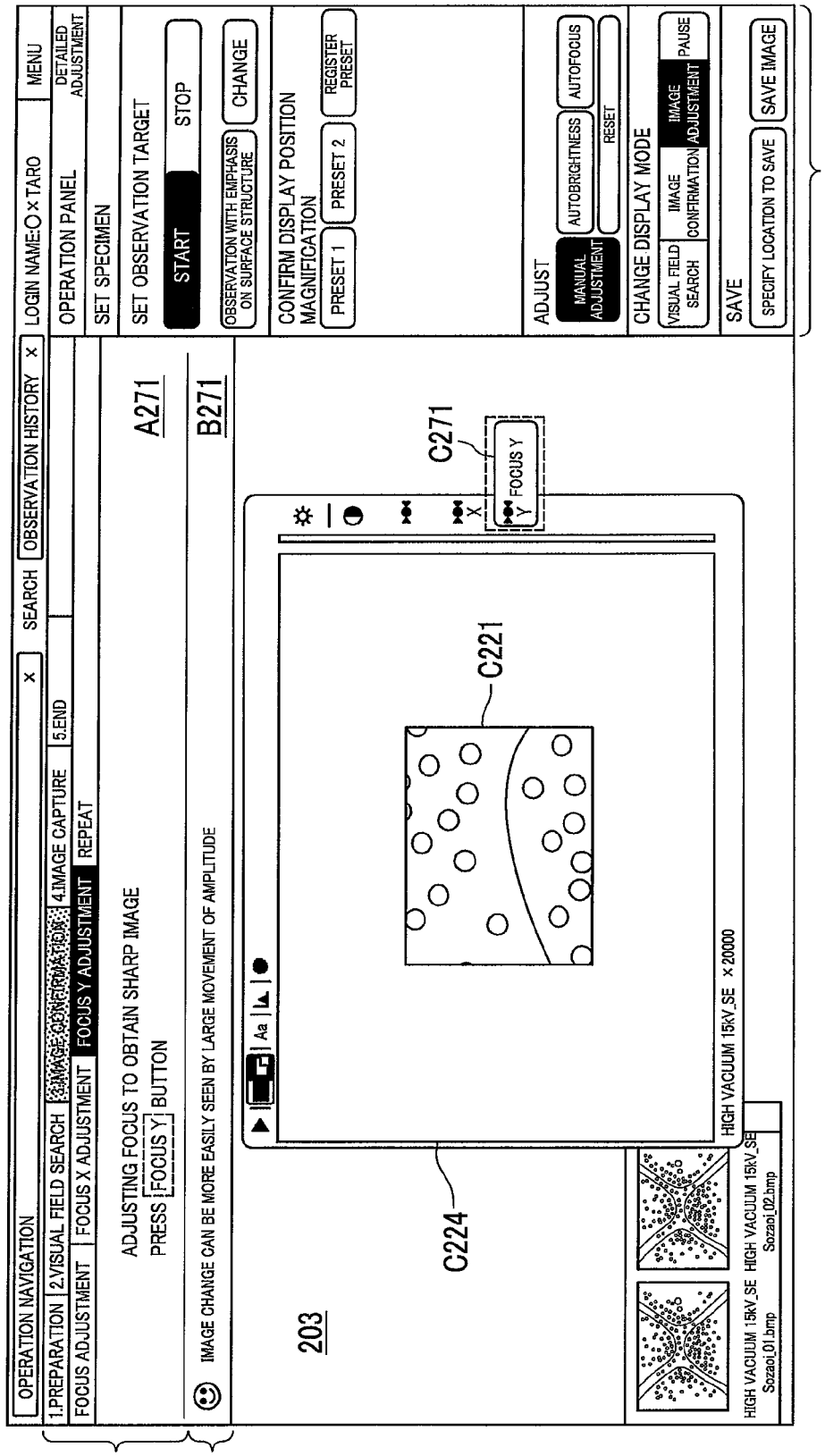
FIG. 31 is a diagram (Part 8) showing an example of the operation screen during image reconfirmation and readjustment and re-changing of observation conditions by the user.
Figure 32:
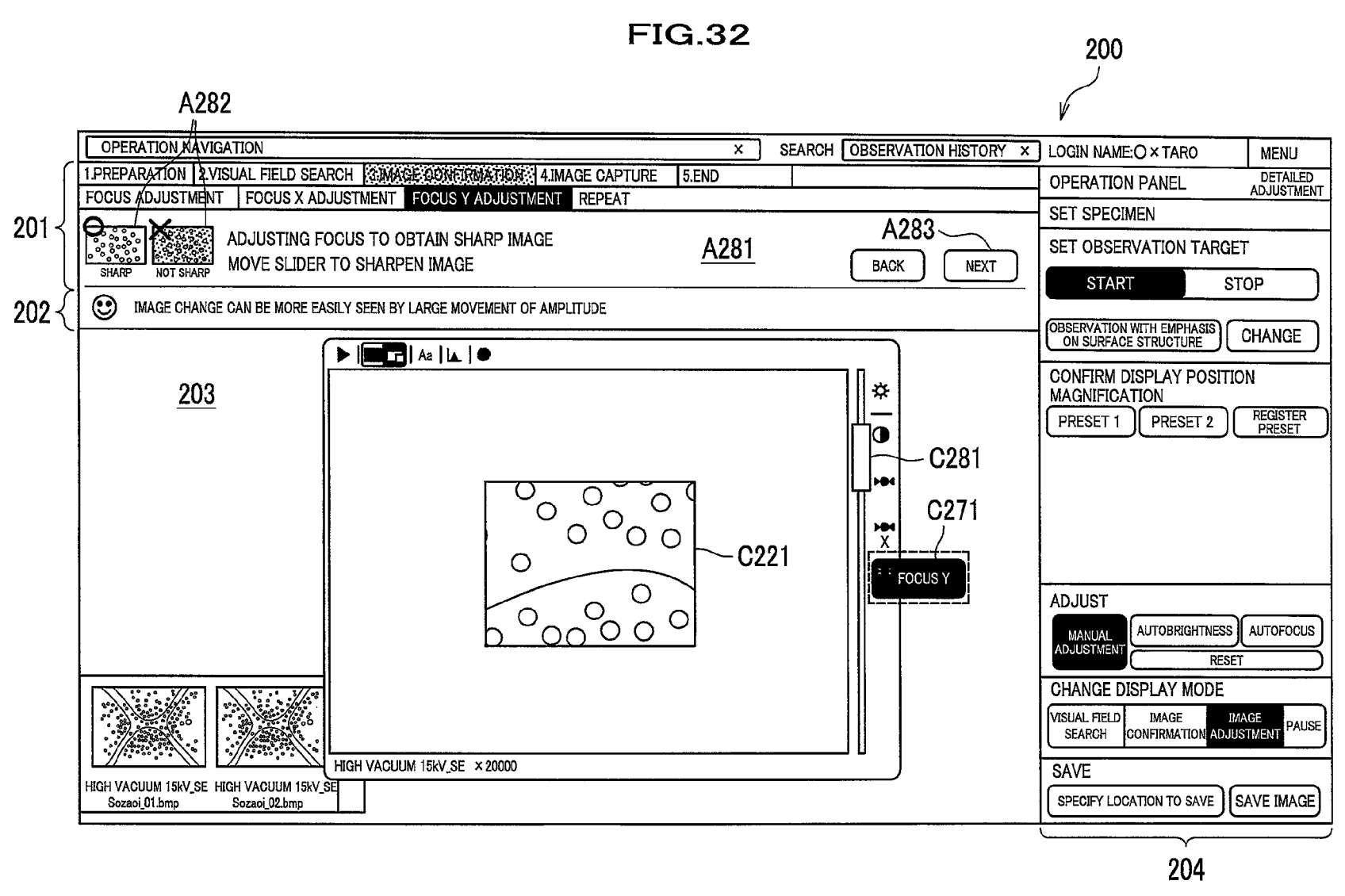

FIGS. 31 and 32 are diagrams showing display-contents for the focus Y adjustment in the manual adjustment screen.

In the focus Y adjustment, a screen A271 in the operation navigation screen 201 displays a message prompting to press a focus Y button C271 as shown in FIG. 31.

Also, a screen B271 in the application assist screen 202 displays a message to the effect that a change in the image can be more easily seen by movement with large amplitude during the focus Y adjustment. Such display can prompt the user to try to move with large amplitude in the focus Y adjustment.

When the user points the mouse cursor to the focus Y button C271 displayed near the image C221 (next to the image display region C224 in the example shown in FIG. 31) according to the message displayed in the screen A271, the focus Y button C271 is highlighted as shown in FIG. 31.

Then, when the user presses the highlighted focus Y button C271, the focus Y button C271 is displayed inverted as shown in FIG. 32, and a focus Y slider C281 is displayed.

Moreover, as shown in FIG. 32, a screen A281 in the operation navigation screen 201 displays a message prompting to sharpen the image by moving the focus Y slider C281.

Note that the screen A281 displays an image A282 in which an effect of moving the focus Y slider C281 is highlighted.

The user moves the focus Y slider C281 according to the message displayed in the screen A281. Then, the computer 19 causes the Y-direction stigmator control circuit 14 to control the Y-direction stigmator 5 according to a movement distance of the focus Y slider C281 inputted through the input device 23.

Thereafter, the user presses a "next" button A283 when he/she thinks that the image is roughly sharpened. Then, the operation program 31 is executed to finish the focus Y adjustment and display display-contents for the next slider adjustment screen on the image display device 18.

As described above, the user can perform the focus adjustment using the focus slider C232 (FIG. 27), the focus X slider C261 (FIG. 30), the focus Y slider C281 (FIG. 32) and the like displayed near the images C221 (FIG. 26 and the like) and C231 (FIG. 27 and the like). In this way, the user can easily make adjustments while looking at the images C221 and C231. Moreover, when the plurality of images C221 and C231 are displayed, the focus slider C232, the focus X slider C261, the focus Y slider C281 and the like may be displayed for each of the images C221 and C231. In this way, the user can easily make adjustments for each of the images C221 and C231.

Figure 33:
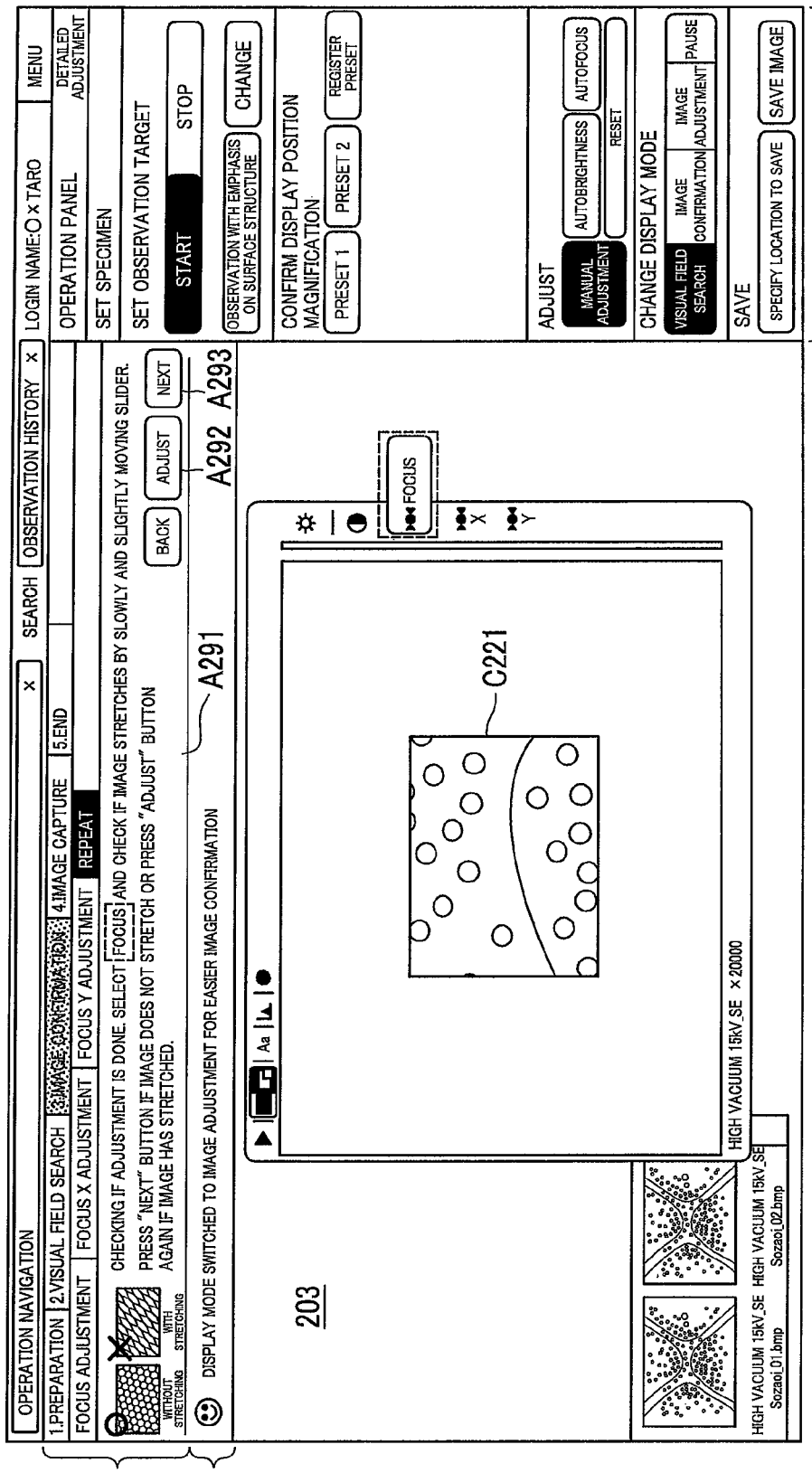
FIG. 33 is a diagram (Part 10) showing an example of the operation screen during image reconfirmation and readjustment and re-changing of observation conditions by the user.

FIG. 33 is a diagram showing display-contents for focus confirmation in the manual adjustment screen.

FIG. 33 has the same configuration as that shown in FIG. 26 except for a screen A291 in the operation navigation screen 201 (however, the display mode is set to "visual field search mode").

The screen A291 in the operation navigation screen 201 displays a message prompting to confirm whether or not the focus adjustment is made (also whether or not focus adjustment is required) in the same manner as FIG. 27.

The user performs the focus adjustment in the same manner as FIGS. 26 to 28, and confirms whether or not focus readjustment is required.

As a result, when it is determined by the user that the focus readjustment is required, the user presses an "adjust" button A292 to perform the focus adjustment by executing the processing shown in FIGS. 29 to 32 again.

Figure 34:
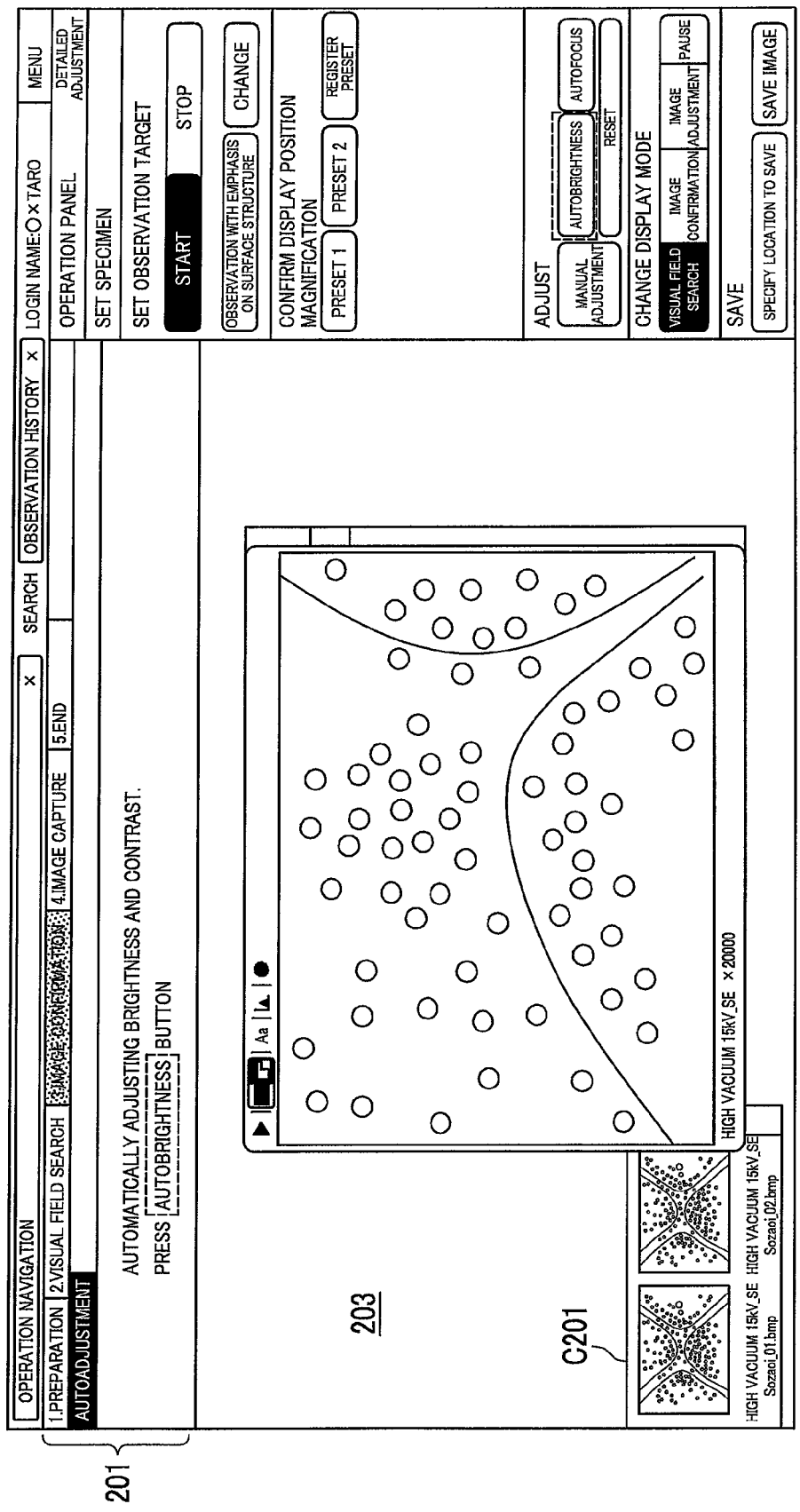
FIG. 34 is a diagram (Part 11) showing an example of the operation screen during image reconfirmation and readjustment and re-changing of observation conditions by the user.

On the other hand, when it is determined by the user that the focus readjustment is not required, the user presses a "next" button A293, and the operation program 31 is executed to finish the manual adjustment processing and displays display-contents for autoadjustment shown in FIG. 34 on the image display device 18. To be more specific, the operation program 31 is executed to display a brightness autoadjustment screen shown in FIG. 34 on the image display device 18.

Note that the operation screens 200 corresponding to the manual adjustment steps are preset in the storage device 21, and the operation program 31 is executed to display the operation screen 200 corresponding to the current step on the image display device 18. Thus, the operation screens 200 shown in FIGS. 26 to 33 are displayed.

FIG. 34 is a diagram showing display-contents in autoadjustment.

FIG. 34 shows the operation screen 200 for the user to automatically adjust the brightness of the image. Since the operation screen is the same as that shown in FIG. 22 except for an observation history C201 having two images registered therein, description thereof is omitted.

Here, the user performs autoadjustment on the image subjected to the focus adjustment by manual adjustment in FIGS. 26 to 33.

Note that the same operation screens 200 as those shown in FIGS. 20 and 21 may be displayed before the operation screen 200 shown in FIG. 34, and the user may perform the visual field search and magnification adjustment.
(S104)

Figure 35:
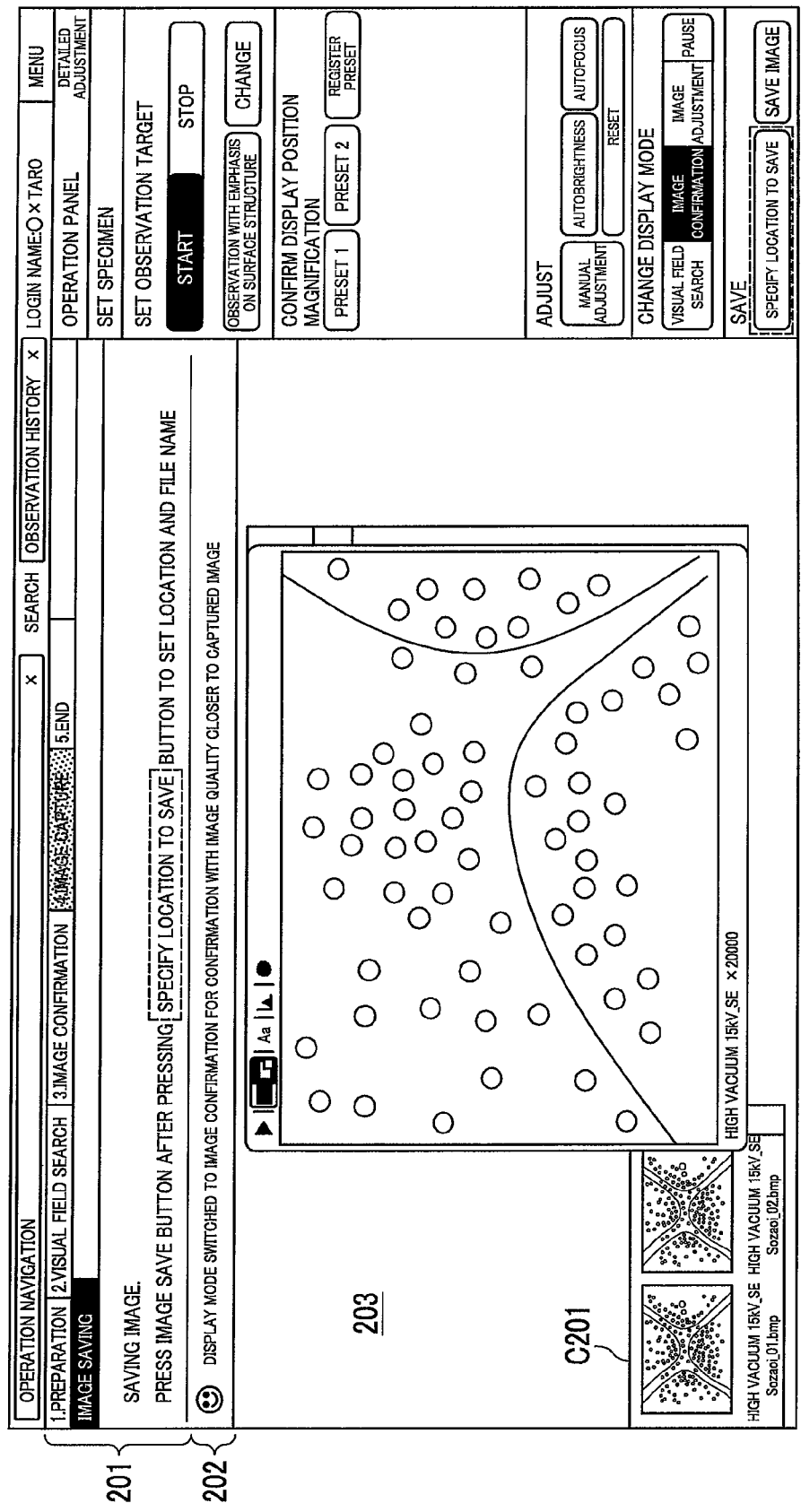
FIG. 35 is a diagram showing an operation screen during image re-saving (capturing) by the user.

FIG. 35 is a diagram showing the operation screen during image re-saving (capturing) (S104) by the user after the auto adjustment is completed.

FIG. 35 is the same as FIG. 23 except that the observation history C201 having two images registered therein is displayed, and thus description thereof is omitted.

By performing the same processing as that shown in FIGS. 10 to 14, an image subjected to the focus adjustment by autoadjustment is stored in the storage device 21.
(S105 and S106)

Figure 36:
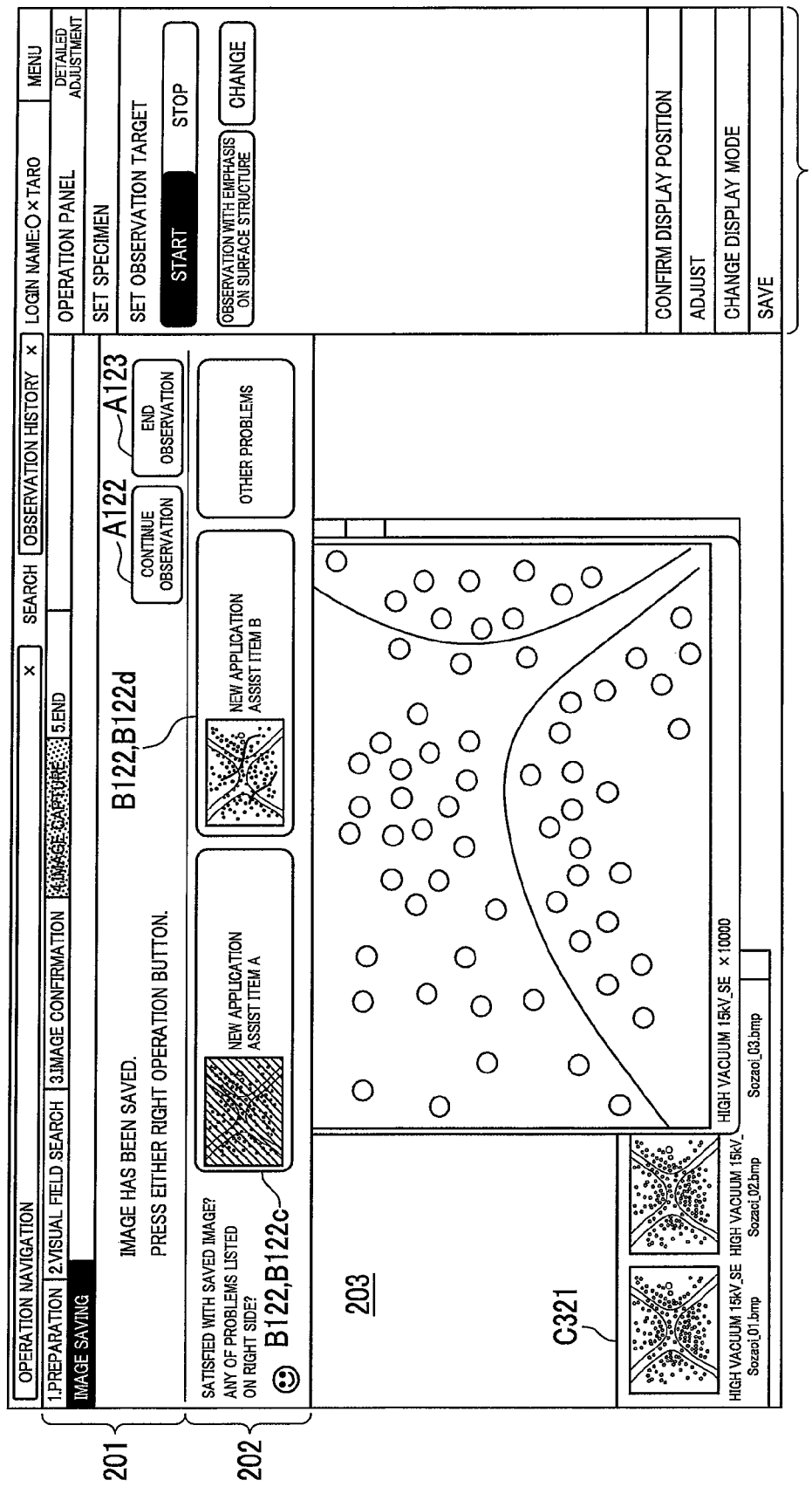
FIG. 36 is a diagram (Part 12) showing an example of the operation screen during image reconfirmation and readjustment and re-changing of observation conditions by the user.

FIG. 36 is a diagram showing an example of the operation screen during reconfirmation of whether or not the current image is OK by the user (S105) and during readjustment and re-change of the observation condition by the user (S106).

FIG. 36 shows an observation history C321 with new addition of the image saved in FIG. 35. Note that, although the image with increased magnification is displayed in FIG. 35, the image is then saved after restoring the magnification to the original magnification.

Moreover, by the operation program 31 executed to refer to the processing history, the assist button B122b in the application assist screen 202 shown in FIG. 24 is not displayed, and a new assist button B122d (B122) is displayed instead.

Since FIG. 36 is the same as FIG. 24 except for those described above, description thereof is omitted.

Moreover, since the processing performed by the operation program 31 to display the assist buttons B122c and B122d is the same as that described with reference to FIG. 15, description thereof is omitted here.

As the contents displayed by the assist buttons B122c and B122d, the unevenness or three-dimensional appearance of the image is impaired compared with during the visual field search (scan speed: high) or the image is deformed compared with during the visual field search (operation speed: high) as described above.

Moreover, although the above problems do not occur in a low-magnification situation, such problems may be caused by increased density of the irradiation beam (primary electron beam 2) or the like in a high-magnification situation.

At this point, when the user is satisfied with the image, the observation is terminated by the user pressing the end button A123 in the operation navigation screen 201.

On the other hand, when the user is not satisfied with the image, the continue button A122 in the operation navigation screen 201 is pressed.

By repeating the processing described above until the end button A123 is pressed, the user can obtain a good-quality image while learning the procedure.
(S106)

Figure 37:
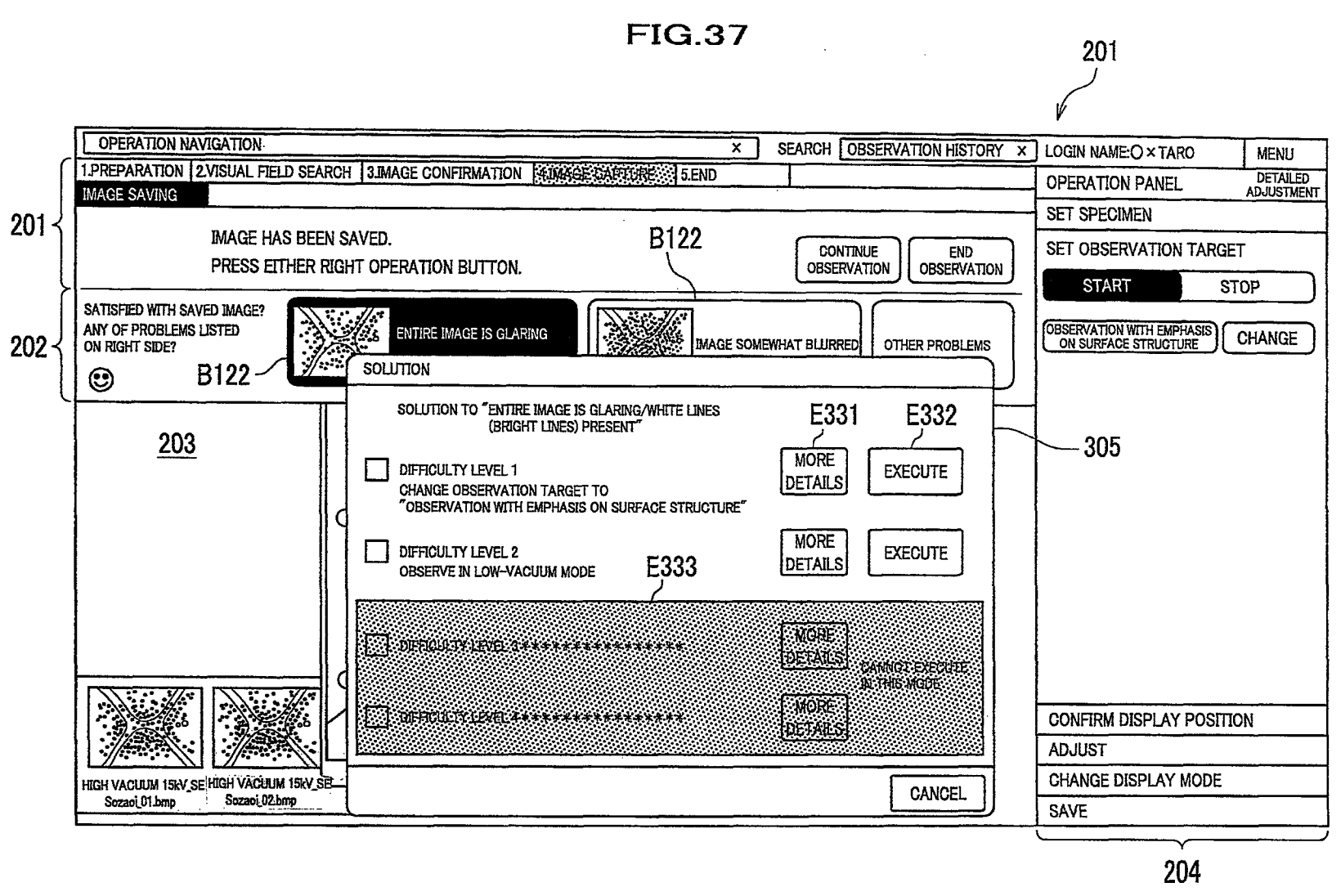

FIG. 37 shows a modified example of the application assist screen according to this embodiment. FIG. 37 shows a screen in "adjustment and change" in Step S106.

In FIG. 37, a solution screen 305 is displayed in front of the operation screen 200 shown in FIG. 15. When the user presses the assist button B122, the operation program 31 is executed to display the solution screen 305 corresponding to the pressed assist button B122. Specifically, the solution screen 305 corresponding to each assist button B122 is stored in the storage device 21. When the assist button B122 is pressed, the operation program 31 is executed to acquire the solution screen 305 corresponding to the pressed assist button B122 from the storage device 21. Then, the operation program 31 is executed to display the acquired solution screen 305 on the image display device 18.

In the solution screen 305, solutions to the problems described in the assist button B122 are displayed in list form according to the difficulty of operations. Here, the solution is, more specifically, to change the observation target to an appropriate observation target. Such a list can be realized by storing the difficulty of each solution in the storage device 21.

When a detail button E331 in the solution screen 305 is pressed, the principles of the corresponding solution and the like are displayed. Then, when an execution button E332 is pressed, an operation screen 200 to change the observation target to an appropriate observation target is displayed.

A solution in an inexecutable region E333 indicates that the user cannot execute the solution. This notifies the user that the user cannot execute such solutions since he/she is a novice user. Note that, as described above, the operation screen 200 according to this embodiment is based on the assumption that the user is a novice user. In this way, the user can realize that there are solutions that he/she cannot execute unless he/she is an advanced user.

Moreover, by displaying the observation targets in list form as in the solution screen 305, the user can easily confirm the operations he/she has performed thus far as well as operations yet to be performed.

Note that, when the image displayed in the image display screen 203 is displayed at high magnification (e.g., 20000 times or more), the manual adjustment button group C222 (or at least one of those in the group) shown in FIG. 26 may be hidden.

Furthermore, the manual adjustment button group C222 may be displayed only when the current magnification is a predetermined magnification or more. As described above, by displaying/hiding the operation items (buttons) or setting specific operation items based on predetermined conditions, unnecessary operations can be prevented to reduce errors.

It takes time or almost impossible to take an appropriate image while selecting innumerable parameter setting combinations through trial and error. Since it is very difficult and takes time especially for a novice user to perform such an operation, the user ends up giving up on taking a good image. Furthermore, the user loses sight of how to obtain an appropriate image. Such a vicious cycle is created when a novice user operates the electron microscope 101.

According to this embodiment, an image is first acquired under a default observation condition, and then the direction for adjustment on the acquired image can be laid out. Thus, the user can efficiently obtain a target image even if he/she is a novice user, and a learning effect on the user can be expected.

Moreover, in the observation condition characteristic indicator (radar chart), the characteristics of the observation conditions are visually represented by contrasting axes such as "suitable for high magnification", "emphasis on surface structure" and "emphasis on material difference". With the use of such a radar chart, even a novice user can select an optimum observation target.

Furthermore, a result obtained by changing the observation target to an appropriate target is displayed as a schematic highlighted image such as the highlighted image E142 shown in FIG. 17. Thus, even a novice user can easily grasp an image of what kind of result can be obtained by changing the observation target.

According to this embodiment, the operation program 31 is executed to first acquire an image under a default observation condition. Then, on the application assist screen 202, the operation program 31 is executed to display advice on the acquired image to the user. Thereafter, the operation program 31 is executed to change the observation condition and saves an image on which the change in observation condition is reflected. Subsequently, the operation program 31 is executed to display advice again to the user on the application assist screen 202 regarding the image obtained as a result of reflecting the change in observation condition, and then saves an image on which the change in observation condition is reflected. By repeating these operations, the novice user can set the observation condition for acquiring a target image and can obtain characteristics of the image captured under the set observation condition. Thus, skills of the user can be improved.

Note that this embodiment is based on the assumption of the use of a scanning electron microscope (particularly a general-purpose operation electron microscope). However, the present invention is not limited thereto but may be applied to a charged particle beam apparatus such as a transmission electron microscope and an ion microscope.

Moreover, although a first image is acquired under a default observation condition in this embodiment, the operation program 31 may be executed to acquire a first image with a configuration set by the user and thus the user may adjust the observation condition according to a message on the application assist screen 202 or the like. In this way, the user can compare the observation condition that he/she has in mind with the observation condition to obtain a desired image.

Note that the operation navigation screen 201 can be hidden depending on the skills of the user. In such a case, all the buttons to be used are displayed on the operation panel screen 204.

Alternatively, a term dictionary may be stored in the storage device 21 and, when the user clicks on a specific mark, a dictionary mark or a phrase displayed in the operation screen 200, the operation program 31 may be executed to display a description of the phrase on the image display device 18 by referring to the term dictionary.

Moreover, although the schematic highlighted image E142 is displayed on the observation target setting button E141 shown in FIG. 17 in this embodiment, the image B123 on the assist button B122 shown in FIG. 15, for example, may be used as a similar schematic highlighted image.

Furthermore, although this embodiment employs the configuration assuming that the operations are performed by a novice user from the start, a screen to select among a novice user, an intermediate user and an advanced user may be displayed on the image display device 18 after the activation in Step S101 shown in FIG. 2, for example. When the novice user is selected, the computer 19 may execute the processing according to this embodiment.

Note that the present invention is not limited to the embodiment described above, but includes various modified examples. For example, the above embodiment has been described in detail to facilitate the understanding of the present invention, and is not necessarily limited to one having all the configurations described above. Moreover, some of the configurations in the embodiment may be deleted or may be added with or replaced by other configurations.

Furthermore, some of or all of the configurations, functions, circuits 11 to 17, image display device 18, storage device 21, operation program 31 and the like described above may be realized by hardware by designing with integrated circuits or the like, for example. Also, as shown in FIG. 1, the configurations, functions and the like described above may be realized by software in such a manner that a processor such as a CPU interprets and executes programs to realize all the functions. In such a case, information such as programs, tables and files to realize the functions may be stored in a memory, a recording device such as an SSD (Solid State Drive) or a recording medium such as an IC (Integrated Circuit) card, an SD (Secure Digital) card and a DVD (Digital Versatile Disc), instead of being stored in the storage device 21 as shown in FIG. 1.

Moreover, in the above embodiment, the description is given of control lines and information lines that are considered to be necessary for the illustrative purpose. Therefore, not all controls lines or information lines required as a product are described. In fact, it is safe to assume that almost all of the configurations are interconnected.

EXPLANATION OF REFERENCE NUMERALS 1 electron gun
2 primary electron beam
3 condenser lens
4 X-direction stigmator
5 Y-direction stigmator
6 upper deflector
7 lower deflector
8 objective lens
9 specimen
10 detector
11 high-voltage control circuit
12 condenser lens control circuit
13 X-direction stigmator control circuit
14 Y-direction stigmator control circuit
15 deflector control circuit
16 objective lens control circuit
17 detection signal control circuit
18 image display device
19 computer (processing unit)
21 storage device (storage unit)
22 memory
23 input device
31 operation program
41 observation condition setting table
100 electron microscope column (charged particle beam apparatus)
101 electron microscope (charged particle beam apparatus, charged particle beam apparatus system)
200 operation screen
201 operation navigation screen
202 application assist screen
203 image display screen (image display unit)
204 operation panel screen
304 observation target setting screen
B122, B122a to B122d assist button
B123 highlighted image
E141, E141a observation target setting button
E143, E143a to E143d highlighted image
E144 radar chart (observation condition characteristic indicator)

The invention claimed is:

1. A charged particle beam apparatus comprising:
a processor configured to have an image display screen, in an image display device, display a set of observation target setting buttons for changing an observation condition for a specimen, the observation condition comprising a combination of parameter setting values of the charged particle beam apparatus,
wherein the processor controls the image display screen to display an observation condition characteristic indicator including a characteristic, indicated by three or more incompatible items, of an observation condition for each of the observation target setting buttons,
wherein the processor responds to a selection of an observation target setting button by comparing a selected image to be observed corresponding to the selected observation target setting button with a standard image to be observed under a default observation condition so as to display a highlighted image corresponding to the selected image with emphasis on the difference between the selected image and the standard image, and
wherein, the specimen is irradiated with a charged particle beam in accordance with the selected observation target setting button.

2. A charged particle beam apparatus comprising:
a processor configured to have an image display screen, in an image display device, display a set of observation target setting buttons for changing an observation condition for a specimen, the observation condition comprising a combination of parameter setting values of the charged particle beam apparatus,
wherein the processor controls the image display screen to display an observation condition characteristic indicator including at least items of high resolution, emphasis on surface structure and emphasis on material difference which are indicated as a characteristic of an observation condition for each of the observation target setting buttons,
wherein the processor responds to a selection of an observation target setting button by comparing a selected image to be observed corresponding to the selected observation target setting button with a standard image to be observed under a default observation condition so as to display a highlighted image corresponding to the selected image with emphasis on the difference between the selected image and the standard image, and
wherein, the specimen is irradiated with a charged particle beam accordance with the selected observation target setting button.

3. The charged particle beam apparatus according to claim 1,
wherein the items in the observation condition characteristic indicator include high resolution, emphasis on surface structure and emphasis on material difference.

4. The charged particle beam apparatus according to claim 1,
wherein the items in the observation condition characteristic indicator include items of charge-up suppression and/or beam damage suppression.

5. The charged particle beam apparatus according to claim 1, wherein the set of observation target setting buttons comprises:
a first button configured to change an observation condition to an observation condition for observing with the highest resolution;

a second button configured to change an observation condition to an observation condition having the most emphasis placed on a surface structure; and a third button configured to change an observation condition to an observation condition having the most emphasis placed on a material difference.

6. The charged particle beam apparatus according to claim 5, wherein the set of observation target setting buttons further comprises:

a fourth button configured to change an observation condition to an observation condition having emphasis placed on the surface structure and the material difference; and a fifth button configured for changing an observation condition to an observation condition that is most suitable for elemental analysis.

7. The charged particle beam apparatus according to claim 1, wherein the observation condition characteristic indicator comprises a radar chart.

8. The charged particle beam apparatus according to claim 1, wherein the processor controls the image display screen to display a highlighted image with emphasis on a characteristic of an image obtained under the observation condition for each of the observation target setting buttons.

9. The charged particle beam apparatus according to claim 8, wherein the highlighted image serves as an image which schematically represents three or more materials different in shape and/or material quality.

10. The charged particle beam apparatus according to claim 1, wherein after acquiring an image of a new specimen under a standard observation condition, the processor changes the observation condition according to each of the observation target setting buttons.

11. The charged particle beam apparatus according to claim 10, wherein the standard observation condition serves as an observation condition for observing with the highest resolution.

12. A specimen observation system comprising:

a charged particle beam apparatus; and a computer configured to control the charged particle beam apparatus, wherein the computer comprises a processor configured to control an image display screen, in an image display device, to display a set of observation target setting buttons for changing an observation condition for a specimen, the observation condition comprising a combination of parameter setting values of the charged particle beam apparatus, wherein the processor controls the image display screen to display a highlighted image on or near each of observation target setting buttons, the highlighted image including emphasis on an image change due to a change of the observation condition, wherein the processor responds to a selection of an observation target setting button by comparing a selected image to be observed corresponding to the selected observation target setting button with a standard image to be observed under a default observation condition so as to display a highlighted image corresponding to the selected image with emphasis on the difference between the selected image and the standard image, and wherein the specimen is irradiated with a charged particle beam in accordance with the selected observation target setting button.

13. A method for controlling a charged particle beam apparatus by a controller, wherein when the controller implements a control for displaying, on an image display screen, in an image display device, a set of observation target setting buttons for changing an observation condition comprising a combination of parameter setting values of the charged particle beam apparatus, wherein the controller implements a control for displaying a highlighted image on or near each of observation target setting buttons, the highlighted image including emphasis on an image change due to a change of the observation condition, wherein the processor responds to a selection of an observation target setting button by comparing a selected image to be observed corresponding to the selected observation target setting button with a standard image to be observed under a default observation condition so as to display a highlighted image corresponding to the selected image with emphasis on the difference between the selected image and the standard image, and wherein the specimen is irradiated with a charged particle beam in accordance with the selected observation target setting button.

14. A charged particle beam apparatus comprising:

a processor configured to control an image display screen, in an image display device, to display a set of observation target setting buttons for changing an observation condition for a specimen, the observation condition comprising a combination of parameter setting values of the charged particle beam apparatus, wherein the processor controls the image display screen to display a highlighted image on or near each of observation target setting buttons, the highlighted image including emphasis on an image change due to a change of the observation condition, wherein the processor responds to a selection of an observation target setting button by comparing a selected image to be observed corresponding to the selected observation target setting button with a standard image to be observed under a default observation condition so as to display a highlighted image corresponding to the selected image with emphasis on the difference between the selected image and the standard image, wherein, the specimen is irradiated with a charged particle beam in accordance with the selected observation target setting button.

15. The charged particle beam apparatus according to claim 14, wherein respective one of the observation target setting buttons and corresponding one of observation conditions are associated with each other and stored in a storage device, and wherein when one of the observation target setting buttons is selected with an input device, the processor sets parameter setting values of the charged particle beam apparatus under an observation condition for the selected one of the observation target setting buttons.

16. The charged particle beam apparatus according to claim 14,
- wherein the processor acquires an image of the specimen under a preset observation condition, and has the observation target setting buttons displayed on the image display screen based on image quality of the acquired image and a current observation condition, and
- when the observation condition is changed with an input device, the processor repeats processing of reacquiring an image under a changed observation condition and displaying the observation target setting buttons on the image display screen based on image quality of the reacquired image and the current observation condition until an instruction to terminate the processing is inputted with the input device.

17. The charged particle beam apparatus according to claim 14,
- wherein the processor controls the image display screen to display information about confirmation of presence or absence of coating on the specimen or about pretreatment of the specimen, prior to acquisition of a first image of the specimen.

18. The charged particle beam apparatus according to claim 14,
- wherein during processing standby time, the processor controls the image display screen to display a learning screen representing at least one of a structure of an electron microscope, an operation procedure of the electron microscope and explanation of an operation item on an operation screen.

19. The charged particle beam apparatus according to claim 14,
- wherein the processor controls the image display screen to display an operation screen displaying operation items of the charged particle beam apparatus, and the processor has a predetermined operation item displayed on the operation screen hidden or deactivated.

20. The charged particle beam apparatus according to claim 19,
- wherein the predetermined operation item comprises at least one of focus adjustment, X focus adjustment and Y focus adjustment.

21. The charged particle beam apparatus according to claim 14,
- wherein the processor limits functions of the charged particle beam apparatus according to the observation condition.

22. The charged particle beam apparatus according to claim 21,
- wherein the processor controls to make an image shift operable and a stage movement inoperable when a magnification is a predetermined value or more, and the processor controls to make the stage movement operable and the image shift inoperable when the magnification is less than the predetermined value, thereby limiting the functions of the charged particle beam apparatus according to the observation condition.

23. The charged particle beam apparatus according to claim 14,
- wherein the processor has a predetermined observation target setting button hidden based on an operation history.

24. The charged particle beam apparatus according to claim 14,
- wherein the processor controls the image display screen to display an operation screen representing an operation item of the charged particle beam apparatus,
- wherein the processor controls the image display screen to display information indicating a current operation step on the operation screen, and
- wherein the information indicating the current operation step includes a main item indicating a main operation step and a sub-item indicating a sub-operation step.

25. The charged particle beam apparatus according to claim 14,
- wherein the processor controls the image display screen to display an operation screen representing an operation item of the charged particle beam apparatus,
- wherein the processor controls the image display screen to display the acquired image on the operation screen, and
- wherein the processor controls the image display screen to display at least one of a magnification adjustment slider, a focus adjustment slider, a focus X adjustment slider and a focus Y adjustment slider near the image displayed on the image display screen.

* * * * *